(12) United States Patent
de Rochemont

(10) Patent No.: US 10,504,843 B2
(45) Date of Patent: Dec. 10, 2019

(54) HIGH SPEED SEMICONDUCTOR CHIP STACK

(71) Applicant: L. Pierre de Rochemont, Raleigh, NC (US)

(72) Inventor: L. Pierre de Rochemont, Raleigh, NC (US)

( * ) Notice: Subject to any disclaimer, the term of this patent is extended or adjusted under 35 U.S.C. 154(b) by 0 days.

(21) Appl. No.: 15/969,234

(22) Filed: May 2, 2018

(65) Prior Publication Data
US 2018/0358295 A1 Dec. 13, 2018

Related U.S. Application Data

(60) Provisional application No. 62/582,182, filed on Nov. 6, 2017, provisional application No. 62/500,177, filed on May 2, 2017.

(51) Int. Cl.
| | |
|---|---|
| *H01L 23/66* | (2006.01) |
| *H01L 23/532* | (2006.01) |
| *H01L 23/64* | (2006.01) |
| *H01L 25/065* | (2006.01) |
| *H01G 4/12* | (2006.01) |
| *H01G 4/30* | (2006.01) |

(52) U.S. Cl.
CPC ....... *H01L 23/5329* (2013.01); *H01G 4/1209* (2013.01); *H01G 4/1272* (2013.01); *H01L 23/642* (2013.01); *H01L 23/66* (2013.01); *H01L 25/0657* (2013.01); *H01G 4/30* (2013.01); *H01L 2223/6655* (2013.01); *H01L 2223/6666* (2013.01); *H01L 2223/6677* (2013.01)

(58) Field of Classification Search
CPC . H01L 23/66; H01L 25/0657; H01L 23/5329; H01L 23/642; H01L 2223/6655; H01L 2223/6677; H01L 2223/6666; H01G 4/1209; H01G 4/1272; H01G 4/30
See application file for complete search history.

(56) References Cited

U.S. PATENT DOCUMENTS

| | | | |
|---|---|---|---|
| 6,285,048 B1 * | 9/2001 | Azuma | C04B 35/4682 257/295 |
| 6,737,728 B1 * | 5/2004 | Block | H01L 23/5223 257/296 |
| 9,165,793 B1 * | 10/2015 | Wang | H01L 21/56 |
| 9,761,544 B1 * | 9/2017 | Oyamada | H01L 24/16 |
| 2002/0017700 A1 * | 2/2002 | Mori | H01L 23/642 257/532 |
| 2006/0092079 A1 * | 5/2006 | de Rochemont | H01Q 1/362 343/700 MS |
| 2007/0003781 A1 | 1/2007 | De Rochemont | |

(Continued)

OTHER PUBLICATIONS

International Search Report and Written Opinion dated Jul. 20, 2018, for International application No. PCT/US18/30634.

*Primary Examiner* — Ahmed N Sefer
(74) *Attorney, Agent, or Firm* — Burns & Levinson LLP; David W. Gomes; Jerry Cohen

(57) ABSTRACT

The present invention ultra-low loss high energy density dielectric layers having femtosecond ($10^{-15}$ sec) polarization response times within a chip stack assembly to extend impedance-matched electrical lengths and mitigate ringing within the chip stack to bring the operational clock speed of the stacked system closer to the intrinsic clock speed(s) of the semiconductor die bonded within chip stack.

19 Claims, 50 Drawing Sheets

(56) References Cited

U.S. PATENT DOCUMENTS

| | | | |
|---|---|---|---|
| 2008/0266031 A1* | 10/2008 | Uematsu | H01L 23/49838 333/247 |
| 2011/0147063 A1* | 6/2011 | Kwon | H05K 1/0231 174/260 |
| 2011/0248900 A1 | 10/2011 | De Rochemont | |
| 2013/0104969 A1 | 5/2013 | Rappe | |
| 2013/0162372 A1* | 6/2013 | Sasaki | H01F 17/0013 333/185 |
| 2013/0175664 A1 | 7/2013 | De Rochemont | |
| 2013/0228895 A1* | 9/2013 | Iguchi | H01L 28/40 527/532 |
| 2015/0103465 A1* | 4/2015 | Kang | H01G 4/1227 361/301.4 |
| 2017/0209898 A1* | 7/2017 | Henneken | B06B 1/0292 |

* cited by examiner

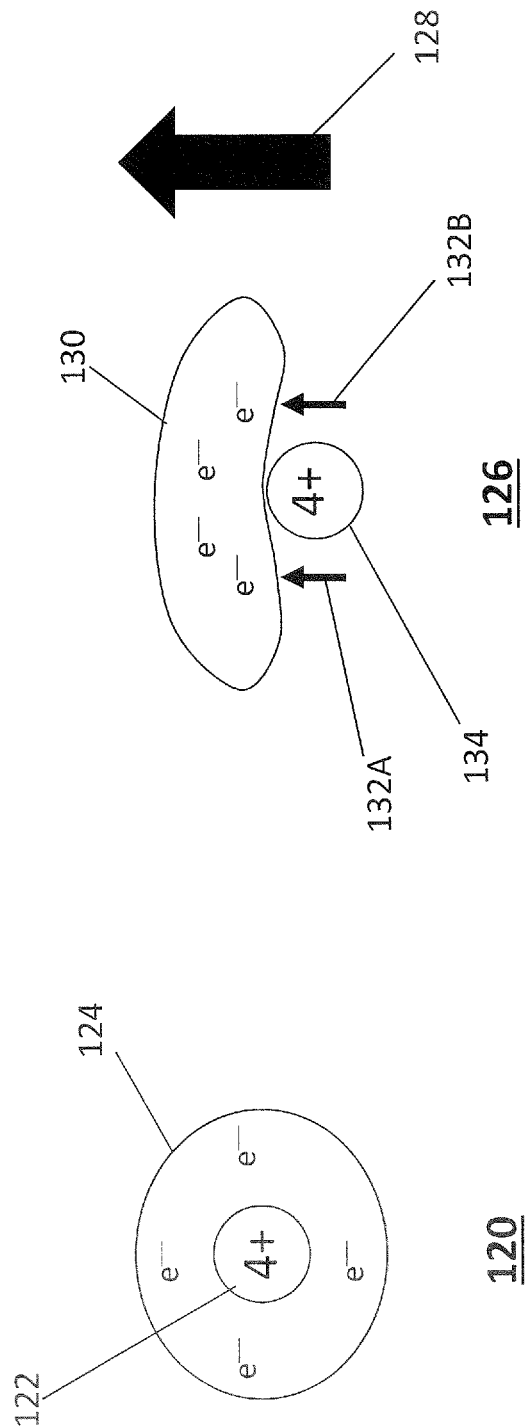

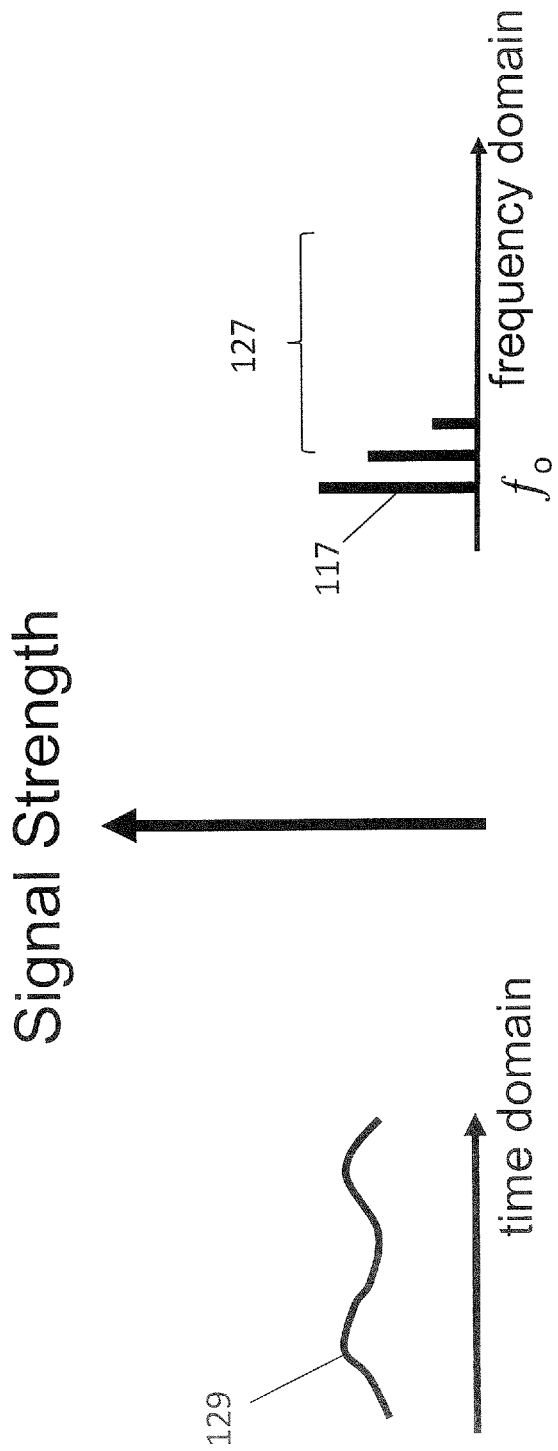

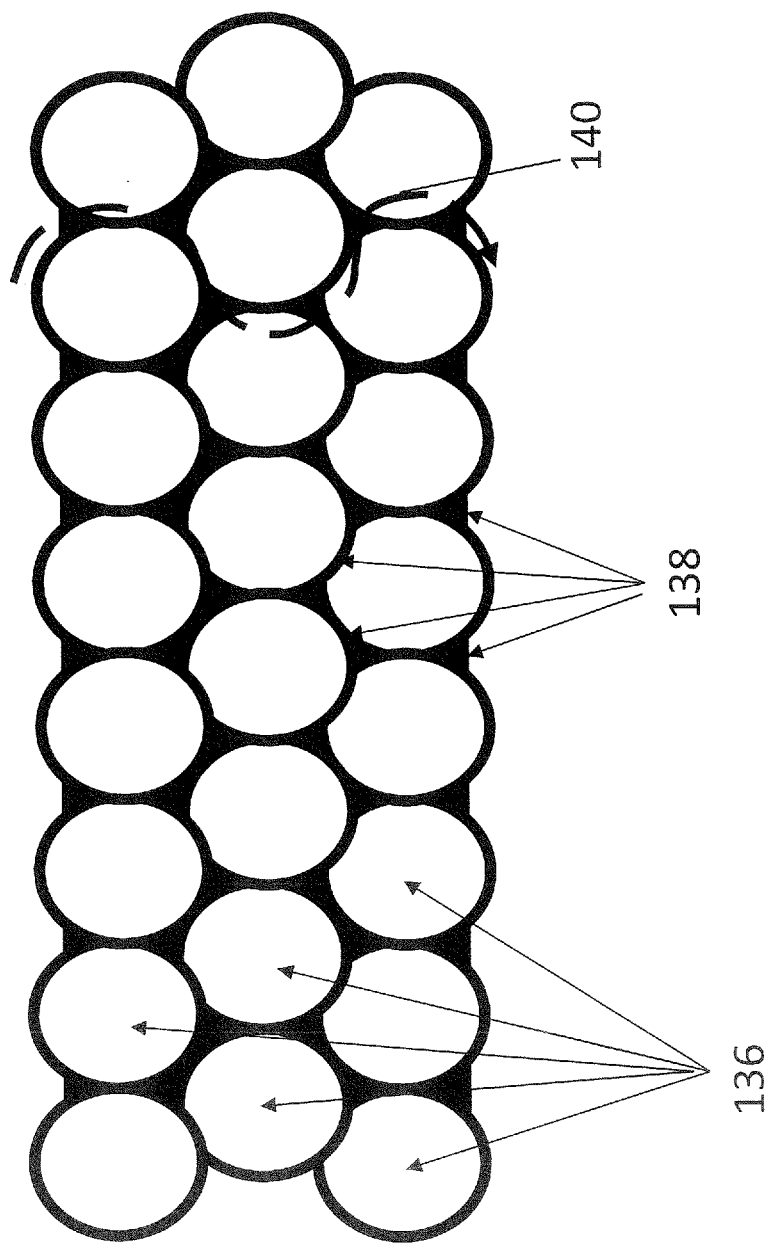

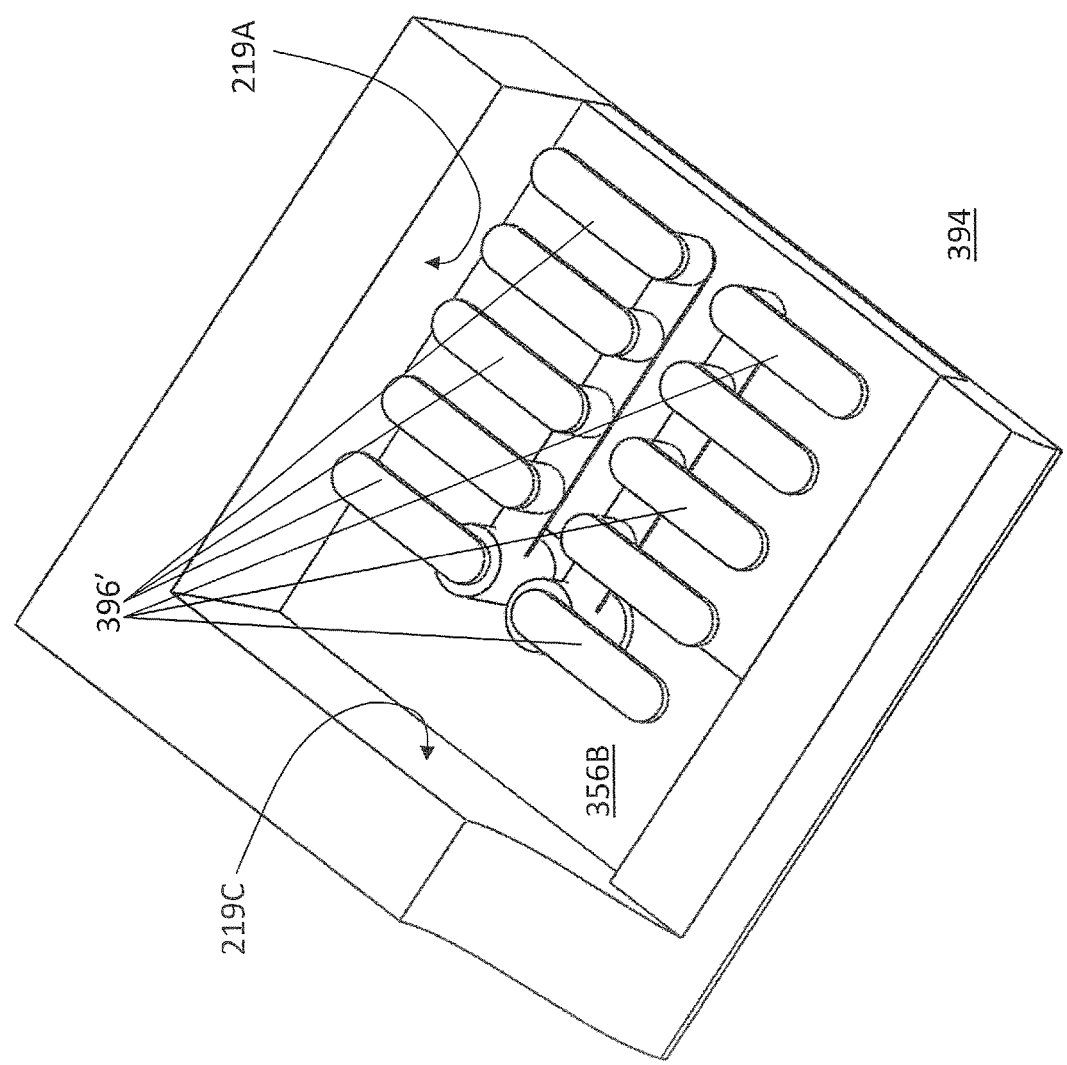

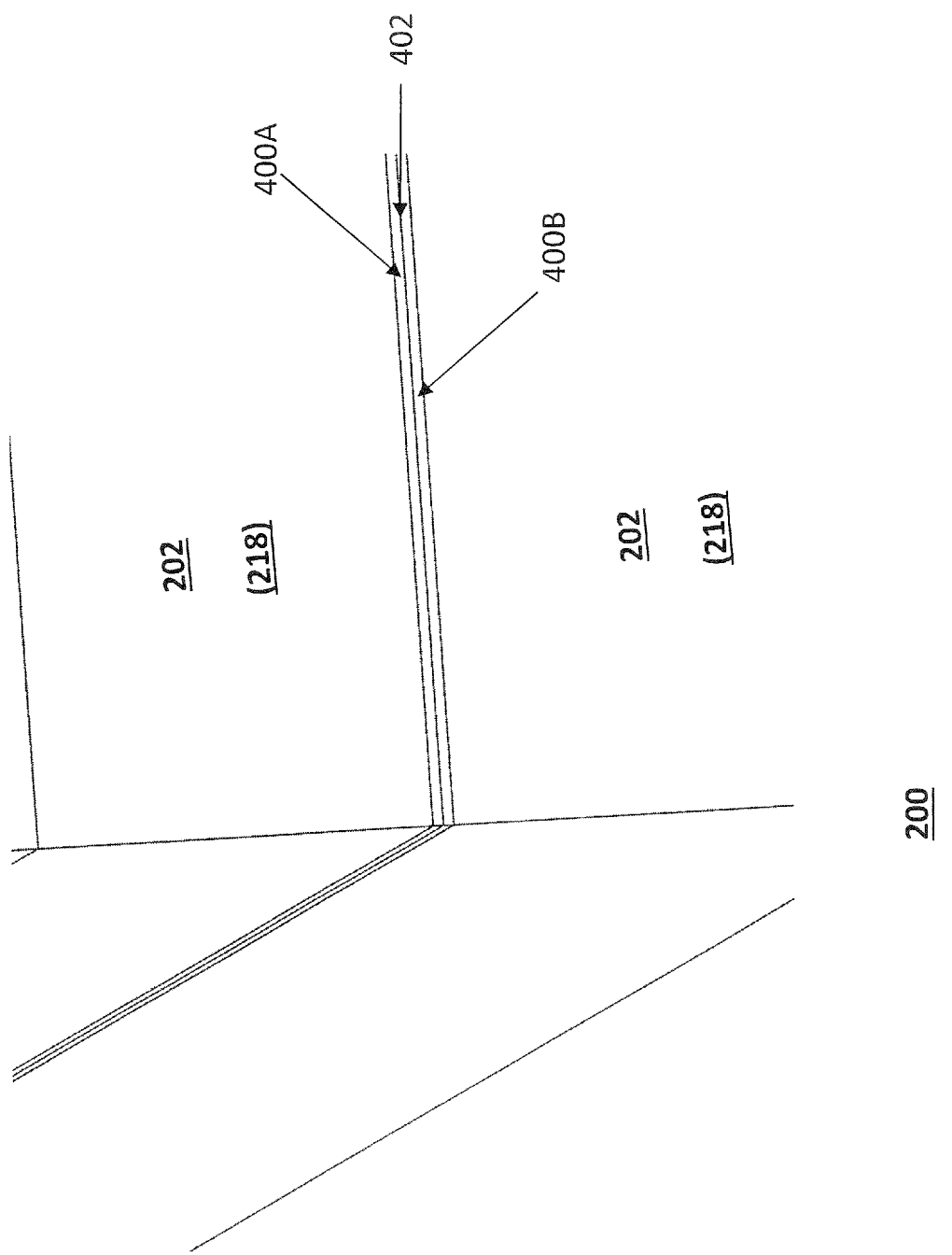

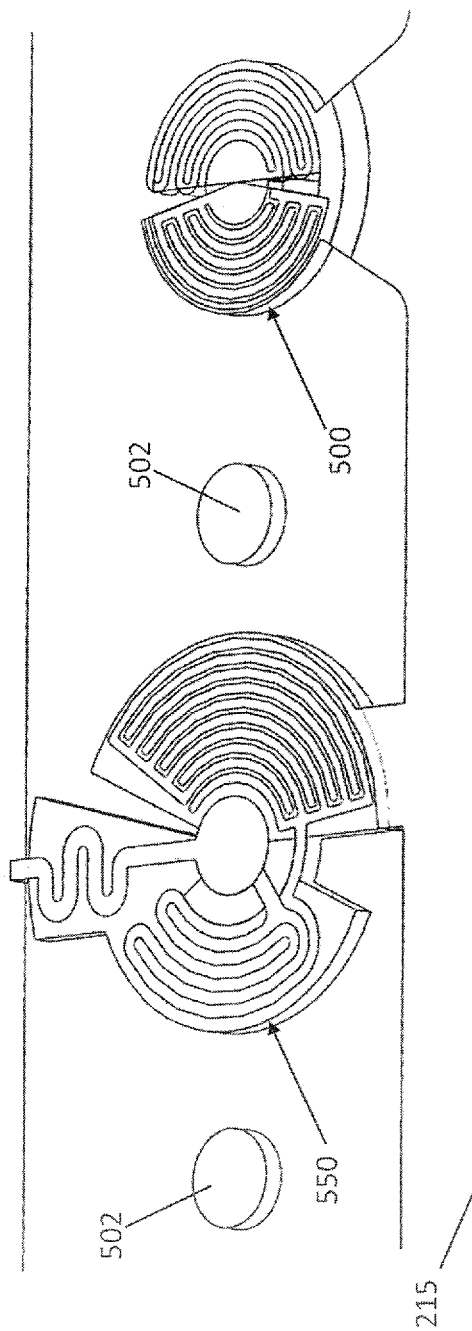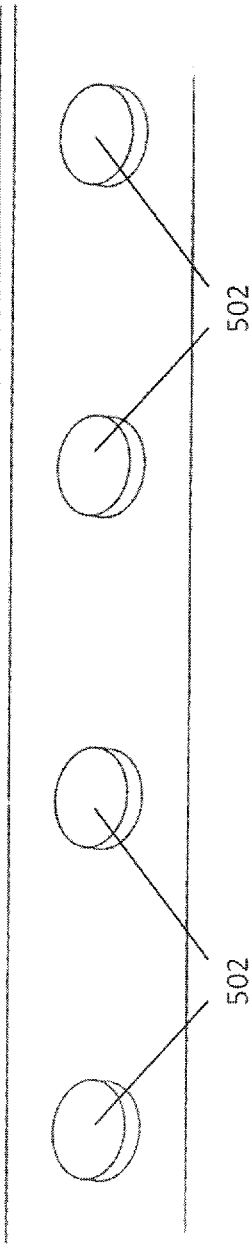
FIG. 6A

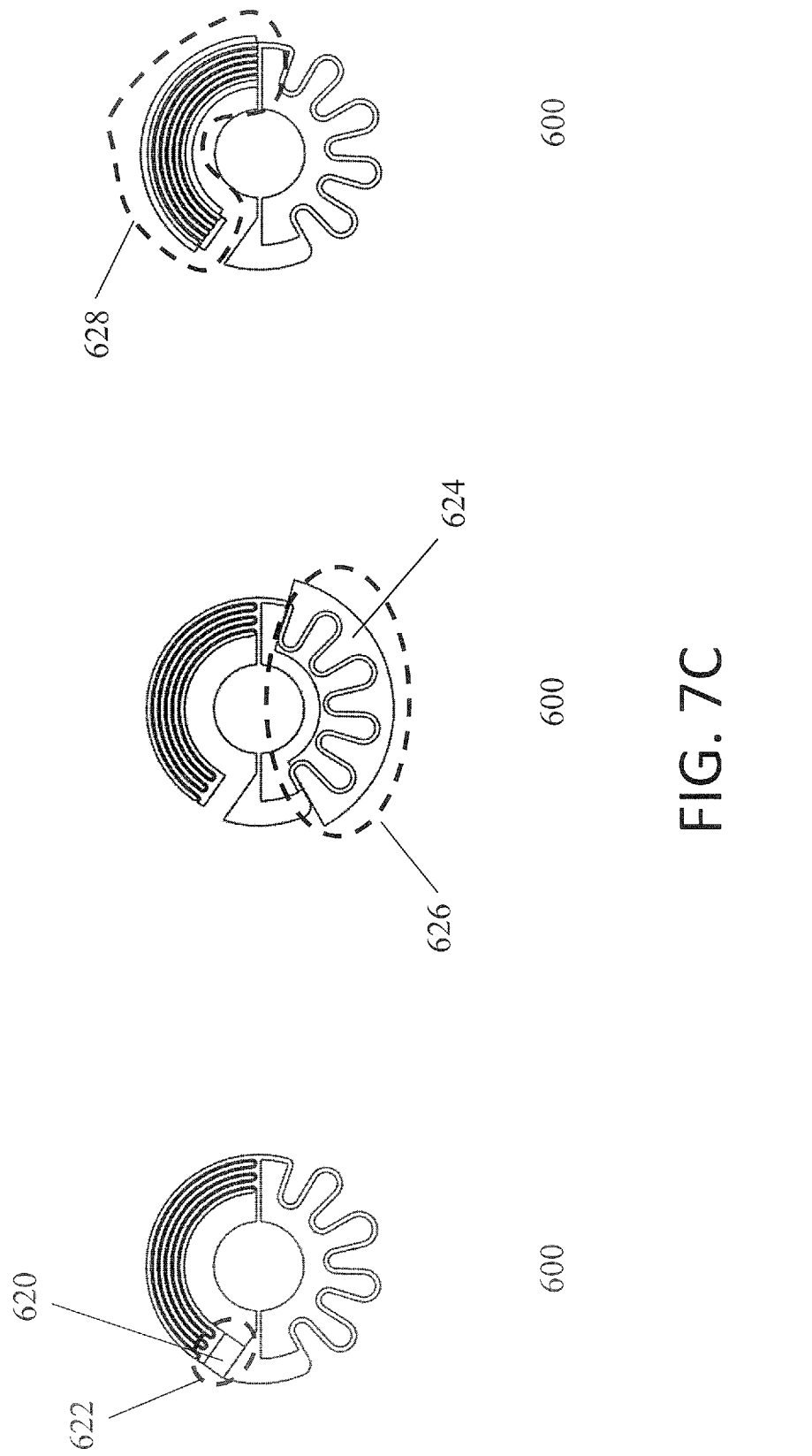

TABLE II

| Rise Time (ps) | 1,000 | | | |
|---|---|---|---|---|
| Material | Dielectric Constant | Delay (ps/in) | rising edge length (in) | lumped circuit length (in) | lumped circuit length (mm) |
| air | 1 | 85 | 11.76 | 1.96 | 49.80 |
| FR4 | 4.5 | 180.31 | 5.55 | 0.92 | 23.48 |
| alumina | 10 | 268.79 | 3.72 | 0.62 | 15.75 |
| titania | 70 | 711.16 | 1.41 | 0.23 | 5.95 |
| HEDCD-1 | 200 | 1202.08 | 0.83 | 0.14 | 3.52 |
| HEDCD-1 | 800 | 2404.16 | 0.42 | 0.07 | 1.76 |

| Rise Time (ps) | 100 | | | |
|---|---|---|---|---|
| Material | Dielectric Constant | Delay (ps/in) | rising edge length (in) | lumped circuit length (in) | lumped circuit length (mm) |
| air | 1 | 85 | 1.18 | 0.20 | 4.98 |
| FR4 | 4.5 | 180.31 | 0.55 | 0.09 | 2.35 |
| alumina | 10 | 268.79 | 0.37 | 0.06 | 1.57 |
| titania | 70 | 711.16 | 0.14 | 0.02 | 0.60 |
| HEDCD-1 | 200 | 1202.08 | 0.08 | 0.01 | 0.35 |
| HEDCD-1 | 800 | 2404.16 | 0.04 | 0.01 | 0.18 |

FIG. 9

HIGH SPEED SEMICONDUCTOR CHIP STACK

CROSS-REFERENCE TO RELATED APPLICATIONS

This application claims priority to U.S. Provisional Application No. 62/582,182, filed on Nov. 6, 2017, titled HIGH SPEED SEMICONDUCTOR CHIP STACK and U.S. Provisional Application No. 62/500,177, filed on May 2, 2017, titled HIGH SPEED SEMICONDUCTOR CHIP STACK, which is incorporated by reference herein in its entirety for all purposes.

FIELD OF THE INVENTION

The present invention relates generally to the design and construction of a three dimensional (3D) stack of semiconductor die (chips) that improves system clock speeds of the assembled integrated circuits by using ultra-low loss, high dielectric density materials within the vicinity of interconnecting transmission lines.

The present invention further relates to configuring a transmission line on the surface of a semiconductor die embedded within a chip stack, or an embedded interposer bonded to the surface of a semiconductor die embedded within said chip stack, wherein ultra-low loss/high energy density dielectric materials in the form of high permeability and high permittivity dielectrics are periodically arranged along the length of said transmission line to cause it to resonate at a frequency that matches the clock speed of one or more semiconductor die embedded within the chip stack.

An aspect of the present invention relates to forming resonant transmission lines located on the surface of a semiconductor die or interposer that comprise periodic arrangements of ultra-low loss high permittivity and high permeability dielectric materials that have characteristic impedance that is matched to the output and input impedance of semiconductor die embedded within a chip with which the resonant transmission lines are in electrical communication.

The present invention additionally relates to geometric features comprising magnetic materials located in the vicinity of a vertical interconnect (via) to minimize electromagnetic reflections at a via.

BACKGROUND TO THE INVENTION

The current technology nodes enabled by Moore's Law allow semiconductor die to operate at higher clock speeds. An integrated circuit ("IC") will test at 20 GHz clock speeds as a bare die on a wafer, but that intrinsic clock speed is reduced to clock speeds ranging from 2.5 GHz to 3.4 GHz when the IC is packaged and electrically connected to a printed circuit board ("PCB"). IC clock speed improves to frequencies in the range of 7-7.5 GHz, roughly one-third of the bare dies' intrinsic clock speeds, when the semiconductor die are embedded within a chip stack as shown in FIG. 1. Therefore, means that permit a system of electrically interconnected IC chips to operate at clock speeds higher than 7-7.5 GHz or at clock speeds that are significantly greater than one third the value of their intrinsic clock speed is novel, valuable, and absent from the marketplace.

OVERVIEW OF THE RELATED ART

As depicted in FIGS. 1A,1B a semiconductor chip stack 1 relates to the vertical 3 and lateral 5 mounting of bonded die 7 on a major surface 9 of a semiconductor chip stack 1, wherein a metal pad array 11 forms the bonded electrical interface between the bonded die 7 and the chip stack 1. The chip stack 1 may also comprise a vertical chip stack 13 of semiconductors devices 15 that are bonded wafer-to-wafer upon a base substrate 17 that may be a semiconductor or an interposer. Non-semiconducting interposers 19 may be included in the vertical chip stack 17. Vertical electrical interconnections between the semiconductor devices 15, interposers 19, bonded die 7 in the vertical chip stack 13 and the larger microelectronic system 20 are made through silicon thru vias 21. For the purpose of reviewing the related art, the term chips may allude to an interposer 17 or a semiconductor IC, wherein serves the interposer comprises no active circuitry and merely serves the purpose of providing a passive electrical interconnection between semiconductor IC chips assembled in the semiconductor chip stack 1.

High frequency circuit designs require an extensive use of passive component networks to match impedances and minimize ringing that compromises high frequency signal transmission. Modern passive components (resistors 23, capacitors 25, and inductors 27) possess inexact performance tolerances that require their placement upon the surface of printed circuit board 29 where a component can be easily replaced when its performance value is so far out of tolerance that it causes total system failure during electrical test. As a consequence, even though semiconductor chip stack 1 improves microelectronic integration, its performance is ultimately limited by the technical and economic constraints of a printed circuit board assembly.

Chip stack bonding may be achieved in a variety of ways. A preferred method utilizes oxide-oxide low-temperature direct bonding techniques that are commonly used in 3D wafer and chip integration, wherein oxide material deposited on the surface of the chips is used as the bonding agent. Metal-metal low temperature direct bonding techniques are also applicable at surface areas where exposed metal configured to provide a mating surface and electrical interface between chips are available.

Titanium dioxide is a preferred oxide material in stacked chip embodiments because it provides low dielectric loss and has moderately high dielectric permittivity, $\varepsilon_R=70$. These dielectric properties push signal coupling and dispersion-related losses to higher frequencies, which, in turn, increase the frequencies at which the chip stack starts ringing and becomes nonoperational. High speed/high frequency circuits need to be designed as distributed, rather than lumped circuits, and that passive component networks serve a critical role in properly terminating high frequency transmission lines to reduce ringing. As will be discussed in greater detail below, dielectric permittivity, CR, is an important parameter affecting the ability of interconnected chips to operate reliably at higher clock speed. It should be noted that, in the prior art, passive circuit elements comprising high dielectric density materials are not included in chip stack assemblies, so their use in tuning electrical terminations is limited to their placement on a printed circuit board, external packaging system or interconnect.

de Rochemont U.S. Pat. No. 7,405,698 entitled "CERAMIC ANTENNA MODULE AND METHODS OF MANUFACTURE THEREOF" (the '698 application) discloses the use of high permittivity electroceramic to form transmission lines that have characteristic impedance that matches the input/output impedance of a semiconductor chip, and the integration of those transmission lines on the surface of a semiconductor die or electrical interconnect (interposer), but it does not disclose art related to transmission lines that comprise high permittivity and high permeability dielectrics configured along the path of a transmission line that causes the transmission line to resonate a given frequency or desired clock speed, nor does it disclose the incorporation of high permittivity transmission lines within a chip stack 1.

de Rochemont U.S. Ser. No. 11/479,159, filed Jun. 30, 2006, entitled "ELECTRICAL COMPONENT AND METHOD OF MANUFACTURE" (the '159 application) discloses and claims high permittivity electroceramics that by virtue of having uniform nanoscale grain size and microstructure exhibits dielectric permittivity that remains stable over standard operating temperatures. It also discloses the incorporation of those high permittivity electroceramics within a capacitor that is formed on the surface of a semiconductor die, an electrical interconnect (interposer), or within a printed circuit board, but it does not disclose its application to semiconductor chip stacks.

DEFINITION OF TERMS

The term "average amu" is herein understood to mean the median atomic mass of a unit cell for a crystalline compound derived by summing the fractional atomic mass units contributed by elements forming the crystal lattice.

The term "Bitcoin" is herein understood to mean a digital crypto-currency that is mined on a Blockchain using a computer algorithm and exists in limited supply.

The term "Blockchain" is herein understood to mean a process used to form a trusted auditable record in a digital ledger that is distributed across a computer network.

The terms "chemical complexity", "compositional complexity", "chemically complex", or "compositionally complex" are herein understood to refer to a material, such as a metal or superalloy, compound semiconductor, or ceramic that consists of three (3) or more elements from the periodic table.

The term "chip stack" is herein understood to mean a bonded three dimensional (3I)) assembly of chips that may comprise semiconductor die and non-semiconductor chip elements, such as sensors, micro-electromechanical systems ("MEMS"), and/or interposer circuits that provide passive electrical interconnections between the various components in the 3D assembly.

The term "critical performance tolerances" is herein understood to refer to the ability for all passive components in an electrical circuit to hold performance values within ±1% of the desired values at all operating temperatures over which the circuit was designed to function.

The term "distributed ledger technology" is herein understood to refer to a computational platform that generates a trusted database distributed across a computer network wherein trust related to an entry or transaction is assured when a majority of computers that are parties to the network confirm the entry or transaction and said entry or transaction remains a permanent record of the computer network that can be openly inspected and cannot be altered.

The term "electroceramic" is herein understood to refer to its conventional meaning as being a complex ceramic material that has robust dielectric properties that augment the field densities of applied electrical or magnetic stimulus.

The term "integrated circuit" (or "IC") is herein understood to mean a semiconductor chip into which a large, very large, or ultra-large number of transistor elements have been embedded.

The term "liquid chemical deposition" (or "LCD") is herein understood to mean a method that uses liquid precursor solutions to fabricate materials of arbitrary compositional or chemical complexity as an amorphous laminate or free-standing body or as a crystalline laminate or free-standing body that have atomic-scale chemical uniformity and a microstructure that is controllable down to nanoscale dimensions.

The term "MAX-phase material" is herein understood to define a chemically complex intermetallic ceramic material having the general chemical formula $M_{(n+1)}AX_n$, wherein M is first row transition-metal element, A is an "A-group" element found in columns III-VI of the periodic table, and X is either carbon (C) or nitrogen (N).

The term "microstructure" is herein understood to hold its traditional meaning of relating to the grain size, grain chemistry, and grain boundary chemistry of a polycrystalline ceramic material.

The term "passive component" is herein understood to refer to its conventional definition as an element of an electrical circuit that that modulates the phase or amplitude of an electrical signal without producing power gain.

The term "physical layer" is herein understood to understood to mean a patterned or unpatterned material layer embedded within a microelectronic circuit wherein the material possesses some unique physical property that enhances the proper function of the circuit or a circuit element.

The term "resonant gate transistor" is herein understood to refer to any of the transistor architectures disclosed in de Rochemont, U.S. Ser. No. 13/216,192, "POWER FET WITH A RESONANT TRANSISTOR GATE", wherein the transistor switching speed is not limited by the capacitance of the transistor gate, but operates at frequencies that cause the gate capacitance to resonate with inductive elements embedded within the gate structure.

The term "standard operating temperatures" is herein understood to mean the range of temperatures between −40° C. and +125° C.

The term "surface feature" is herein understood to mean one or more patterned physical layers integrated on the surface of a substrate wherein the patterns and physical properties of the physical layers are designed to serve some functional purpose within a microelectronic circuit.

The term "thermoelectric effect" is herein understood to refer to its conventional definition as the physical phenomenon wherein a temperature differential applied across a material induces a voltage differential within that material, and/or an applied voltage differential across the material induces a temperature differential within that material.

The term "thermoelectric material" is herein understood to refer to its conventional definition as a solid material that exhibits the "thermoelectric effect".

The term "thermomechanical" is herein understood to refer to its conventional definition as relating to properties induced or created by the simultaneous application of elevated temperature and mechanical force or pressure.

The term "thinned" is herein understood to refer to an interposer, a sensor chip, or a semiconductor die that has been ground and chemical mechanically polished to reduce its original thickness to a lesser thickness, preferably a thickness on the order of 25 μm or less.

The term "thru via" or "via" is herein understood to refer to its conventional definition as relating to a vertical electrical connection that is made by filling a thru hole with an electrically conductive substance.

The terms "tight tolerance" or "critical tolerance" are herein understood to mean a performance value, such as a capacitance, inductance, or resistance that varies less than −0.1% over standard operating temperatures.

The term "transmission line" is herein understood, for the specific purpose of this application, to refer to any of the following: a microstrip 352, a stripline 354, ground-cladded stripline 357, ground-cladded dielectric waveguide 355, and a dielectric slab waveguide 359

The term "II-VI compound semiconductor" is herein understood to refer to its conventional meaning describing a compound semiconductor comprising at least one element from column IIB of the periodic table including: zinc (Zn), cadmium (Cd), or mercury (Hg); and, at least one element from column VI of the periodic table consisting of: oxygen (O), sulfur (S), selenium (Se), or tellurium (Te).

The term "III-V compound semiconductor" is herein understood to refer to its conventional meaning describing a compound semiconductor comprising at least one semi-metallic element from column III of the periodic table including: boron (B), aluminum (Al), gallium (Ga), and indium (In); and, at least one gaseous or semi-metallic element from the column V of the periodic table consisting of: nitrogen (N), phosphorous (P), arsenic (As), antimony (Sb), or bismuth (Bi).

The term "IV-IV compound semiconductor" is herein understood to refer to its conventional meaning describing a compound semiconductor comprising a plurality of elements from column IV of the periodic table including: carbon (C), silicon (Si), germanium (Ge), tin (Sn), or lead (Pb).

The term "IV-VI compound semiconductor" is herein understood to refer to its conventional meaning describing a compound semiconductor comprising at least one element from column IV of the periodic table including: carbon (C), silicon (Si), germanium (Ge), tin (Sn), or lead (Pb); and, at least one element from column VI of the periodic table consisting of: sulfur (S), selenium (Se), or tellurium (Te).

SUMMARY OF THE INVENTION

The present invention generally relates to integration of one or more ultra-low loss high energy density dielectric layers having femtosecond ($10^{-15}$ sec) polarization response times within a chip stack assembly to extend impedance-matched electrical lengths and mitigate ringing within the chip stack to bring the operational clock speed of the stacked system closer to the intrinsic clock speed(s) of the semiconductor die bonded within chip stack.

An additional embodiment of the present invention relates to the inclusion of high efficiency thermoelectric devices in thermal communication with MAX-phase ceramic layers embedded within the high speed semiconductor chip stack to dissipate heat generated by embedded semiconductor die.

Another embodiment of the present invention relates to the integration of passive components satisfying critical performance tolerances to terminate transmission lines within the high speed chip stack.

A yet another embodiment of the present invention relates to formation or bonding of passive components satisfying critical performance tolerances on a major surface of the high speed semiconductor chip stack, as well as their electrical connection to one or more interfacial layers within the high speed chip stack through silicon (semiconductor) thru vias.

A further embodiment of the present invention relates to the electrical connection of a single layer or multi layer capacitor comprising high energy density capacitive dielectrics having nanoscale microstructure as a decoupling capacitor for the high speed semiconductor chip stack.

An added embodiment of the present invention relates to the inclusion of impedance matching and/or frequency filtering networks within the high speed semiconductor chip stack, and resonant transmission lines comprising high permittivity and high permeability dielectric materials.

A further additional embodiment relates to the inclusion of terminated vias within the high speed semiconductor chips stack.

One embodiment of the present invention provides a high-speed semiconductor chip stack forming an electrical circuit comprising one or more physical layers of perovskite electroceramic that functions as a capacitive dielectric material and said one or more physical layers are integrated as part of at least one surface feature on a semiconductor die or an interposer embedded within the high speed semiconductor chip stack wherein the perovskite electroceramic forming said capacitive dielectric material further comprises a uniform distribution of ceramic grains with a grain size diameter less than 50 nm such that orbital deformations constitute the sole mechanism contributing to the dielectric polarization within said capacitive dielectric material.

The capacitive dielectric material may have dielectric polarization rates measured on femto-second time scales. The perovskite electroceramic may have a relative permittivity $\varepsilon_R \geq 70$. The high energy density capacitive dielectric material may have a relative permittivity, $\varepsilon_R$, in the range of $200 \leq \varepsilon_R \leq 800$. The capacitive dielectric material may comprise a thermodynamically stable perovskite electroceramic. The thermodynamically stable perovskite electroceramic may comprise titanate, zirconate, hafnate, niobate, or tantalate electroceramic, or admixture thereof. The perovskite electroceramic may comprise an admixture of three (3) or more elements from the group comprising: scandium (Sc), titanium (Ti), vanadium (V), chromium (Cr), manganese (Mn), zinc (Zn), zirconium (Zr), niobium (Nb), molybdenum (Mo), hafnium (Hf), tantalum (Ta), tungsten (W), lanthanum (La), cerium (Ce), praseodymium (Pr), neodymium (Nd), samarium (Sm), europium (Eu), gadolinium (Gd), terbium (Tb), dionysium (Dy), holomium (Ho), ytterbium (Yb), indium (In), tin (Sn), lead (Pb), or bismuth (Bi). The perovskite electroceramic may have a crystal lattice with an average atomic mass unit (amu) that is greater than 25. The crystal lattice may have an average atomic mass unit (amu) that is greater than 50. The surface feature may be deployed to terminate an electrical discontinuity in the electrical circuit. The surface feature is deployed along a transmission line. The surface feature and transmission line may be deployed on a semiconductor die. The surface feature and transmission line may be deployed on an interposer. The surface feature may be deployed at a via. The surface feature and the via may be deployed on a semiconductor die. The surface feature and the via may be deployed on an interposer. The at least one surface feature may minimize the reflections of higher frequency harmonics of the digital signal pulse such that the operational system clock speed of the high-speed semiconductor chip stack optimally matches the slowest clock speed of the semiconductor die embedded within the high speed semiconductor chip stack. The high-speed semiconductor chip stack may have one or more embedded semiconductor die perform an optical or electro-optical circuit function. The high-speed semiconductor chip stack may have one or more embedded semiconductor die be a component of a wireless transmitter, wireless receiver, or wireless transceiver circuit module. The composition of the perovskite electroceramic may be doped with ≤0.05 mol % of silicon dioxide that forms electrically insulating metal oxide phases at the nanoscale grain boundaries within the perovskite electroceramic to neutralize the formation of internal conductive pathways and dissipation currents within the capacitive dielectric material.

Another embodiment of the present invention provides a high-speed semiconductor chip stack forming an electrical circuit comprises one or more physical layers of garnet electroceramic that functions as a high permeability magnetic core material within an inductive element and said one or more physical layers are integrated as part of at least one surface feature on a semiconductor die or an interposer embedded within the high speed semiconductor chip stack. The high permeability garnet electroceramic may adopt either a rhombic dodecahedron or trapezohedron crystal structure, or a combination of the two crystal structures. The high permeability garnet electroceramic may comprise a uniform distribution of ceramic grains with a grain size diameter ranging from 10 nm to 25 µm. The garnet electroceramic forming said high permeability core may comprise a uniform distribution of ceramic grains with a grain size diameter preferably ranging from 250 nm to 5 µm. The high permeability garnet electroceramic may comprise an $A_3B_2(SiO_4)_3$ chemical formula, where the preferred Group A metal oxides comprise calcium oxide (CaO), magnesium oxide (MgO), iron oxide (FeO), and manganese oxide (MnO), and the preferred Group B metal oxides comprise aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). The high permeability garnet electroceramic may comprise an admixture of Group A metal oxides consisting of calcium oxide (CaO), magnesium oxide (MgO), iron oxide (FeO), and manganese oxide (MnO). The high permeability garnet electroceramic may comprise an admixture of Group B metal oxides consisting of aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). The high permeability garnet electroceramic may comprise an admixture of Group A metal oxides consisting of calcium oxide (CaO), magnesium oxide (MgO), iron oxide (FeO), and manganese oxide (MnO), and an admixture of Group B metal oxides consisting of aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). The surface feature may be deployed to terminate an electrical discontinuity in the electrical circuit. The surface feature may be deployed along a transmission line. The surface feature and transmission line may be deployed on a semiconductor die. The surface feature and transmission line may be deployed on an interposer. The surface feature may be deployed at a via. The surface feature and the via may be deployed on a semiconductor die. The surface feature and the via may be deployed on an interposer. The at least one surface feature may minimize the reflections of higher frequency harmonics of the digital signal pulse such that the operational system clock speed of the high-speed semiconductor chip stack optimally matches the slowest clock speed of the semiconductor die embedded within the high speed semiconductor chip stack. The high-speed semiconductor chip stack may have one or more embedded semiconductor die perform an optical or electro-optical circuit function. The high-speed semiconductor chip stack may have one or more embedded semiconductor die be a component of a wireless transmitter, wireless receiver, or wireless transceiver circuit module. The inductive element may have an ultra-low loss material, preferably amorphous, used as an air gap material. The air gap material may be in contact with an inductive winding. The inductive element may have an ultra-low loss material layer, preferably amorphous, embedded within magnetic core. The ultra-low loss material layer thickness may measure 1-10 nm.

Yet another embodiment of the present invention provides high-speed semiconductor chip stack comprising a stack of wafer-bonded semiconductor die that are electrically interconnected to each other and to the system input/output using vias, and may optionally include interposers, wherein, surface features formed on the semiconductor die or interposers embedded within the high-speed semiconductor chip stack comprise one or more physical layers that are configured to function as a capacitive element and the dielectric material forming said capacitive element further comprises perovskite electroceramic consisting of a uniform distribution of ceramic grains with a grain size diameter less than 50 nm such that orbital deformations constitute the sole mechanism contributing to the dielectric polarization within said capacitive dielectric material; and surface features formed on the semiconductor die or interposers embedded within the high-speed semiconductor chip stack comprise one or more physical layers that are configured to function as an inductive element and the magnetic core material forming said inductive element further comprises a garnet electroceramic.

The wafer-bonded semiconductor chips may be bonded to a thicker base substrate that comprises a semiconductor carrier or an electrical interconnect. The wafer-bonded semiconductor chips may be thinned to reduce the profile of the high-speed semiconductor chip stack. The wafer-bonded chips may further comprise a sensor chip. The sensor chip may be a MEMS device. The garnet electroceramic mayadopt either a rhombic dodecahedron or trapezohedron crystal structure, or a combination of the two crystal structures. The garnet electroceramic may have high permeability having $\mu_r \geq 10$. The high permeability garnet electroceramic comprises an $A_3B_2(SiO_4)_3$ chemical formula, where the preferred Group A metal oxides comprise calcium oxide (CaO), magnesium oxide (MgO), iron oxide (FeO), and manganese oxide (MnO), and the preferred Group B metal oxides comprise aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). The high permeability garnet electroceramic may comprise an admixture of Group A metal oxides consisting of calcium oxide (CaO), magnesium oxide (MgO), iron oxide (FeO), and manganese oxide (MnO). The high permeability garnet electroceramic may comprise an admixture of Group B metal oxides consisting of aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). The high permeability garnet electroceramic may comprise an admixture of Group A metal oxides consisting of calcium oxide (CaO), magnesium oxide (MgO), iron oxide (FeO), and manganese oxide (MnO), and an admixture of Group B metal oxides consisting of aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). The perovskite electroceramic may be thermodynamically stable and may comprise titanate, zirconate, hafnate, niobate, or tantalate electroceramic, or admixture thereof. The thermodynamically stable perovskite electroceramic may comprise an admixture of three (3) or more elements from the group comprising: scandium (Sc), titanium (Ti), vanadium (V), chromium (Cr), manganese (Mn), zinc (Zn), zirconium (Zr), niobium (Nb), molybdenum (Mo), hafnium (Hf), tantalum (Ta), tungsten (W), lanthanum (La), cerium (Ce), praseodymium (Pr), neodymium (Nd), samarium (Sm), europium (Eu), gadolinium (Gd), terbium (Tb), dionysium (Dy), holomium (Ho), ytterbium (Yb), indium (In), tin (Sn), lead (Pb), or bismuth (Bi). The perovskite electroceramic may have a crystal lattice with an average atomic mass unit (amu) that is greater than 25. The crystal lattice may have an average atomic mass unit (amu) that is greater than 50.

The high speed semiconductor chip stack may have the composition of the perovskite electroceramic doped with ≤0.05 mol % of silicon dioxide that forms electrically insulating metal oxide phases at the nanoscale grain boundaries within the perovskite electroceramic to neutralize the formation of internal conductive pathways and dissipation currents within the capacitive dielectric material. The high-speed semiconductor chip stack may comprise surface features formed on the semiconductor die or interposers embedded within the high-speed semiconductor chip stack comprising one or more physical layers that are configured to function as a resistor, wherein the resistor may comprise a metal, an alloy, a superalloy or an electroceramic. The high-speed semiconductor chip stack may comprise a sidewall power plane wherein the sidewall power plane electrically connects to the power plane on any semiconductor die, interposer, or sensor chip embedded within the high-speed semiconductor chip stack. The high-speed semiconductor chip stack may have wherein power planes for any semiconductor die, interposer, or sensor chip internally supplied through vias. The high-speed semiconductor chip stack may comprise a sidewall grounding plane. The high-speed semiconductor chip stack may comprise sidewall grounding planes that are symmetrically placed adjacent to the sidewall power plane, such that the sidewall power plane is located between the sidewall grounding planes. The sidewall grounding plane may be in electrical communication with grounding pads. The grounding pads may route electrical ground to specific locations on other electrical layers within the high-speed semiconductor chip stack.

The high-speed semiconductor chip stack may comprise one or more surface bonded semiconductor die, interposers, or sensor chips that are die-to-wafer bonded to a major surface of the high-speed semiconductor chip stack, wherein the surface bonded semiconductor die, interposers, or sensor chips are electrically connected to an array of contact pads formed on or formed within the interposer or semiconductor die positioned at the top of the chip stack to form the major surface of the high-speed semiconductor chip stack. The surface mounted semiconductor die may comprise a plurality of semiconductor die bounded as a stacked chip assembly. The stack chip assembly may be a surface mounted high-speed semiconductor chip stack. The semiconductor die in the stacked chip assembly may be thinned. The semiconductor die in the surface mounted high-speed semiconductor chip stack may be thinned. The high-speed semiconductor chip stack may have one or more passive components formed on or bonded to the high speed semiconductor chip and electrically interconnected through vias and/or transmission lines on the major surface. The one or more passive components may comprise a capacitive element further comprising a perovskite electroceramic physical layer as its dielectric body that has a nanoscale microstructure and fully polarizes and depolarizes at femtosecond time scales. The high-speed semiconductor chip stack may have one or more high energy density dielectric layers consisting of a crystal lattice having an average atomic mass unit greater than 25 amu, preferably an average atomic mass unit greater than 50 amu. The high-speed semiconductor chip stack may have the composition of the perovskite electroceramic doped with ≤0.05 mol % of silicon dioxide that forms electrically insulating metal oxide phases at the nanoscale grain boundaries within the perovskite electroceramic to neutralize the formation of internal conductive pathways and dissipation currents within the capacitive dielectric material. The high-speed semiconductor chip stack may have the one or more passive components comprise an inductive element further comprising a garnet electroceramic magnetic core. The one or more passive components may comprise a resistive element further comprising a metal, an alloy, a superalloy or an resistive electroceramic. The surface feature may be deployed to terminate an electrical discontinuity in the electrical circuit. The surface feature may be deployed along a transmission line. The surface feature and transmission line may be deployed on a semiconductor die. The surface feature and transmission line may be deployed on an interposer. The surface feature may be deployed at a via. The surface feature and the via may be deployed on a semiconductor die. The surface feature and the via may be deployed on an interposer. The at least one surface feature may minimize the reflections of higher frequency harmonics of the digital signal pulse such that the operational system clock speed of the high-speed semiconductor chip stack optimally matches the slowest clock speed of the semiconductor die embedded within the high speed semiconductor chip stack. The high-speed semiconductor chip stack may habe one or more embedded semiconductor die perform an optical or electro-optical circuit function. The high-speed semiconductor chip stack may have one or more embedded semiconductor die function as a component of a wireless transmitter, wireless receiver, or wireless transceiver circuit module.

Still another embodiment of the present invention provides a capacitive element formed or mounted upon a semiconductor die, sensor chip, or interposer, wherein the capacitive element comprises a physical layer of high energy density dielectric material having relative permittivity, $\varepsilon_r$, in the range of $200 \leq \varepsilon_r \leq 800$ and is electrically insulating positioned between two conductive electrodes such that the high energy density dielectric material further comprises: a perovskite electroceramic that is thermodynamically stable and may comprise titanate, zirconate, hafnate, niobate, or tantalate electroceramic, or admixture thereof; which further comprises an admixture of three (3) or more elements from the group comprising: scandium (Sc), titanium (Ti), vanadium (V), chromium (Cr), manganese (Mn), zinc (Zn), zirconium (Zr), niobium (Nb), molybdenum (Mo), hafnium (Hf), tantalum (Ta), tungsten (W), lanthanum (La), cerium (Ce), praseodymium (Pr), neodymium (Nd), samarium (Sm), europium (Eu), gadolinium (Gd), terbium (Tb), dionysium (Dy), holomium (Ho), ytterbium (Yb), indium (In), tin (Sn), lead (Pb), or bismuth (Bi); and has a crystal lattice unit cell with an average atomic mass of ≥25 amu, preferably ≥50 amu; with, a nanoscale microstructure wherein all the grains comprising the perovskite electroceramic have uniform grain size less than 50 nm; such that, the polarization response of the high energy density dielectric material is solely determined by orbital deformations that exhibit polarization response times on the order of femtoseconds ($10^{-15}$ sec).

The capacitive element may be used as a decoupling capacitor. The capacitive element, wherein the semiconductor die, sensor chip, or interposer upon which it is formed or mounted may be an element of an optical telecommunications circuit. The capacitive element, wherein the semiconductor die, sensor chip, or interposer upon which it is formed or mounted may be an element of a wireless receiver, wireless transmitter, or wireless transceiver circuit. The capacitive element may be configured as a parallel plate capacitor. The capacitive element may be configured as a multilayer decoupling capacitor. The capacitive element may be configured as a planar capacitor. The capacitive element may have the composition of the perovskite electroceramic doped with ≤0.05 mol % of silicon dioxide that forms electrically insulating metal oxide phases at the nanoscale grain boundaries within the perovskite electroceramic to neutralize the formation of internal conductive pathways and dissipation currents within the capacitive dielectric material. The capacitive element may be used as a decoupling capacitor. The capacitive element, wherein the semiconductor die, sensor chip, or interposer upon which it is formed or mounted may be an element of an optical telecommunications circuit. The capacitive element, wherein the semiconductor die, sensor chip, or interposer upon which it is formed or mounted may be an element of a wireless receiver, wireless transmitter, or wireless transceiver circuit. The capacitive element may be configured as a parallel plate capacitor. The capacitive element may be configured as a multilayer decoupling capacitor. The capacitive element may be configured as a planar capacitor.

A further embodiment of the present invention provides a multilayer decoupling capacitor that comprises primary and secondary electrodes, wherein, the primary electrode is in electrical communication with a plurality of primary conductor layers; and, the secondary electrode is in electrical communication with a plurality of secondary conductor layers; wherein, the primary conductor layers and secondary conductor layers have thicknesses ranging between 100 nm and 200 µm, and, each of the primary and secondary conductor layers are interleaved and separated from one another by a high energy density capacitive dielectric layer, wherein, the high energy density capacitive dielectric comprises a perovskite electroceramic that is thermodynamically stable and may comprise titanate, zirconate, hafnate, niobate, or tantalate electroceramic, or admixture thereof; which further comprises an admixture of three (3) or more elements from the group comprising: scandium (Sc), titanium (Ti), vanadium (V), chromium (Cr), manganese (Mn), zinc (Zn), zirconium (Zr), niobium (Nb), molybdenum (Mo), hafnium (Hf), tantalum (Ta), tungsten (W), lanthanum (La), cerium (Ce), praseodymium (Pr), neodymium (Nd), samarium (Sm), europium (Eu), gadolinium (Gd), terbium (Tb), dionysium (Dy), holomium (Ho), ytterbium (Yb), indium (In), tin (Sn), lead (Pb), or bismuth (Bi); and, has a crystal lattice unit cell with an average atomic mass of 25 amu, preferably ≥50 amu; with, a nanoscale microstructure wherein all the grains comprising the perovskite electroceramic have uniform grain size less than 50 nm; such that, the polarization response of the high energy density dielectric material is solely determined by orbital deformations that exhibit polarization response times on the order of femtoseconds ($10^{-15}$ sec).

The multilayer decoupling capacitor may be bonded to or formed on the major surface of a high-speed semiconductor chip stack. The high-speed semiconductor chip stack may comprise one or more semiconductor die, sensor chips, or interposers used in an optical telecommunications circuit. The high-speed semiconductor chip stack may comprise one or more semiconductor die, sensor chips, or interposers used in a wireless receiver, a wireless transmitter, or wireless transceiver circuit.

A still further embodiment of the present invention provides a chip, comprising a semiconductor die, sensor chip, or interposer, that further comprises a surface layer with thickness ranging from 10 nm to 5 mm that includes a dielectric core, amorphous silica, grounding pads and grounding planes, one or more vias, transmission lines and surface features configured to electrically terminate electromagnetic signals at discontinuities in the surface layer and the circuitry embedded on or within the chip, wherein the dielectric core material comprises: perovskite electroceramic consisting of a uniform distribution of ceramic grains with a grain size diameter less than 50 nm such that orbital deformations constitute the sole mechanism contributing to the dielectric polarization with polarization rates on femtosecond time scales.

The transmission lines may comprise dielectric core material that further comprises perovskite electroceramic consisting of a uniform distribution of ceramic grains with a grain size diameter less than 50 nm such that orbital deformations constitute the sole mechanism contributing to the dielectric polarization within said capacitive dielectric material wherein the perovskite electroceramic has dielectric. The via may be in electrical communication with one or more transmission lines that comprise a microstrip, a stripline, a ground-cladded stripline, ground-cladded dielectric waveguide, or a dielectric slab waveguide. The microstrip transmission line may be electrically connected to a terminated via. The stripline transmission line may be electrically connected to a terminated via. The ground-cladded stripline transmission line is electrically connected to a terminated via. The ground-cladded dielectric waveguide may be electromagnetically coupled to a terminated via. The terminated via may be a stub antenna that electromagnetically couples to the ground-cladded dielectric waveguide. The terminated via may be in electrical communication with a radiating element. The radiating element may comprise a monopole antenna. The radiating element is electromagnetically coupled to one or more closely coupled director elements that maximally radiate signal power into the dielectric core of the ground-cladded dielectric waveguide. The one or more closely coupled director elements may be electrically conducting having a spacing from the radiating element or other closely coupled director elements that is less than one quarter of the length of a guided wavelength, ($0.25\lambda_g$). The one or more closely coupled director elements may be a dielectric element. The dielectric element may be a high energy density dielectric. The monopole antenna may have a maximal length that is oriented to be parallel to the width of the ground-cladded waveguide and measures at least one tenth of the length of the guided wavelength, ($0.10\lambda_g$). The width of the waveguide's dielectric core may be at least one half of the length of the guided wavelength, ($0.50\lambda_g$). The monopole antenna maximal length may measure at least one half of the length of the guided wavelength, ($0.50\lambda_g$). The dielectric core in which the radiating element is embedded may be fully enveloped with ground planes and has grounding sidewalls on all sides except in the direction of the ground-cladded dielectric waveguide. The radiating element may be positioned a quarter of the length of the guided wavelength ($0.25\lambda_g$) from the grounding sidewall located opposite to the ground-cladded waveguide. The closely coupled director elements may have constant or variable spacing between any other closely coupled director element or the monopole antenna. The radiating element may be an antenna array comprising a plurality of radiating bodies, a phasing system, and a feed network. The radiating bodies may be dipole elements. The antenna array may be an End Fire or Broad Side array. The phasing system may comprise a phase-delayed conducting path. The phasing system may comprise a plurality of feed networks, one for each of the radiating bodies, that electrically connect each of the radiating bodies in the antenna array to phase-locked loop circuitry that independently tunes the phased output of each radiating element in the antenna array to optimize the electromagnetic coupling between the antenna array and the dielectric core of the ground-cladded dielectric waveguide. The feed network may have one via comprising the feed network electrically connecting the antenna array to a source signal and another via comprising the feed network electrically connecting the antenna array to the return signal. The feed network may have one via comprising the feed network electrically connecting one half of the antenna array to a source signal and another via comprising the feed network electrically connecting the remaining half of antenna array to ground. The antenna array may include closely coupled director elements. The antenna array may include closely coupled director elements. The radiating bodies may comprise folded geometry elements. The antenna array may further comprise closely coupled director elements.

The radiating bodies may further comprise folded geometry elements. The antenna array may further comprise closely coupled director elements. The dielectric slab waveguide may be electromagnetically coupled to a terminated via. The terminated via may be a stub antenna that electromagnetically couples to the dielectric slab waveguide. The terminated via may be in electrical communication with a radiating element. The radiating element may comprise a monopole antenna. The radiating element may be electromagnetically coupled to one or more closely coupled director elements that maximally radiate signal power into the dielectric core of the dielectric slab waveguide. The one or more closely coupled director elements may be electrically conducting having a spacing from the radiating element or other closely coupled director elements that is less than one quarter of the length of a guided wavelength ($0.25\lambda_g$). The one or more closely coupled director elements may be a dielectric element. The dielectric element may be a high energy density dielectric. The monopole antenna may have a maximal length that is oriented to be parallel to the width of the dielectric slab waveguide and measures at least one tenth of the length of the guided wavelength, ($0.10\lambda_g$). The width of the dielectric slab waveguide's dielectric core may be at least one half of the length of the guided wavelength, ($0.50\lambda_g$). The monopole antenna maximal length may measure at least one half of the length of the guided wavelength, ($0.50\lambda_g$). The dielectric core in which the radiating element is embedded may be fully enveloped with ground planes and has grounding sidewalls on all sides except in the direction of the dielectric slab waveguide. The radiating element may be positioned a quarter of the length of the guided wavelength ($0.25\lambda_g$) from the grounding sidewall located opposite to the dielectric slab waveguide. The closely coupled director elements may have constant or variable spacing between any other closely coupled director element or the monopole antenna. The radiating element may be an antenna array comprising a plurality of radiating bodies, a phasing system, and a feed network. The the radiating bodies may be dipole elements. The antenna array may be an End Fire or Broad Side array. The phasing system may comprise a phase-delayed conducting path. The phasing system may comprise a plurality of feed networks, one for each of the radiating bodies, that electrically connect each of the radiating bodies in the antenna array to phase-locked loop circuitry that independently tunes the phased output of each radiating element in the antenna array to optimize the electromagnetic coupling between the antenna array and the dielectric core of the dielectric slab waveguide. The feed network may have one via comprising the feed network electrically connecting the antenna array to a source signal and another via comprising the feed network electrically connecting the antenna array to the return signal. The feed network may have one via comprising the feed network electrically connecting one half of the antenna array to a source signal and another via comprising the feed network electrically connecting the remaining half of antenna array to ground. The antenna array may include closely coupled director elements. The antenna array may include closely coupled director elements. The radiating bodies may comprise folded geometry elements. The antenna array may further comprise closely coupled director elements. The radiating bodies may further comprise folded geometry elements. The antenna array may further comprise closely coupled director elements.

The transmission lines may comprise a meta-material dielectric waveguide. The meta-material core may comprise alternating regions of magnetic and non-magnetic dielectric material that independently fill fractional volumes within the dielectric core such that fractional volume for each, its shape, extent, and cross-sectional location are consistently spaced in a periodic fashion along the length of the dielectric waveguide. The meta-material dielectric core may comprise a host dielectric further comprising a periodic array of dielectric inclusions that may high energy density dielectric or garnet magnetic core material that are configured to create conditions for a resonant standing wave along the length of the meta-material dielectric waveguide. The meta-material dielectric waveguide may comprise a terminating via to critically damp a resonant standing wave within the dielectric core. The perovskite electroceramic may be thermodynamically stable high energy density dielectric and may comprise titanate, zirconate, hafnate, niobate, or tantalate electroceramic, or admixture thereof; which further comprises an admixture of three (3) or more elements from the group comprising: scandium (Sc), titanium (Ti), vanadium (V), chromium (Cr), manganese (Mn), zinc (Zn), zirconium (Zr), niobium (Nb), molybdenum (Mo), hafnium (Hf), tantalum (Ta), tungsten (W), lanthanum (La), cerium (Ce), praseodymium (Pr), neodymium (Nd), samarium (Sm), europium (Eu), gadolinium (Gd), terbium (Tb), dionysium (Dy), holomium (Ho), ytterbium (Yb), indium (in), tin (Sn), lead (Pb), or bismuth (Bi); and, has a crystal lattice unit cell with an average atomic mass of $\geq 25$ amu, preferably $\geq 50$ amu. The surface layer may comprise high permeability garnet electroceramic having $\lambda_r \geq 10$. The high permeability garnet electroceramic may comprise silicon oxide ($SiO_2$), with: one or more Group A metal oxides comprising calcium oxide (CaO), magnesium oxide (MgO), iron oxide (FeO), and manganese oxide (MnO); and, one or more Group B metal oxides comprising aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). The surface feature may comprise a planar resistor element, further comprising a resistive element inserted between two electrical shorts in electrical communication with a via or a transmission line. The planar resistor element may comprise a metal, an alloy, a superalloy, an electroceramic, or a carbide ceramic, preferably a MAX-phase ceramic. The surface feature may comprise a planar inductor element, further comprising a serpentine conducting element wound through a high permeability garnet electroceramic magnetic core inserted between two electrical shorts in electrical communication with a via or a transmission line. The surface feature may comprise a planar capacitor element in electrical communication with a via or a transmission line through electrical shorts. The planar capacitor element may comprise a first conducting element comprising a plurality of digits separated by a gap that contains high energy density capacitive dielectric from a second conducting element also comprising a plurality of digits that interleave the digits of the first conducting element. The planar capacitor element may comprise high energy density dielectric inserted between two electrical shorts. The surface layer may have electrical shorts, planar resistors, planar inductors, and planar capacitors configured with parallel and series electrical connections with transmission lines and vias to serve any frequency filtering or impedance matching function needed within the surface layer. The vias may serve as nodes used to connect additional branches to the passive circuit network. The dielectric core may comprise titanium oxide or hafnium oxide as single metal oxides. The chip may be inserted within a high speed semiconductor chip stack.

Yet another embodiment of the present invention provides a terminated via comprising a via, a via contact pad, a conducting element, and neighboring connection to electrical ground that are formed as surface features in a surface layer on a chip, and further comprising an impedance matching network used to electrically terminate a signal at the via, wherein the impedance matching network may additionally comprise: one or more inductors, one or more capacitors, or one or more resistors, one or more transmission lines formed as planar features on the chip, wherein the one or more planar inductors, planar capacitors, or planar resistors are configured in series or in parallel; and, a planar capacitor comprises a high energy capacitive dielectric further comprising a perovskite electroceramic consisting of a uniform distribution of ceramic grains having grain size diameter less than 50 nm such that orbital deformations constitute the sole mechanism contributing to the dielectric polarization within said capacitive dielectric material.

The terminated via may comprise high energy capacitive dielectric having dielectric polarization rates measured on femto-second time scales. The high energy density capacitive dielectric may comprise perovskite electroceramic comprising titanate, zirconate, hafnate, niobate, or tantalate electroceramic, or admixture thereof; which further comprises an admixture of three (3) or more elements from the group comprising: scandium (Sc), titanium (Ti), vanadium (V), chromium (Cr), manganese (Mn), zinc (Zn), zirconium (Zr), niobium (Nb), molybdenum (Mo), hafnium (Hf), tantalum (Ta), tungsten (W), lanthanum (La), cerium (Ce), praseodymium (Pr), neodymium (Nd), samarium (Sm), europium (Eu), gadolinium (Gd), terbium (Tb), dionysium (Dy), holomium (Ho), ytterbium (Yb), indium (In), tin (Sn), lead (Pb), or bismuth (Bi); and, has a crystal lattice unit cell with an average atomic mass of ≤25 amu, preferably ≤50 amu. The inductive element may comprise a high permeability garnet electroceramic magnetic core. The high permeability garnet electroceramic may comprise silicon oxide (SiO2), with: one or more Group A metal oxides comprising calcium oxide (CaO), magnesium oxide (MgO), iron oxide (FeO), and manganese oxide (MnO); and, one or more Group B metal oxides comprising aluminum oxide (Al2O3), iron oxide (Fe2O3), chromium oxide ($Cr_2O_3$), vanadium oxide (Y2O3), zirconium oxide ($ZrO_2$), titanium oxide ($TiO_2$), silicon oxide (SiO2), yttrium oxide (Y2O3), cobalt oxide (Co3O4), gadolinium oxide (Gd2O3) neodymium oxide (Nd2O3) and holmium oxide (Ho2O3). The terminated via, wherein a resistor comprises a resistive element may comprise a metal, a metallic alloy, a metallic superalloy, an electroceramic, or a carbide ceramic, preferably a MAX-phase carbide ceramic. The terminated via, wherein an inductor, a capacitor, or a resistor may be formed as an arcuate element around the circumference of the via contact pad. The terminated via, wherein all of the inductors, capacitors and resistors may be formed as arcuate elements around the circumference of the via contact pad. The terminated via, wherein an inductor, a capacitor, or a resistor may be electrically connected to the ground pad. The conducting element may form an electrical connection between the terminated via and other circuit elements in the surface layer. The conducting element may comprise a microstrip, stripline, or ground-cladded transmission line. The terminated via may be electrically connected to a radiating element. The radiating element may be a via stub. The radiating element may be a monopole antenna. The radiating element may be a dipole antenna element. The terminated via, wherein the dipole antenna element may be a half-wavelength dipole antenna element. The terminated via, wherein the radiating element may comprise a folded geometry. The terminated via, wherein the radiating element may be electrically small. The terminated via, wherein the radiating element may be an antenna array with a phasing system. The phasing system may comprise a phase-delayed conducting path. The phasing system may comprise phase-locked loop circuitry that independently tunes the phased output of the radiating element in the antenna array. The phasing system may further comprise a tunable element. The conducting element may be a ground-cladded dielectric waveguide or a slab dielectric waveguide. The surface layer may comprise a dielectric core further comprising high energy density dielectric. The surface layer may further comprise amorphous silica. The terminated via, wherein an inductive element is a tunable inductive element. The terminated via, wherein a resistor may further comprise a resistive element inserted between two electrical shorts in electrical communication with a via or a transmission line. The terminated via, wherein an inductor may be a planar inductor comprising a serpentine conducting element wound through a high permeability garnet electroceramic magnetic core inserted between two electrical shorts in electrical communication with via, electrical ground, or a transmission line. The composition of the perovskite electroceramic may be doped with ≤0.05 mol % of silicon dioxide that forms electrically insulating metal oxide phases at the nanoscale grain boundaries within the perovskite electroceramic to neutralize the formation of internal conductive pathways and dissipation currents within the capacitive dielectric material. The planar capacitor may comprise a first conducting element comprising a plurality of digits separated by a gap that contains high energy density capacitive dielectric from a second conducting element also comprising a plurality of digits that interleave the digits of the first conducting element. The first conducting element, the second conducting element and the high energy density dielectric may comprise an arcuate path around the circumference of the terminated via. The planar capacitor element may comprise high energy density dielectric inserted between two conducting elements. The two conducting elements and high energy density dielectric inserted between the two conducting elements may comprise an arcuate path around the circumference of the terminated via. The terminated via may be a thru via. The dielectric core may be a meta-material dielectric core.

BRIEF DESCRIPTION OF THE DRAWINGS

The present invention is illustratively shown and described in reference to the accompanying drawings, in which:

FIGS. 2A thru 2G, 2I and 2J depict the polarization mechanisms within perovskite electroceramics and a preferred microstructure that improve signal integrity in semiconductor chip stacks designed to operate at higher clock speeds.

FIGS. 4J thru 4P illustrate means to electrically connect various transmission line structures within a high-speed semiconductor chip stack.

FIGS. 5A thru 5G depict various features that are embedded within interfacing surface layers that are used to terminate electrical signal communications within a layer or between layers of the high speed semiconductor chip stack.

FIGS. 6A thru 6E depict various embodiments of a terminated via.

FIGS. 7A thru 7F illustrate means to form surface layers.

FIG. 9 is Table II showing the effects of high energy density capacitive dielectric materials.

DETAILED DESCRIPTION OF THE DRAWINGS

Figure 1A:
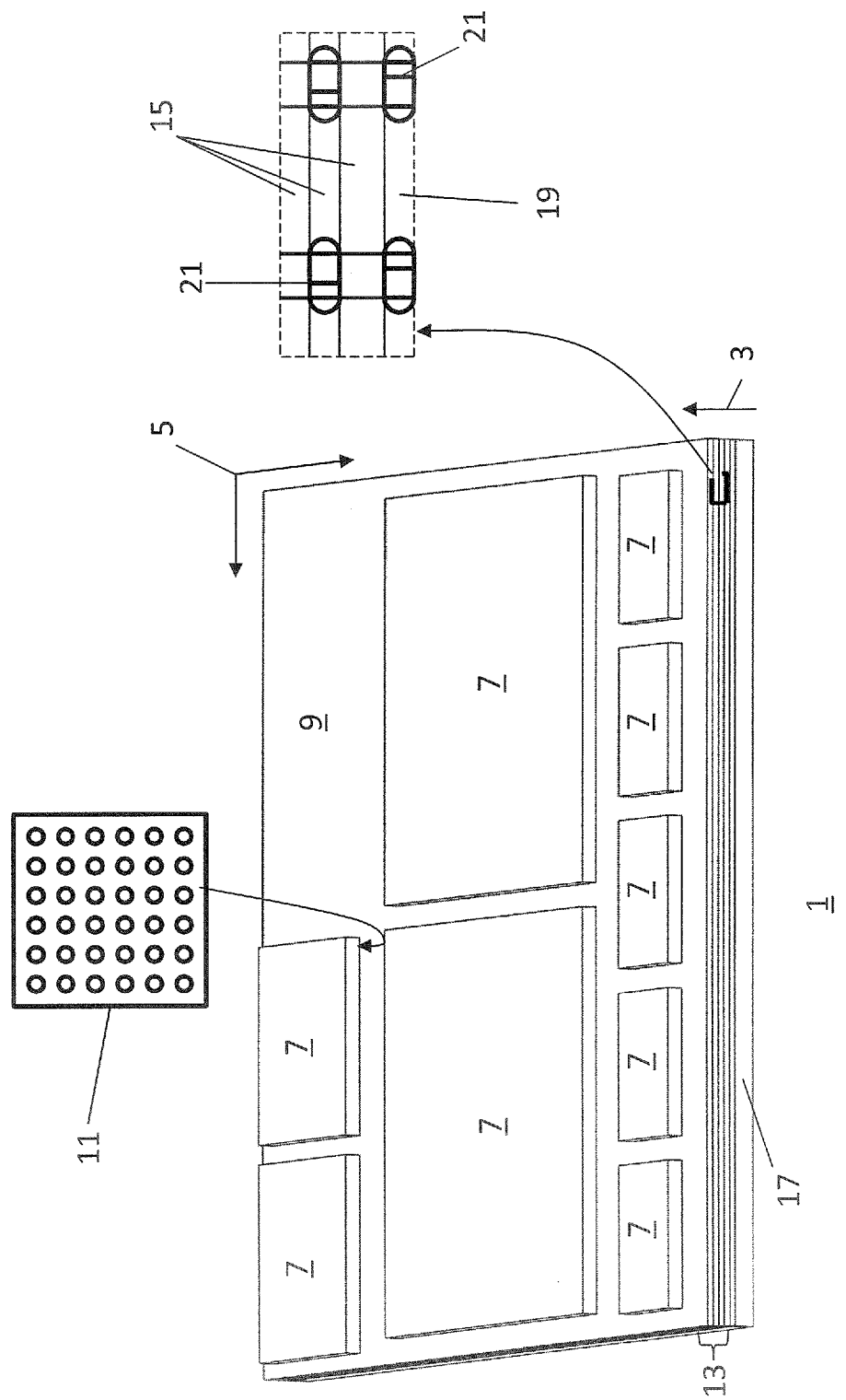
FIGS. 1A,1B depicts prior art relating to semiconductor chip stacking.
Figure 1B:
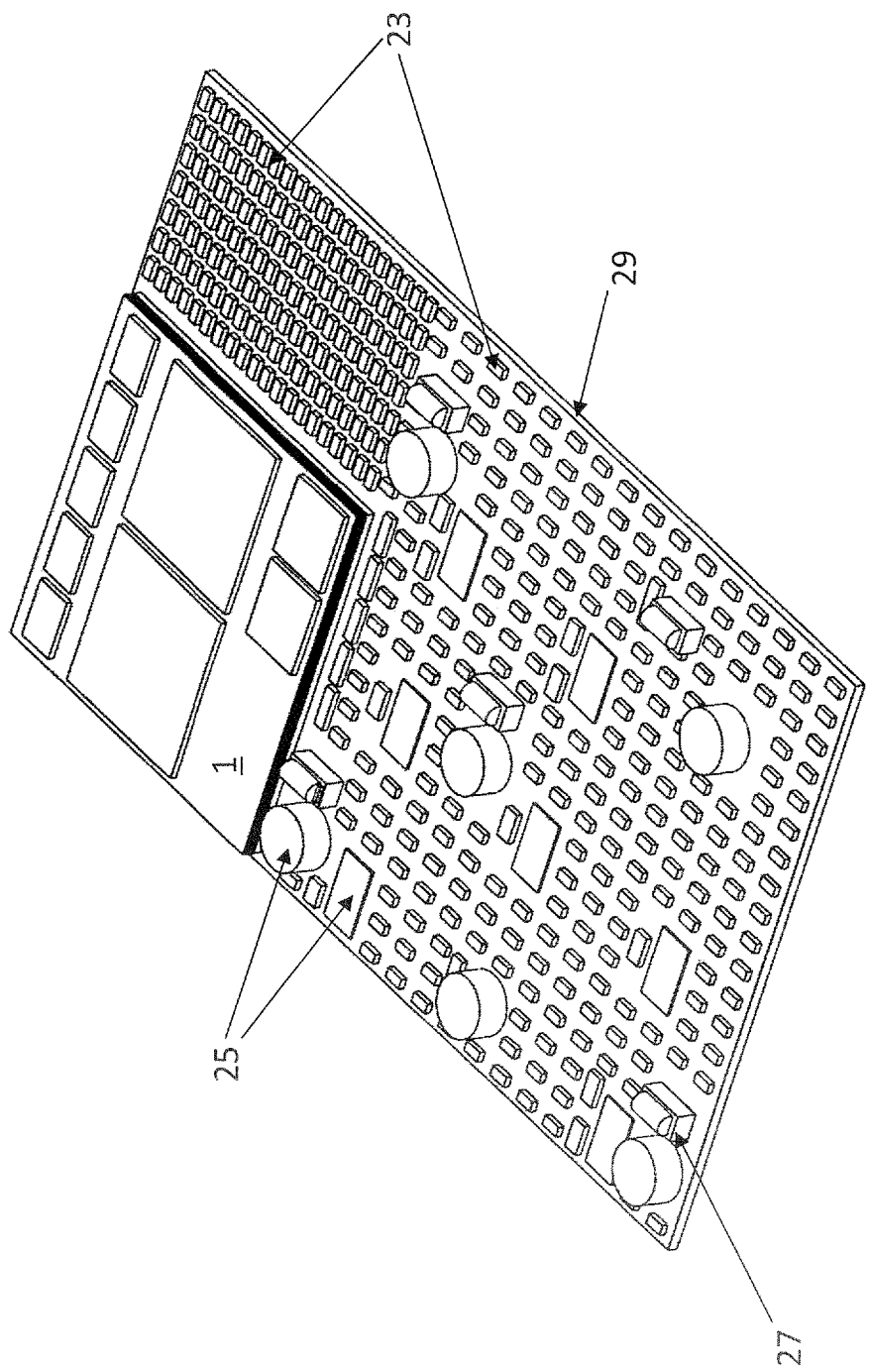

The present invention is illustratively described above in reference to the disclosed embodiments. Various modifications and changes may be made to the disclosed embodiments by persons skilled in the art without departing from the scope of the present invention as defined in the appended claims.

This application incorporates by reference all matter contained in de Rochemont U.S. Pat. No. 7,405,698 entitled "CERAMIC ANTENNA MODULE AND METHODS OF MANUFACTURE THEREOF" (the '698 application), de Rochemont U.S. Pat. No. 8,715,839 filed Jun. 30, 2006, entitled "ELECTRICAL COMPONENT AND METHOD OF MANUFACTURE" (the '839 application), U.S. Pat. No. 8,350,657 (the '657 application), filed Jan. 6, 2007 entitled "POWER MANAGEMENT MODULE AND METHODS OF MANUFACTURE", de Rochemont U.S. Ser. No. 14/560,935, (the '935 application), filed Dec. 4, 2014 entitled "POWER MANAGEMENT MODULE AND METHODS OF MANUFACTURE", de Rochemont and Kovacs, U.S. Pat. No. 8,715,814, "LIQUID CHEMICAL DEPOSITION PROCESS APPARATUS AND EMBODIMENTS", (the '814 application) and U.S. Pat. No. 8,354,294 (the '294 application), de Rochemont, "MONOLITHIC DC/DC POWER MANAGEMENT MODULE WITH SURFACE FET", U.S. Pat. No. 8,552,708 (the '708 application), de Rochemont, U.S. Pat. No. 8,749,054, "SEMICONDUCTOR CARRIER WITH VERTICAL POWER FET MODULE", (the '054 application), de Rochemont U.S. Pat. No. 9,023,493, "CHEMICALLY COMPLEX ABLATIVE MAX-PHASE MATERIAL AND METHOD OF MANUFACTURE", (the '493 application), de Rochemont U.S. Pat. Nos. 8,779,489 and 9,153,532, "POWER FET WITH A RESONANT TRANSISTOR GATE", (the '489 and '532 application), de Rochemont U.S. Pat. No. 9,123,768, "SEMICONDUCTOR CHIP CARRIERS WITH MONOLITHICALLY INTEGRATED QUANTUM DOT DEVICES AND METHOD OF MANUFACTURE THEREOF", (the '768 application), de Rochemont U.S. Pat. No. 8,952,858, "FREQUENCY-SELECTIVE DIPOLE ANTENNAS", (the '858 application), de Rochemont and Kovacs U.S. Pat. No. 9,348,385, "HYBRID COMPUTING MODULE" (the '385 application), and, de Rochemont, "FULLY INTEGRATED) THERMOELECTRIC DEVICES AND THEIR APPLICATION TO AEROSPACE DE-ICING SYSTEMS", U.S. Application No. 61/529,302 ('302).

The '698 application instructs on methods and embodiments that provide meta-material dielectrics, including artificial magnetic ground planes, that have dielectric inclusion(s) with performance values that remain stable as a function of operating temperature. This is achieved by controlling the dielectric inclusion(s)' microstructure to nanoscale dimensions less than or equal to 50 nm. de Rochemont '839 instructs the integration of passive components that hold performance values that remain stable with temperature in printed circuit boards, semiconductor chip packages, wafer-scale SoC die, and power management systems. de Rochemont '159 instructs on how LCD is applied to form passive filtering networks and quarter wave transformers in radio frequency or wireless applications that are integrated into a printed circuit board, ceramic package, or semiconductor component. de Rochemont '657 instructs methods to form an adaptive inductor coil that can be integrated into a printed circuit board, ceramic package, or semiconductor device. de Rochemont et al. '814 discloses the liquid chemical deposition (LCD) process and apparatus used to produce macroscopically large compositionally complex materials, that consist of a theoretically dense network of polycrystalline microstructures comprising uniformly distributed grains with maximum dimensions less than 50 nm. Complex materials are defined to include semiconductors, metals or super alloys, and metal oxide ceramics. de Rochemont '814 and '708 instruct on methods and embodiments related to a fully integrated low EMI, high power density inductor coil and/or high power density power management module. de Rochemont '489 and '532 instruct on methods to integrate a field effect transistor that switch arbitrarily large currents at arbitrarily high speeds with minimal On-resistance into a fully integrated silicon chip carrier. de Rochemont '768 instructs methods and embodiments to integrated semiconductor layers that produce a 3-dimensional electron gas within semiconductor chip carriers and monolithically integrated microelectronic modules. de Rochemont '302 instructs methods and embodiments to optimize thermoelectric device performance by integrating chemically complex semiconductor material having nanoscale microstructure. de Rochemont '858 instructs means to form a circuit resonant element by folding arms of dipole antenna or transmission line to induce inductive and capacitive loads through current vector coupling. The various embodiments and means claimed in the present application are constructed using liquid chemical deposition (LCD) methods instructed by de Rochemont et al. '814.

LCD methods permit the integration of high chemical complexity electroceramics on a buried microelectronic layer with the requisite chemical precision to make the finished product economically viable. It enables chemically complex electroceramics to be selectively deposited on a semiconductor surface at temperatures that do not damage embedded active circuitry. It further enables the integration of chemically complex electroceramics with atomic scale chemical uniformity and uniform microstructure, including microstructure that has nanoscale uniformity irrespective of electroceramic chemical complexity.

Figure 2A:
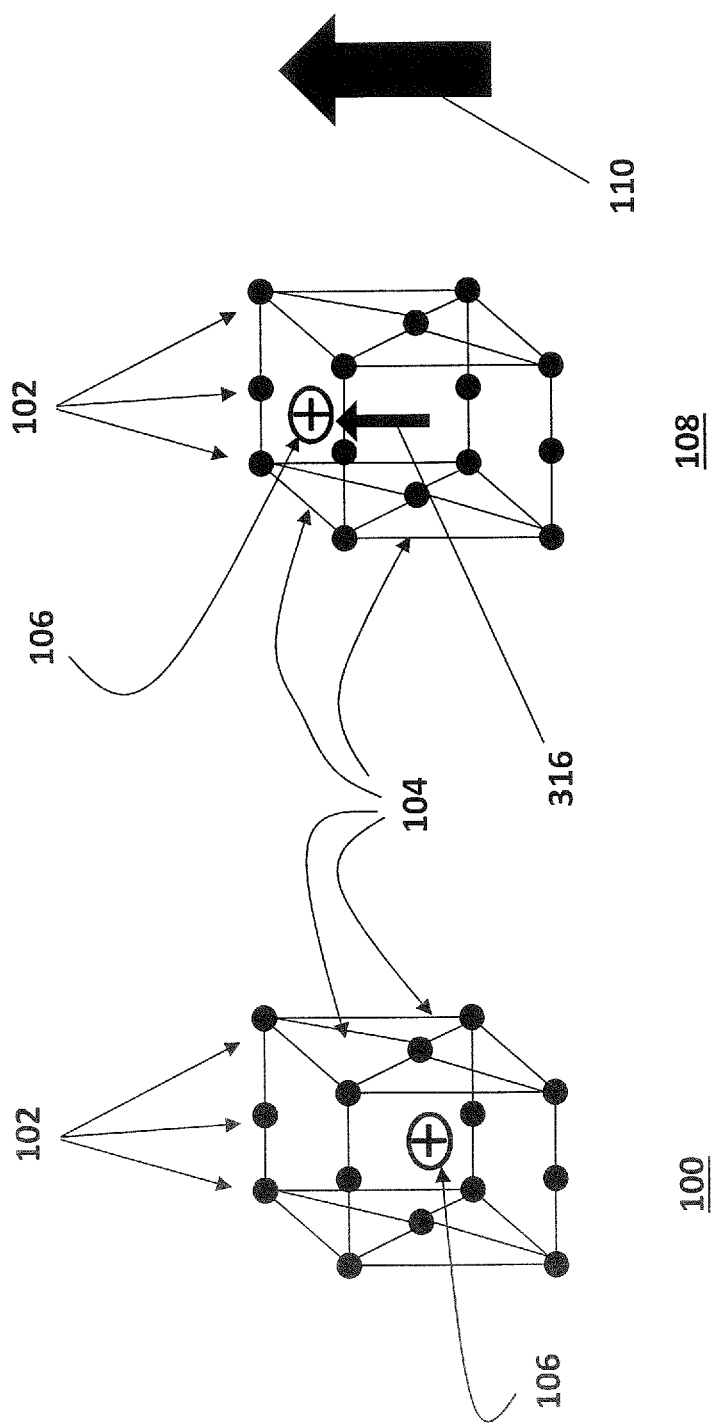
Figure 2B:
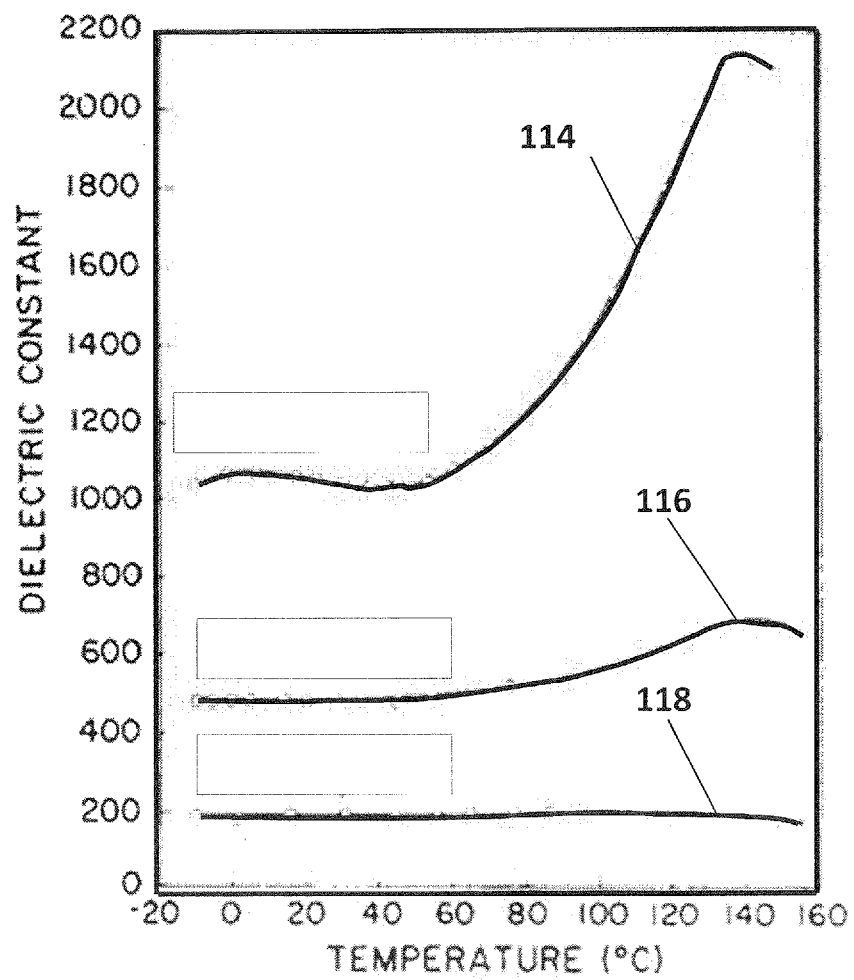
Figure 2D:
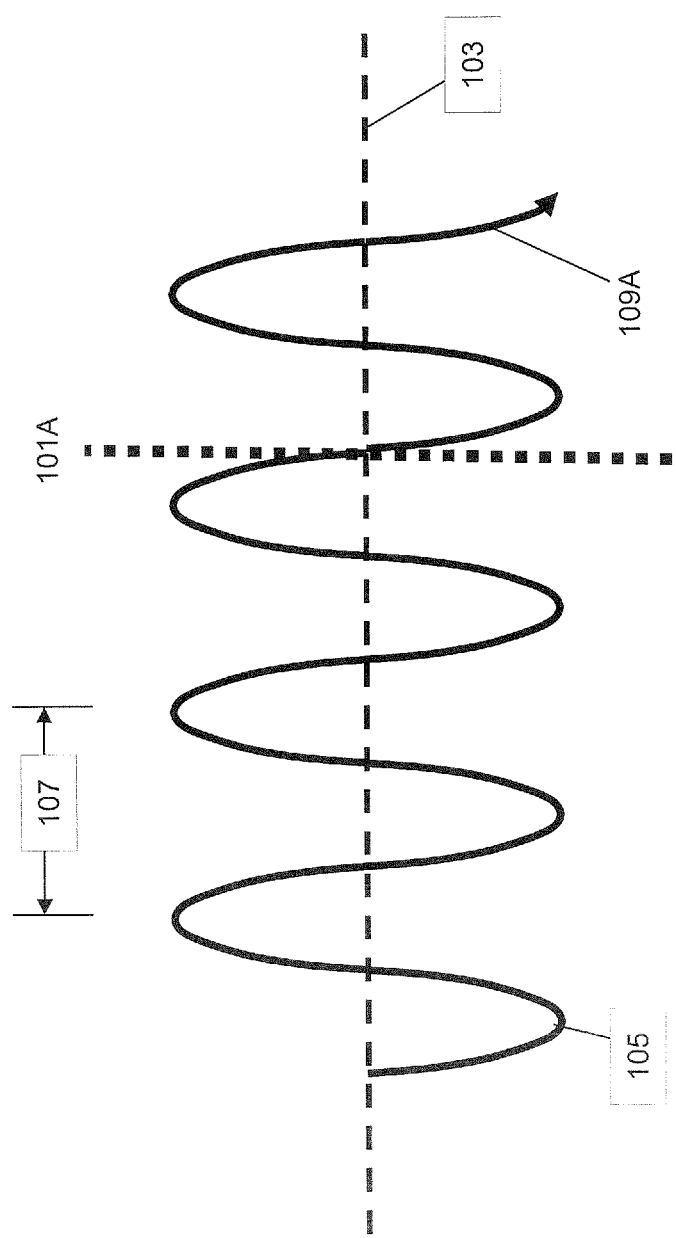
Figure 2E:
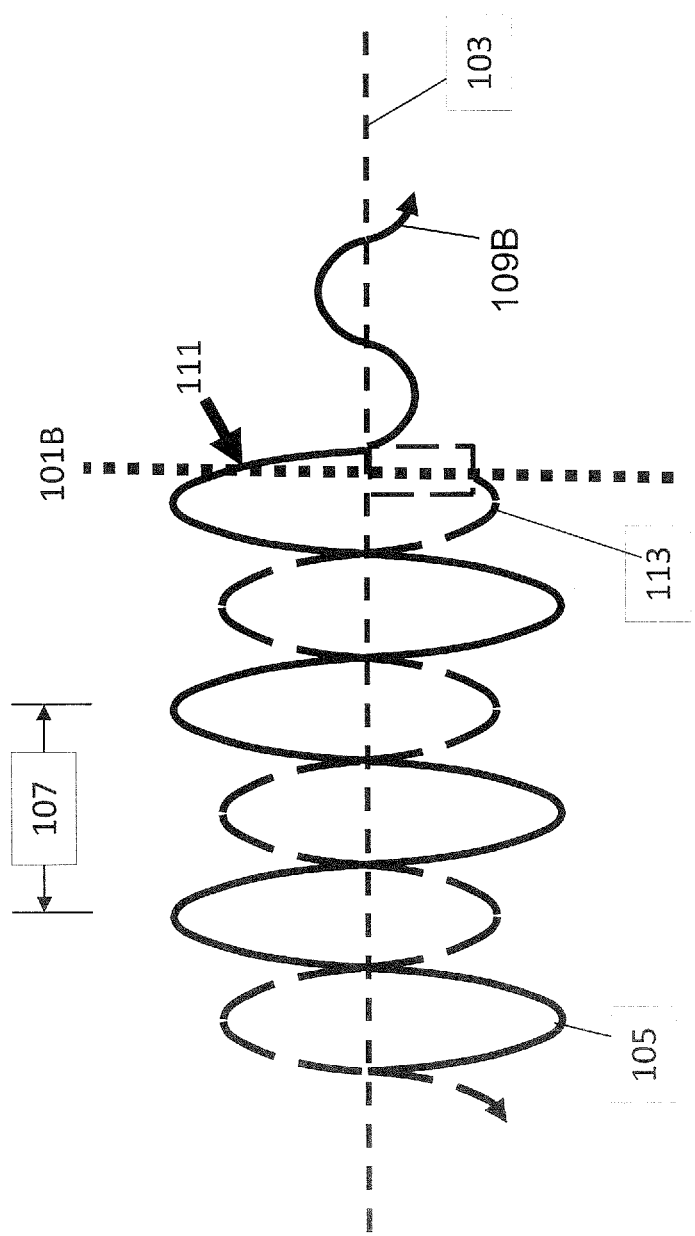
Figure 2F:
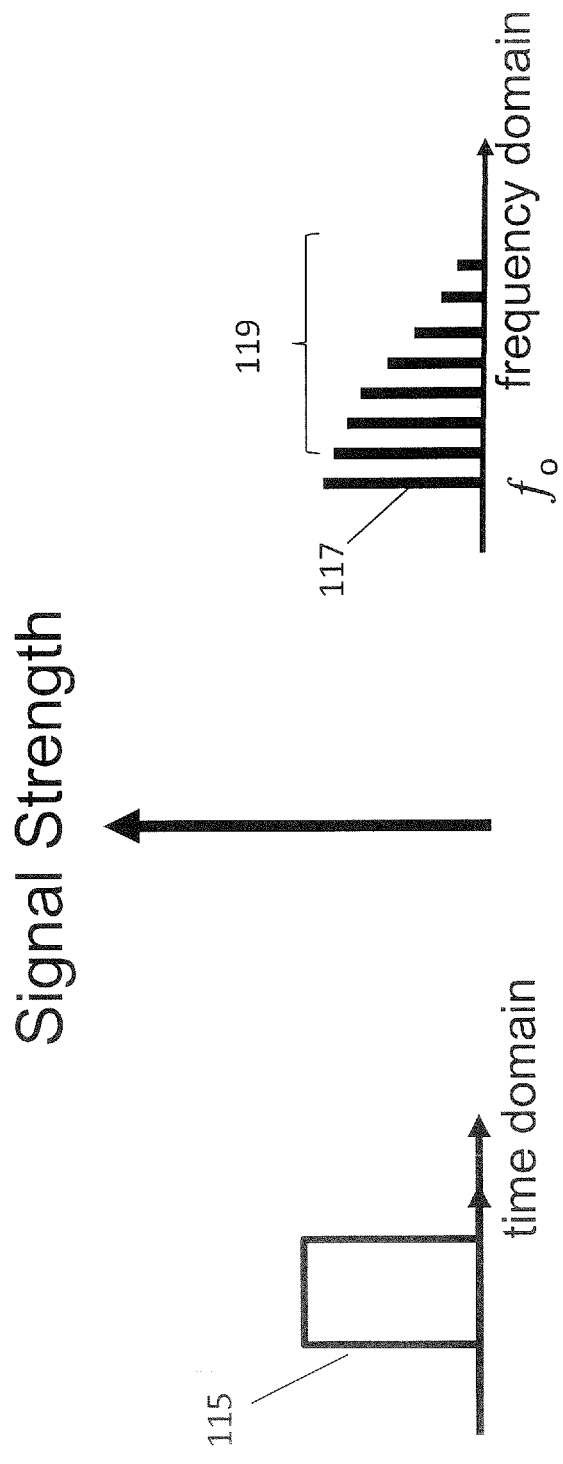
Figure 2G:
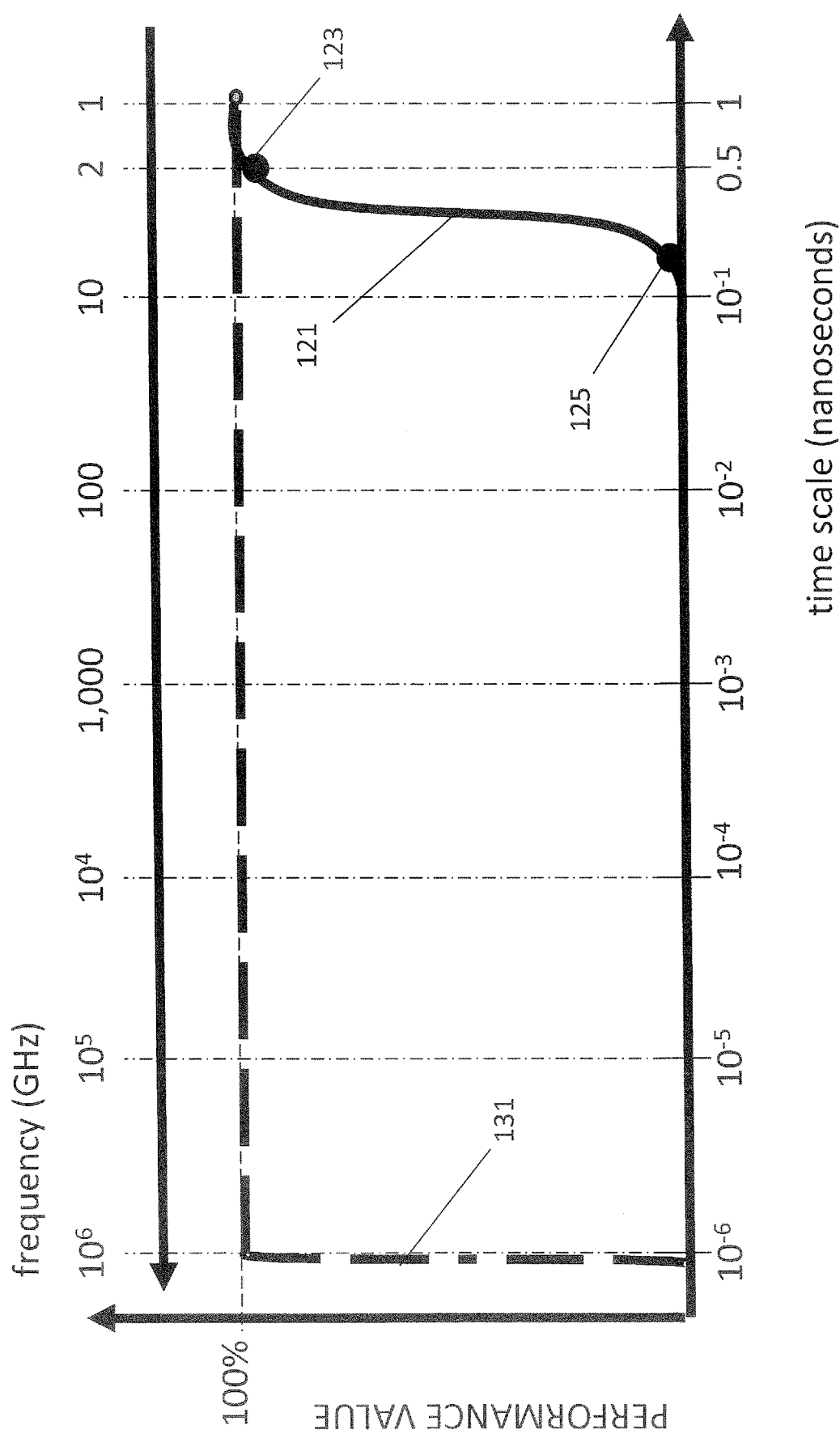
Figure 3A:
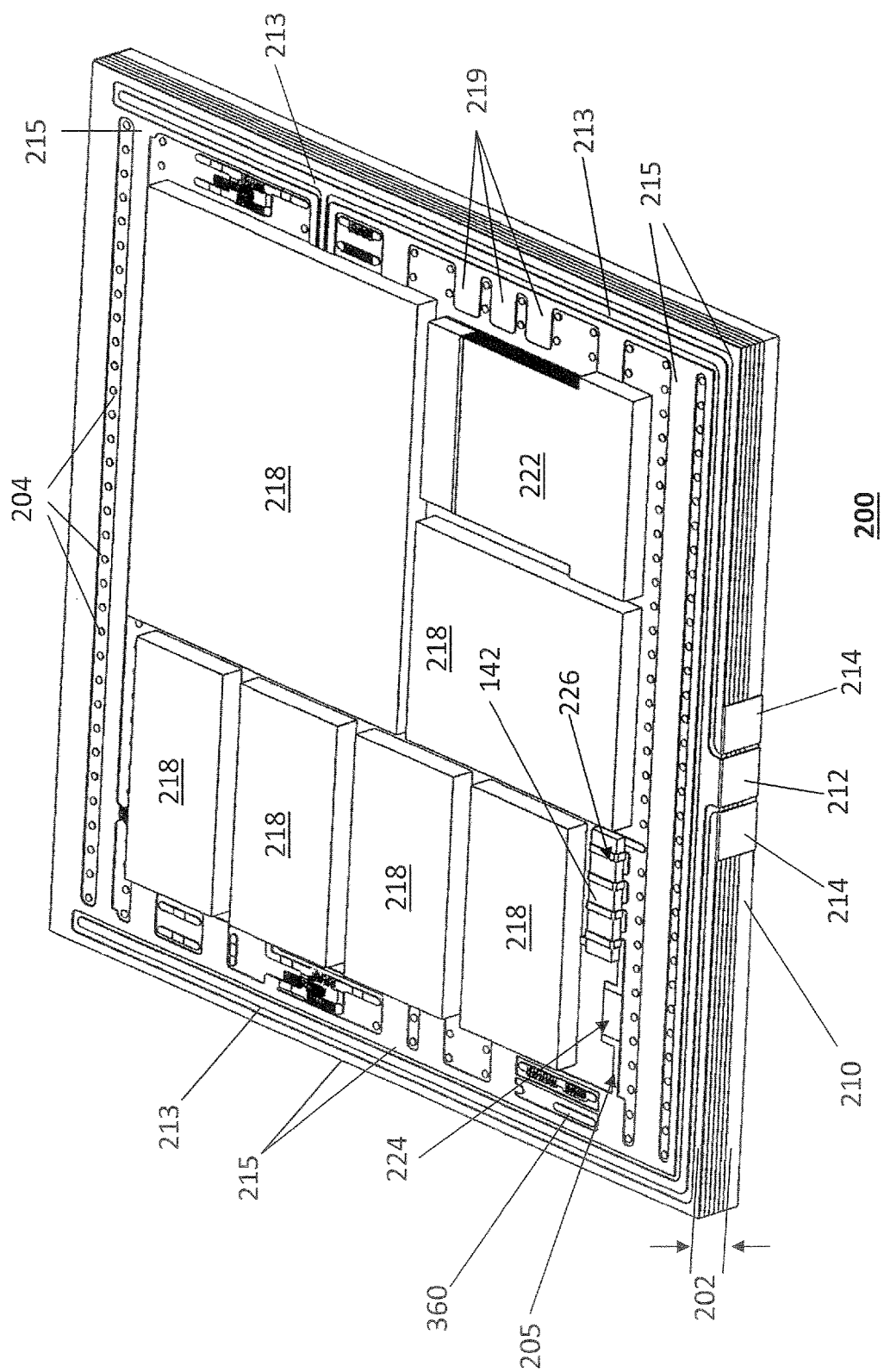
FIGS. 3A,3B,3C depict general features of a high speed semiconductor chip stack.

Reference is now made to FIGS. 2A,2B,2C,2D,2E,2F,2G to illustrate unique features of high energy density capacitive dielectrics produced using LCD methods that contribute to the improved operational performance of the high speed semiconductor chip stack 200. illustrated in FIG. 3A. Perovskite electroceramics form exceptional capacitive dielectrics with high relative permittivity, CR. FIG. 2A schematically depicts one mechanism of charge polarization within perovskite electroceramics. The unpolarized state 100 of a perovskite electroceramic crystal wherein rigidly fixed cations and anions 102 are covalently bonded at well-ordered and regularly repeating positions within a crystalline lattice 104. Perovskite electroceramics also comprise mobile cations 106 that hold a neutral position within the crystalline lattice 104 in its unpolarized state 100 that is balanced by purely ionic electrostatic forces between its positive charge and the excess negative charges distributed among rigidly fixed cations and anions 102 within the crystalline lattice 104. Perovskite electroceramics form a polarized state by the application of an external electric field 110, which causes the mobile cations 106 to undergo a physical displacement 112 within the crystalline lattice 102. The physical displacement 112 of the mobile cations' 106 positive charge is the mechanism whereby which electrical energy is stored because the mobile cations 106 will return to its neutral position within the unpolarized state 100 once the external electric field 110 is removed.

The physical displacement 112 is not instantaneous. It will have a polarization time, $\tau_{polarization}$, which is a function of the electroceramics' chemistry. $\tau_{polarization}$ will range between microsecond and nanosecond timescales. This phase delay introduces power loss and signal distortions to the electrical system. The physical displacement 112 also mechanically distorts the crystalline lattice that generates internal strain and will stress adjacent material layers with which the perovskite electroceramic is embedded within an integrated structure, such as the multilayer storage capacitor 100. This stress can cause thermomechanical fatigue within the component layers of the multi layer storage capacitor 100 over time. The long polarization times, $\tau_{polarization}$, also distort the phase of signals traveling through the dielectric as it becomes impossible to preserve signal integrity when the signal is modulated faster than the polarization (depolarization) time, $\tau_{polarization}$ of the dielectric. Dielectric materials having a polarization response time on the order of 1 μsec ($10^{-6}$ seconds) would introduce phase distortions and associated power loss to signals operating above 1 MHz ($10^6$ cycles per second). Similarly, dielectric materials having a polarization response time on the order of 1 nsec ($10^{-9}$ seconds) would introduce phase distortions and associated power loss to signals operating above 1 GHz ($10^9$ cycles per second). As will be shown in further detail below, these phase and power distortions to the higher order harmonic frequencies that form the pulse shape of clocking signals operating in the GHz frequency spectrum ultimately induce the ringing that cuts off higher speed system performance. This is a consideration for using titanium oxide ($TiO_2$) layers in chip stack assemblies. It has moderately high relative permittivity, $\varepsilon_R=70$, to improve impedance matching, but does not have mobile cations 106 that contribute slow (μsec to nsec) polarization response times, $\tau_{polarization}$.

FIGS. 2B,2C illustrate how the physical displacement 112 is a function of the grain size of chemically complex perovskite electroceramics and that the nanoscale control over grain size and grain chemistry enabled by LCD manufacturing methods can be used to eliminate thermomechanical fatigue, power losses, and phase distortions attributable to the physical displacement 112 of mobile cations 106. FIG. 2B illustrates the dielectric constant of barium titanate ($BaTiO_3$) perovskite electroceramic as a function of temperature when the electroceramic has uniform grain size of 200 nm 114, 100 nm 116, and 34 nm 118. As shown in FIG. 2B, barium titanate electroceramic has a substantially higher dielectric constant than titanium oxide. In barium titanate, or any perovskite electroceramic containing mobile cations 106, orbital deformation, illustrated in FIG. 2C, of the rigidly fixed cations and anions 102 that are held within the crystalline lattice 104 are the sole polarization mechanism contributing to the electroceramic dielectric constant when the electroceramic grain size is constrained to dimensions less than 50 nm 118. The unpolarized state of rigidly fixed cations and anions 120 comprises a positively charge nucleus 122 surrounded by a balanced orbital electron cloud 124 having offsetting negative charge that neutralizes the positively charge nucleus 122 and produces no net polarization. The polarized state of rigidly fixed cations and anions 126 is produced by the application of an applied external electric field 128 that induces a deformed orbital electron cloud 130. The charge displacement induced by the deformed orbital electron cloud 130 generates internal atomic polarization components 132A,132B between the net positive charges of the exposed nucleus 134 of the rigidly fixed cations and anions 120 and the unbalanced negative charge in the deformed orbital electron cloud 130. The internal atomic polarization components 132A,132B have polarization and relaxation rates that fully respond on femtosecond ($10^{-15}$ second) timescales.

The physical displacement 112 of mobile cations 106 is generated by cooperative internal electric fields that are only strong enough to displace the mobile cations 106 and overcome the mechanical inertia that resists the deformation of the crystalline lattice 104 when the electroceramic grain size is greater than 50 nm. As explained below, a specific objective of the present invention minimizes signal distortion, power loss to embed high energy density dielectric layers 300 that comprise perovskite electroceramic having uniform grain chemistry and grain size less than 50 nm within a high speed semiconductor chip stack 200.

As is self-evident from FIG. 2C, internal atomic polarization components 132A,132B are proportional to the number of electrons within the deformed orbital electron cloud 130 and the net positive charges of the exposed nucleus 134. Since number of orbital electrons and protons contributing positive charge to the atomic nuclei of the rigidly fixed cations and anions 106 directly correspond to their atomic mass unit (amu), it is a preferred embodiment of the present invention to construct a high speed semiconductor chip stack 200 that incorporates high energy density dielectric layers 300 wherein the average amu within the crystalline lattice 104 is greater than 25 amu, preferably greater than 50 amu. LCD manufacturing methods permit the reliable fabrication of dielectric layers having high chemical complexity comprising three or more metal oxide components. High average amu leads to higher relative permittivity, $\varepsilon_R$. It is a specific preferred embodiment for the high speed semiconductor chip stack to comprise high energy density capacitive dielectrics that have femtosecond polarization response times and a relative permittivity that is greater than 70, but preferably in the range of $200 \leq \varepsilon_R \leq 800$.

The basic stoichiometry of titanate perovskite electroceramics is given by the formula equation:

$$M^{(I)}{}_{(1-x-y-z)}M^{(II)}{}_{(x)}M^{(III)}{}_{(y)}M^{(IV)}{}_{(z)}Zr_{(1-a-b)}Hf_{(b)}Ti_{(a)}O_3 \quad (1a)$$

where $M^{(I)}$, $M^{(II)}$, $M^{(III)}$, $M^{(IV)}$ are additional metal oxide components that form a thermodynamically stable perovskite crystal and x, y, and z, are fractional molar percentages forming ratios such that the sum of all $M^{(I)}$, $M^{(II)}$, $M^{(III)}$, $M^{(IV)}$ elemental components satisfies the constraint:

$$(1-x-y-z)+(x+y+z)=1 \quad (1b)$$

And, $$(1-a-b)+(a+b)=1 \quad (1c)$$

The same general relationship for titanate (Ti-containing), zirconate (Zr-containing), hafnate (Hf-containing) electroceramics applies to niobate and tantalate electroceramics, which are implicitly claimed by the present invention. Crystal lattices with higher average amu is achieved by incorporating higher amu elements into the perovskite chemical formula. It is therefore a specific embodiment of the application to claim high energy density capacitive dielectric layers 300 that comprise a perovskite electroceramic that includes three or more metal oxide components that further comprise an admixture of three (3) or more of the elements listed in Table I.

TABLE I

| Transition Metal Elements | | | | | | | | | | | |
|---|---|---|---|---|---|---|---|---|---|---|---|
| Symbol | Sc | Ti | V | Cr | Mn | Zn | Zr | Nb | Mo | Hf | Ta | W |
| amu | 21 | 22 | 41 | 42 | 25 | 30 | 40 | 41 | 42 | 72 | 73 | 74 |
| Lanthanide Metal Elements | | | | | | | | | | | |
| Symbol | La | Ce | Pr | Nd | Sm | Eu | Gd | Tb | Dy | Ho | Yb |
| amu | 57 | 58 | 59 | 60 | 62 | 63 | 64 | 64 | 66 | 67 | 70 |
| Post Transition Metal Elements | | | | | | | | | | | |
| Symbol | In | Sn | Pb | Bi |
| amu | 49 | 50 | 82 | 83 |

Reference is now made to FIGS. 2D,2E,2F&2G to illustrate the improved signal integrity at higher clock speed frequencies enabled by the present invention. Passive components are frequently required to terminate signals at electrical discontinuities in the transmission line carrying the signal. An electrical discontinuity 101A,101B will typically comprise a bend in the transmission line path 103, or a change in the physical materials forming the transmission line path 103. In semiconductor chip stacks, electrical discontinuities are most prevalent at vias 204 that route a signal from a planar transmission line 205 to a vertical path towards another chip or interposer in the stack. A signal 105 is transmitted at a characteristic clock speed operating at a frequency having a specific electromagnetic wavelength 107. Since electromagnetic power is reflected at electrical discontinuities, a properly terminated discontinuity 101A is positioned at a point along the transmission line path 103 that causes the amplitude of the signal 105 to have a null value at the electrical discontinuity. In this instance, there is no signal power reflected back to the signal source and the transmitted signal 109A carries the full signal power.

As illustrated in FIG. 2E, an improperly terminated discontinuity 101B is positioned at a point along the transmission line path 103 where the amplitude of the signal 105 has non-zero value 111 at the discontinuity. In this instance, reflected signal power 113 is reflected back to the signal source in proportion to the signal amplitude at the improperly terminated discontinuity 101B and the strength of the discontinuity's reflection coefficient. This results in an attenuated transmitted signal 109B and a process known as "ringing" in the circuit as the reflected signal power destructively interferes with the signal 105. In many instances it is not possible to position a discontinuity to properly terminate a transmission line. In these cases, passive components positioned at an improperly terminated discontinuity 101B as an impedance matching network to neutralize the reflected signal power 113 and to maximize the power of the signal transmitted through the discontinuity.

As illustrated in FIG. 2F, a digital pulse 115 transmitted at a fundamental clock speed is shaped though a wave packet that comprises an electromagnetic wave 107 corresponding to the fundamental clock speed frequency $f_o$ 117 and harmonic frequency components 119 of the fundamental clock speed frequency $f_o$ 117. The pulse shaping harmonic frequency components 117 must have the precise amplitude values needed to constructively and destructively interfere with each other and the fundamental clock speed frequency $f_o$ to shape the digital pulse 115.

FIG. 2G illustrate how nanosecond polarization response times nanosecond compromise higher system-level operational clock speeds. Semiconductor technology nodes represent the chip-level integration densities and defined by the minimum feature size of a transistor. Transistor switching speeds are limited by gate capacitance, so smaller feature size corresponds with increasing integrated circuit ("IC") clock speed. Semiconductor fabrication at current technology nodes allow an IC chip to perform at 20 GHz clock speeds when tested at the wafer scale. However, operational system clock speeds are throttled down to 2.5 GHz-3.4 GHz when the chips are connected to a printed circuit board, and to 7 GHz-7.5 GHz when assembled into a chip stack. In each instance, the semiconductor die are connected to impedance matching networks comprising passive components having dielectric media with polarization response times limited to nanosecond time scales.

FIG. 2G illustrates characteristic polarization response curves as a function of time (bottom horizontal axis) and frequency (top horizontal axis). The performance value of a passive component is mapped as the vertical axis, with 100% representing the performance value needed for the passive component to neutralize any reflected signals and ringing at discontinuity. A capacitive dielectric having a 1 nanosecond polarization response time is charted as curve 121. As illustrated, the first harmonic component at 2 GHz 123 will likely have a diminished performance, but still operate at a value close enough to mitigate signal reflection of that harmonic component. However, as depicted by curve 121 the drop in the performance value for other higher harmonic frequency components 117, for instance 4 GHz and at 8 GHz 125 is so precipitous that the impedance matching network fails to neutralize the signal reflections at these frequencies. As illustrated in FIG. 2I, the net result on a digital pulse 115 passing through a discontinuity terminated with passive components comprising dielectric media having a polarization response that is similar to 121 will be distortion 127 of the higher frequency harmonic components 119 that results in an unreadable pulse 129 when the system is driven at higher frequency clock speeds $f_o$ 117.

By contrast, dielectric media comprising a microstructure that limit the polarization response 132A,132B to femtosecond time scales will have a polarization response representative of curve 131, which holds performance stable out close to the PetaHertz (PHz) frequency domain ($10^6$ GHz). Impedance matching networks comprising dielectric media with this improved higher frequency performance improve the signal integrity of digital pulses operating above the intrinsic clock speeds of modern semiconductor die. The improved higher frequency signal integrity in chip stack assemblies driven higher clock speeds improves optical and wireless telecommunications signaling bandwidths. An aspect of this invention claims a high-speed semiconductor chip stack that operates with an operational system clock speed that optimally matches the intrinsic clock speed of the slowest semiconductor die in the chip stack. Additional embodiments of this invention include claims to a high speed semiconductor chip stack 200 that further comprises embedded semiconductor die 218 or 208 that function in an optical telecommunications or electro-optic capacity, or a component of a wireless transmitter, wireless receiver, or wireless transceiver circuit module.

Reference is now made to FIG. 2J to illustrate means to minimize dissipation currents that will introduce power loss and short the multilayer storage capacitor, especially when the thickness d of the high energy density dielectric layer 300 is extremely thin (≤100 nm). Often impurities that are introduced during electroceramic processing will form conductive oxides that are not thermodynamically compatible with the electroceramic crystalline lattice 104. These conductive metal oxide species will migrate from the electroceramic grain core 136 to the electroceramic grain boundaries 138 during processing and form conductive pathways 140 that generate dissipation currents and power loss. Therefore, a particular aspect of the invention dopes the electroceramic composition described by equation (1) with small amounts (≤0.05 mol %) of silicon dioxide ($SiO_2$) that will migrate with conductive metal oxide species from the grain core 136 and into the grain boundaries 138 to form electrically insulating metal oxide phases that resist dissipation currents and neutralize the formation of internal conductive pathways 140.

The integration of ultra-low loss, high magnetic permeability ($\mu_r \geq 10$) magnetic cores within inductive elements 226 claimed by the application is a specific embodiment of the invention. Garnets are the preferred magnetic core material at GHz frequencies within a high speed semiconductor chip stack 200. Garnets adopt either rhombic dodecahedron or trapezohedron crystal structures, or a combination of the two, and have the following chemical formula:

$$A_3B_2(SiO_4)_3 \qquad (2)$$

Where Group A metal oxides have equal molar concentration to silicon oxide and group B metal oxides have molar concentration that is ⅔ the molar concentration of silicon oxide. Group A metal oxides preferred for use in high permeability garnet electroceramics include: calcium oxide (CaO), magnesium oxide (MgO), iron oxide (FeO), and manganese oxide (MnO). Group B metal oxides preferred for use in high permeability garnet electroceramics include: aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). Optimal compositions for high permeability garnet electroceramics comprise admixtures of Group A and/or Group B metal oxides. It is preferred embodiment of the present invention that the high permeability garnet magnetic cores 142 integrated in a high-speed semiconductor chip stack 200 have controlled microstructure with grain size ranging from 10 nm to 25 µm, preferably from 250 nm to 5 µm. Improved magnetic coupling can be achieved if the garnet magnetic core 142 further comprises an ultra-loss "air gap" material (not shown for clarity) in immediate contact with an inductive winding, preferably an amorphous silica air gap material integrated within the magnetic core using LCD methods. Eddy current power losses can be further reduced when the garnet magnetic core 142 further comprises one or more internal layers with layer thickness measuring 1-10 nm (not shown for clarity) of ultra-low loss material, preferably amorphous silica, within the magnetic core body.

Figure 3B:
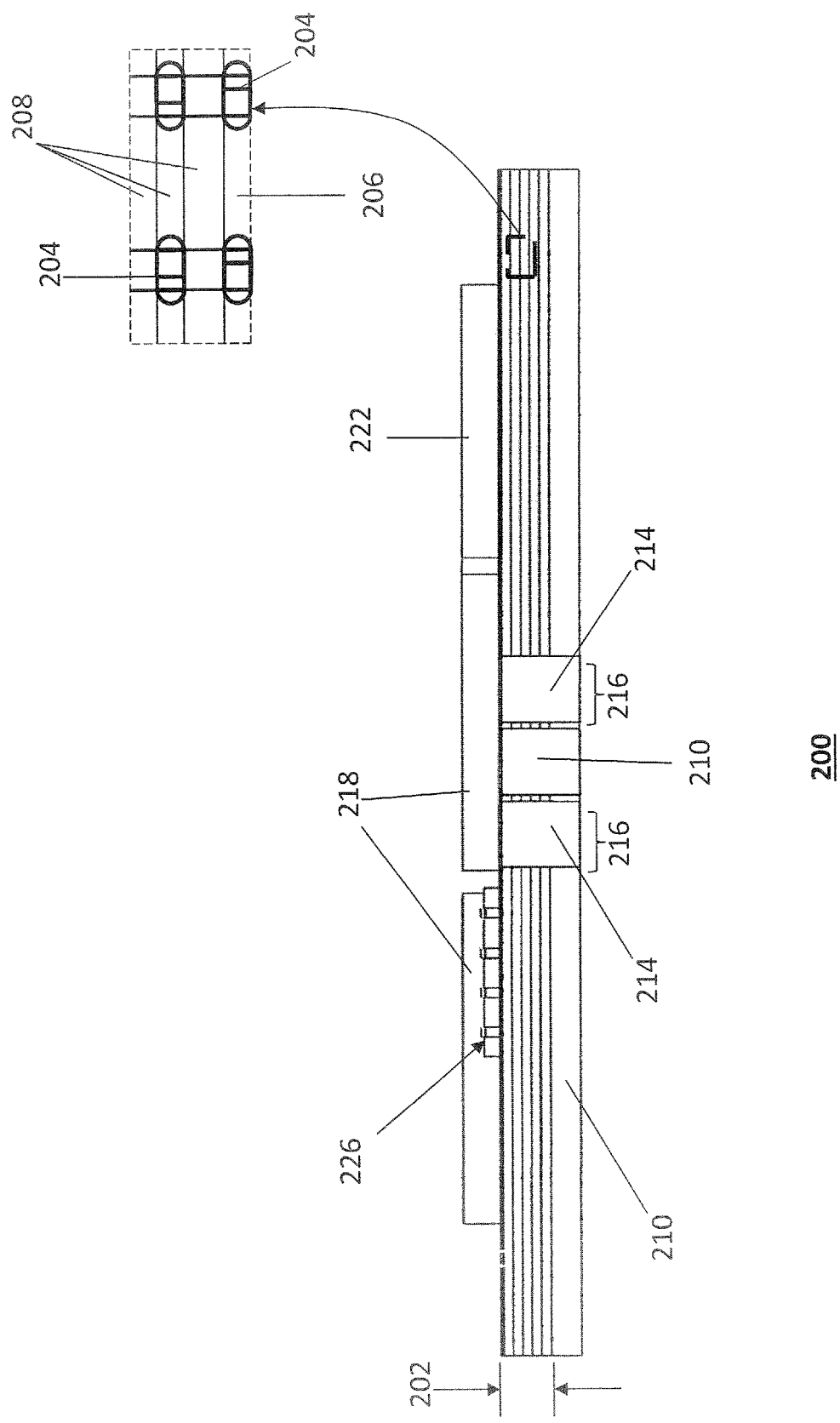
Figure 3C:
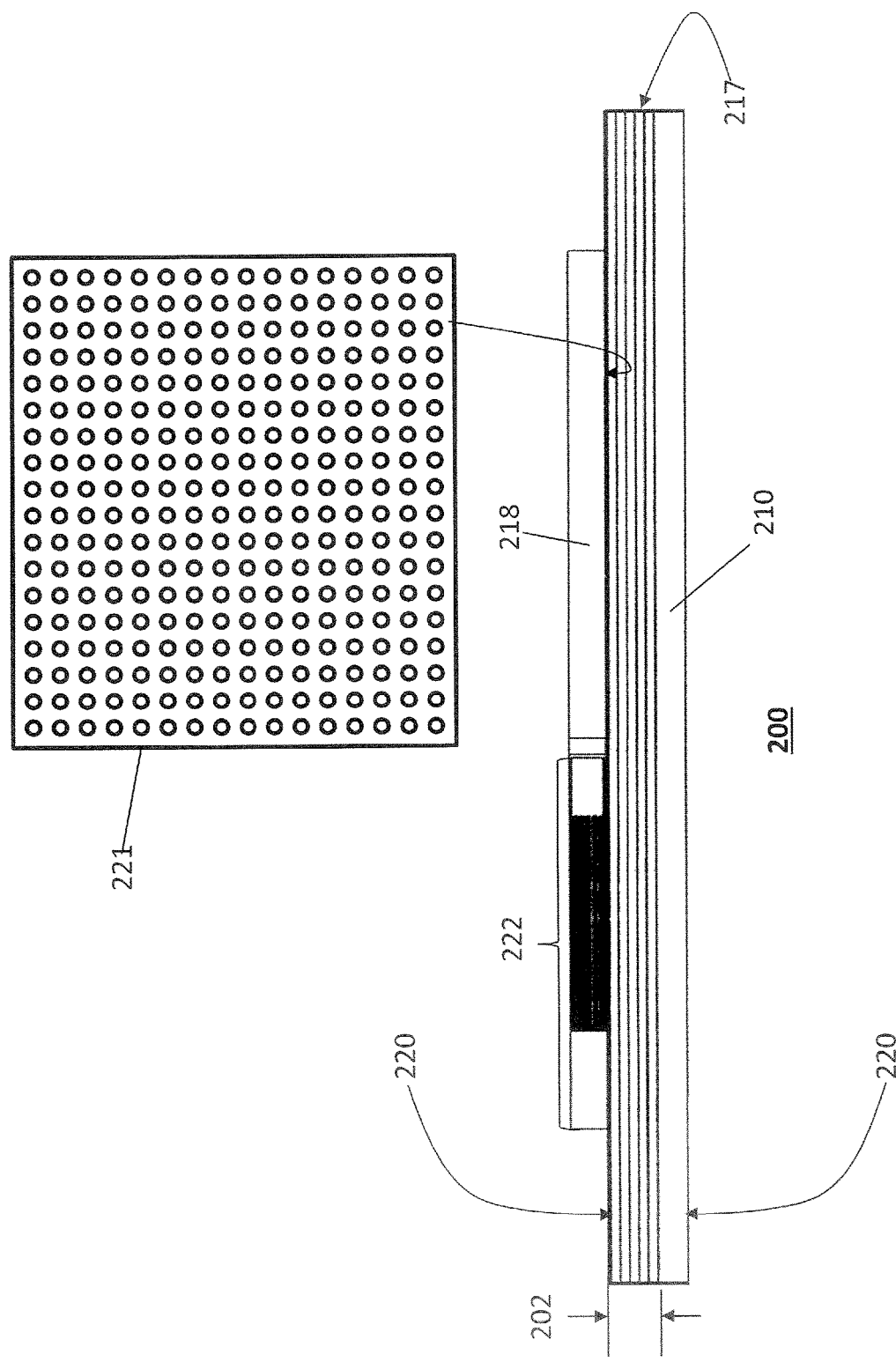

Reference is now made to FIGS. 3A,3B,3C to illustrate general features of a high speed semiconductor chip stack 200 claimed by the present invention. The high speed semiconductor chip stack 200 comprises a stack of waferbonded chips, preferably thinned wafer-bonded chips, 202 that are electrically interconnected using vertical interconnections or vias 204 that make electrical interconnections between components on different layers of the chip stack 200. The stack of wafer-bonded chips 202 may comprise interposers 206, a sensor chip 207, preferably comprising one or more micro-electromechanical sensor (MEMS) devices, or semiconductor die 208 and may optionally be mounted on a thicker base substrate 210 that may comprise a semiconductor carrier or an electrical interconnect. Each chip in the stack of wafer-bonded chips 202 will have various surface features comprising one or more embedded physical layers further comprising perovskite electroceramic that functions as capacitive elements 222, preferably as high energy density capacitive elements, that are described in greater detail below. The various surface features may also comprise physical layers structured to function as resistors 224 or inductive elements 226. In order to operate at higher system clock speeds, as detailed above, it is preferred that the physical layers forming a capacitor 222 include a perovskite electroceramic wherein atomic orbital deformations constitute the sole mechanism to the dielectric's polarization response. Similarly, it is preferred that physical layers forming the inductive elements comprise garnet electroceramic.

The high-speed semiconductor chip stack 200 may also comprise a sidewall power plane 212 that electrically connects to a planar power plane on 213 the surface of any semiconductor die 208 or interposer 206 in the stack of wafer bonded chips 202. The grounding planes and power planes for any semiconductor die, interposer, or sensor chip may also be electrically connected internally within the chip stack through vias. The high-speed semiconductor chip stack 200 may also comprise a sidewall ground plane 214 that covers portions 216 of one or more sides of the high-speed semiconductor chip stack 200. It is a preferred embodiment of the application that the sidewall power plane 212 be located between two side sidewall ground planes 214 that are symmetrically placed adjacent to the sidewall power plane 212. The sidewall ground plane may also cover the entire side 217 of one or more sides of the high speed semiconductor chip stack 200. The sidewall ground plane 214 electrically connects to a planar ground plane 215 on the surface of any semiconductor die 208, sensor chip 207, or interposer 206 in the stack of wafer bonded chips 202. It is a preferred embodiment of the application that the planar power plane 213 be located between two side planar ground planes 215 that are symmetrically placed adjacent to the planar power plane 213. Ground planes may also be in electrical communication with grounding pads 219. Grounding pads 219 may make additional electrical contact with vias to route electrical ground to specific locations on other electrical layers within the high-speed semiconductor chip stack.

The high-speed semiconductor chip stack 200 may optionally include surface bonded semiconductor die 218 that are die-to-wafer bonded to a major surface 220 of the high speed semiconductor chip stack 200. The surface bonded die are electrically connected to an array of contact pads 221 formed on or formed within the interposer 206 or semiconductor die 208 positioned at the top of chip stack 200. Furthermore, the surface mounted semiconductor die 218 may alternatively include a plurality of semiconductor die that are bonded as a stacked assembly, preferably as a high-speed semiconductor chip stack 200. The major surface 220 at the top of the chip stack may additionally include passive components fabricated using LCD methods that are formed on or bonded to the major surface 220. The passive components may comprise one or more decoupling, frequency filtering or tuning capacitive elements 222, resistors 224, and inductive elements 226. and are electrically interconnected to the high speed semiconductor chip stack through vias 204 or transmission lines 205 on the major surface. In general, these passive components will protrude from the major surface 220 at the top of the chip stack. It is a preferred embodiment that the capacitive elements 222 comprise one or more high energy density dielectric layers 300 wherein the average amu within the crystalline lattice 104 is greater than 25 amu, preferably greater than 50 amu, and the high energy density dielectric layer 300 comprises nanoscale microstructure 118 that fully polarizes and depolarizes with femtosecond response times. It is an additional preferred embodiment that the magnetic cores of the inductor coils 226 comprise a garnet electroceramic magnetic core 142. The resistive material in the resistor 224 may either comprise a metal, an alloy, superalloy or a resistive electroceramic.

Reference is now made to FIGS. 4A thru 4H to illustrate embodiments in which high energy density dielectric 300 layers are applied to the construction of a high speed semiconductor chip stack 200. For the purposes of the application, any and all references to a high energy density dielectric 300 refers to an insulating material layer having a relative permittivity in the range of $200 \leq \varepsilon_R \leq 800$ that remains stable over standard operating temperatures, has a polarization response, $\tau_{polarization}$, on the order of femtoseconds, and uniform grain size ≤50 nm with boundary materials comprising insulating phases of silicon oxide as illustrated in FIGS. 2B,2C,&2D.

Capacitive dielectrics are used as a temporary reservoir of stored electromagnetic energy. A simple capacitor will have store and release charge at a rate governed by its RC constant (internal resistance (R)×capacitance (C)), but the stored energy cannot be modulated faster than $\tau_{polarization}$ even if the RC constant is less than $\tau_{polarization}$. In these instances, the slower polarization rates will introduce distortions and power loss to the modulated signal.

Figure 4A:
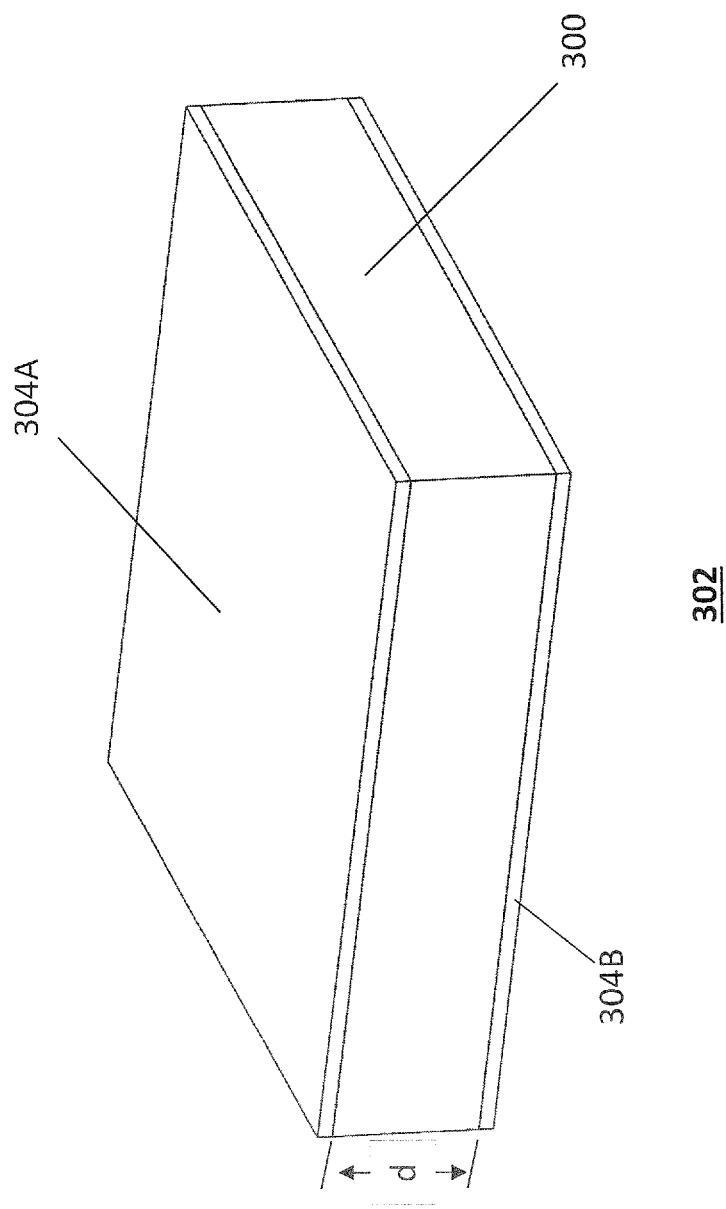
FIGS. 4A,4B depict the use of high energy density dielectrics in capacitive applications.

FIG. 4A depicts a single layer parallel plate capacitor 302 comprising a high energy density capacitive layer 350, comprising high energy density dielectric 300, sandwiched by two conductive electrodes 304A,304B. The charge Q that is stored on the conductive electrodes 304A,304B is:

$$Q=CV \quad (3a)$$

where C is the capacitance measured in Farads, and V is the applied voltage in Volts. The Capacitance, C, of a parallel plate capacitor is determined by the surface area, A, of the conductive electrodes 304A,304B, the distance, d, separating the conductive electrodes 304A,304B, and the dielectric permittivity ($\varepsilon_0 \varepsilon_R$) of the material 300 that fills the distance, d, between the conductive electrodes 304A,304B, $$C=A\varepsilon_0\varepsilon_R/d \quad (3b)$$

where $\varepsilon_0$ is the permittivity of free space, and ER is the relative permittivity of the dielectric material separating the two conductors. Relative permittivity $\varepsilon_R$ functions as an electromagnetic lens that linearly magnifies the charge stored per unit area. Higher capacitance per unit area is achieved by forming multilayer capacitor 310 structures, wherein the capacitance of a single layer is added in parallel. Small profile size is achieved by forming a planar capacitor 404C.

The inherent magnification associated with high energy density dielectrics 300 is useful in miniaturizing the feature size of characteristic circuit elements. A 3 GHz electromagnetic wave has a 1 cm wavelength, and a 30 GHz electromagnetic wave has a 1 mm wavelength. Maintaining signal integrity at elevated frequencies is highly dependent upon the use of resonating elements to properly terminate signal transmission lines. The magnification factor of high energy density dielectric layers 300 is useful in building resonating bodies that are useful in impedance matching structures and have small enough feature size to be packaged within a the confines of semiconductor chip stack 200 operating in the 7-20 GHz frequency range to improve signal integrity and signal termination.

Figure 4B:
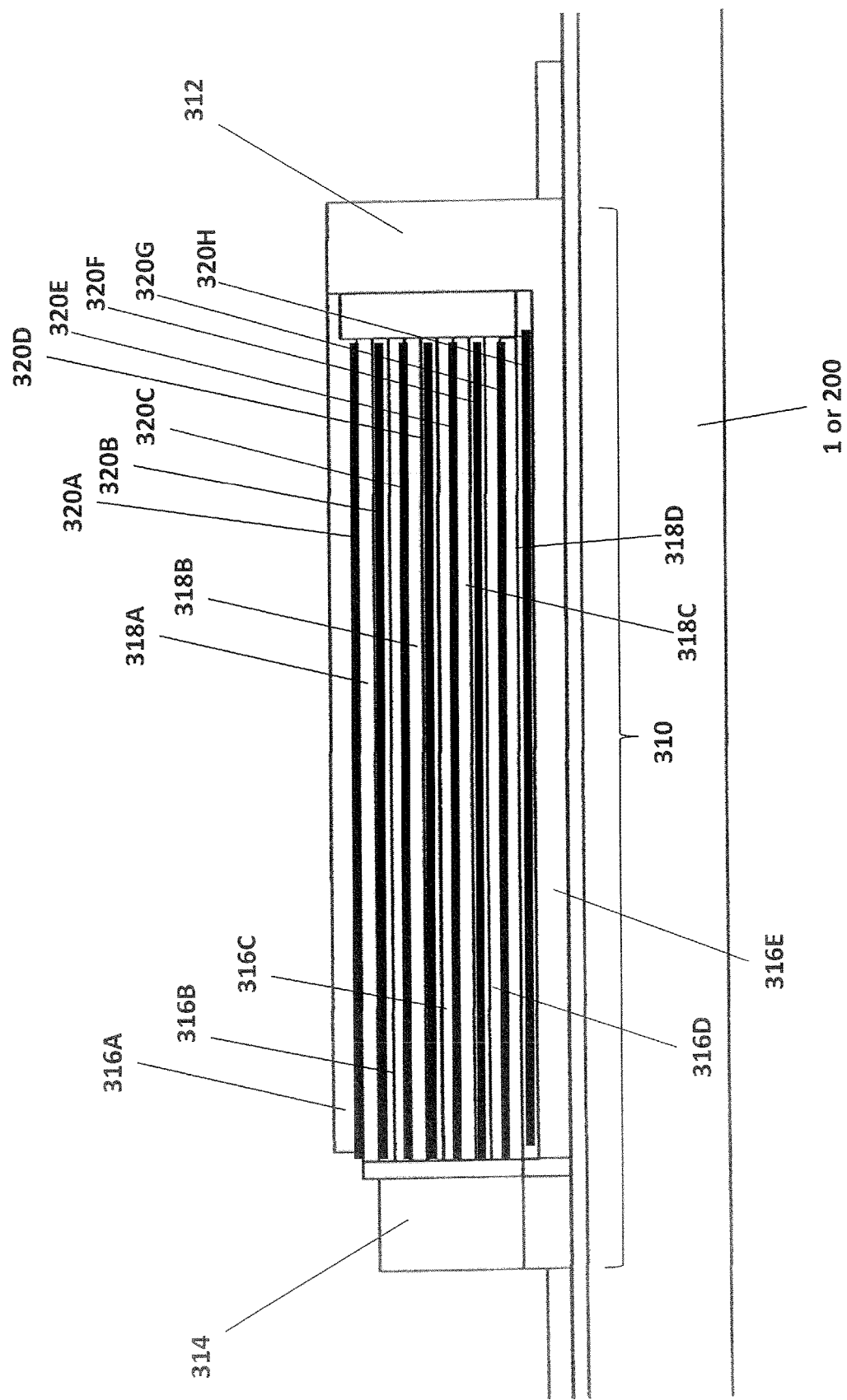
Figure 4C:
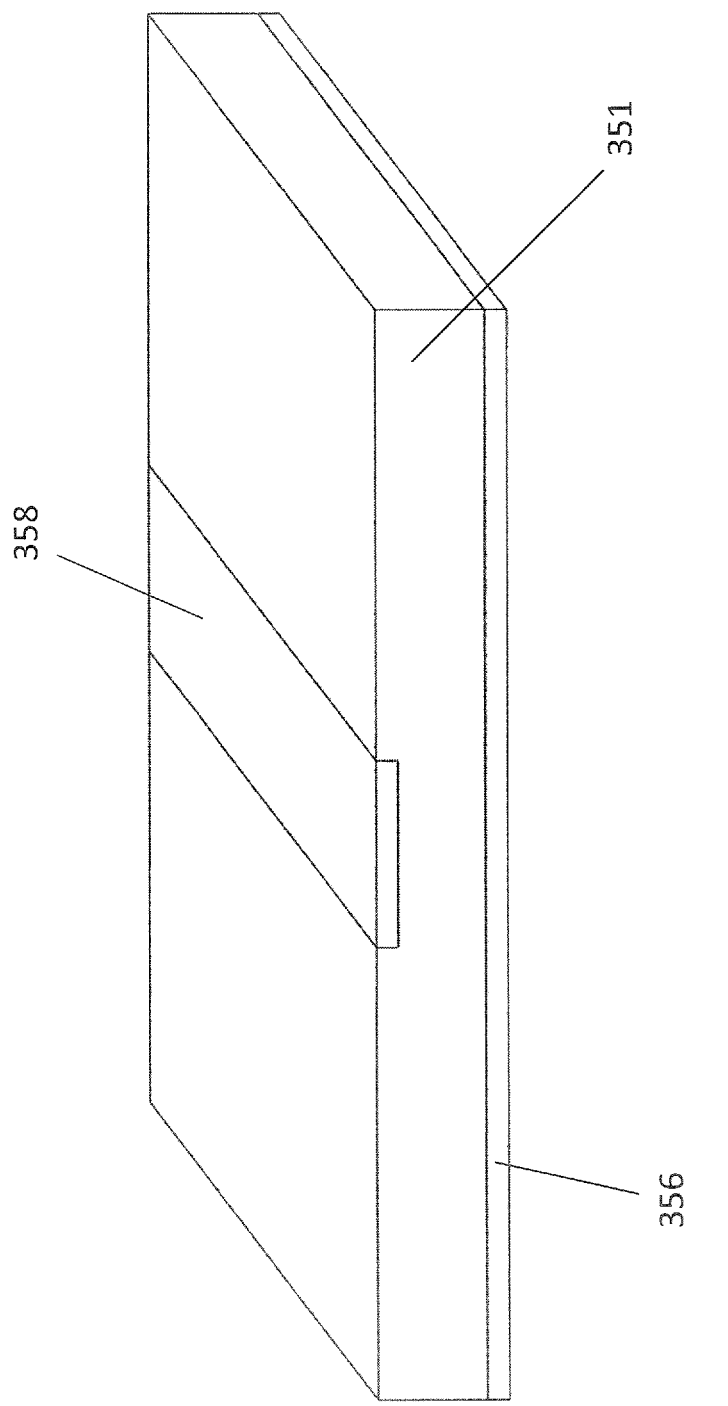
FIGS. 4C thru 4I illustrate various transmission line structures.

Reference is made to FIG. 4B to illustrate a preferred embodiment of the capacitive elements 222. The multilayer decoupling capacitor 310 that comprises a primary electrode 312 and a secondary electrode 314. The primary 312 and secondary 314 electrodes are in electrical communication with primary conductor layers 316A,316B,316C,316D, 316E and secondary conductor layers 318A,318B,318C, 318D, respectively, that are embedded and interleaved within the multilayer decoupling capacitor 310. Thickness of the primary conductor layers 316A,316B,316C,316D, 316E and secondary conductor layers 318A,318B,318C, 318D should be gauged to the current loads and internal resistance for a particular design and will optimally range in thicknesses that are 100 nm to 200 µm, depending upon the current loads carried. Each of the primary conductor layers 316A,316B,316C,316D,316E and secondary conductor layers 318A,318B,318C,318D are separated from one another by a high energy density capacitive dielectric layers 320A, 320B,320C,320D,320E,320F,320G,320H. An embodiment of the invention claims the use of a multilayer decoupling capacitor 310 in electrical communication with a semiconductor chip stack 1 because femtosecond polarization times, $\tau_{polarization}$, of the high energy density capacitive dielectric layers 320A,320B,320C,320D,320E,320F,320G, 320H will respond in phase with modulated signals. A preferred embodiment of the invention has the multilayer decoupling capacitor 310 formed on or bonded to a major surface 220 of the high speed semiconductor chip stack 200.

Reference is now made to FIGS. 4C thru 4O and 5A to illustrate preferred embodiments that incorporate a high energy density dielectric 300 within microstrip 352, stripline 354, ground-cladded stripline 357, ground-cladded dielectric waveguide 355, and a dielectric slab waveguide 359 used as signal interconnects and how to establish electrical connections within a high speed semiconductor chip stack 200. High signal integrity requires all impedances (input/output/and transmission line) to be perfectly matched in the system to avoid standing wave reflections that cause ringing in the circuit and degrade higher frequency performance. Semiconductor die can have input/output impedances that vary from values as low as 1Ω or less to values as high as $10^{12}$Ω depending upon their function. Therefore, there is a need for impedance matching networks that have small enough feature size to be integrated within the interfacing surface layers 400,400A,400B at the interface 402 between wafer bonded chips 202 or die-to-wafer (die-to-interposer) bonded semiconductor die 218 within a high-speed semiconductor chip stack 200. It is therefore desirable to fashion means by which a transmission line can be used to match impedances or high energy density materials can be deployed to minimize the size of passive components used in an impedance matching filter. As detailed below, the application of transmission lines comprising a high energy density capacitive layer is useful in introducing phase delays, matching to low impedance inputs or outputs, and minimizing a characteristic feature size.

Under the scope of the application, various means may be deployed as transmission lines used to make lateral electrical interconnections within a surface layer 402A,402B fabricated on the face of a die-mounted semiconductor die 208, sensor device 207 or interposer 206 As will be shown, surface layers are used to interface the major surface 220 of components embedded within a high-speed semiconductor chip stack 200. Microstrip 352 transmission line may be used in applications where ground shielding is not imperative. A microstrip transmission line 352, depicted in FIG. 4C, comprises a dielectric core 351, which could be a high energy density capacitive layer 350, disposed between a ground plane 356 and a signal conducting element 358. The signal conducting element 358 may comprise a metal, alloy or superalloy, an oxide dielectric, or carbon fabric, preferably carbon nanotubes. The microstrip 352 transmission line is constructed as a surface feature 400 within a surface layer 402A,402B. Surface layers 402A,402B then form the interface between stacked components.

Figure 4D:
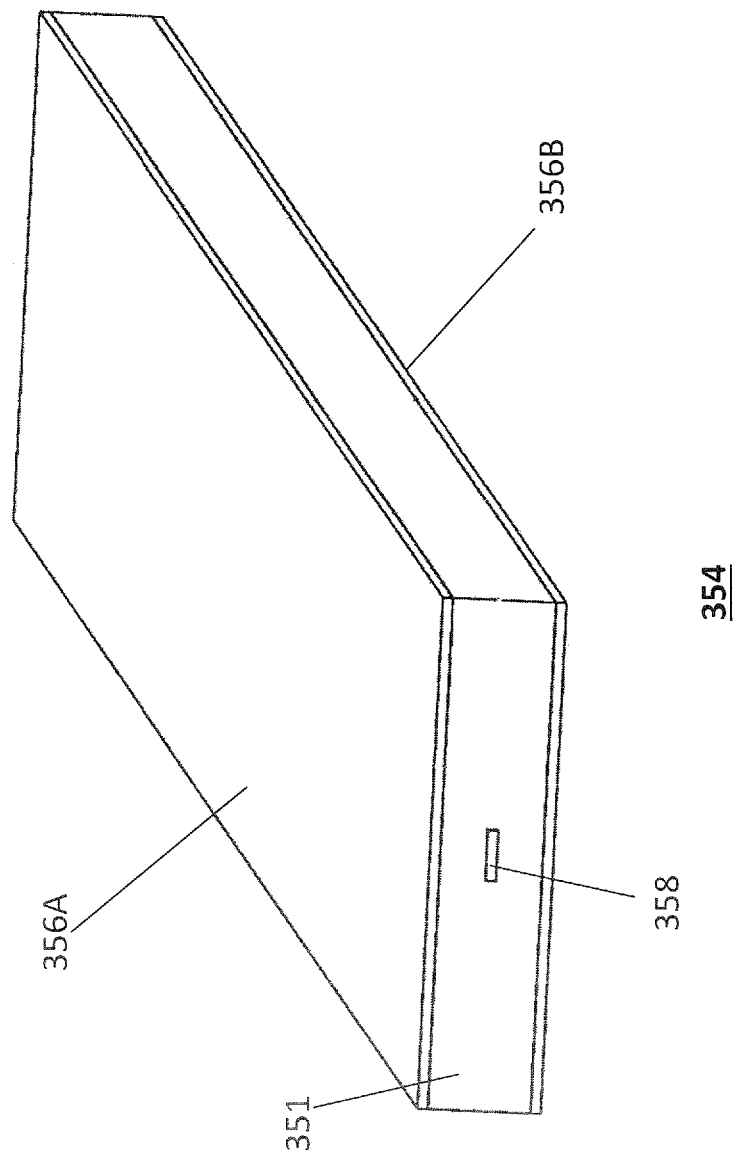

As illustrated in FIG. 4D, a stripline 354 transmission line comprises a conductive signal conducting element 358 embedded within a dielectric core 351 and disposed between an upper ground plane 356A and a lower ground plane 356B. The dielectric core 351 may comprise amorphous silica, having an $\varepsilon_R \approx 4$, or a metal oxide, preferably a metal oxide comprising a single elemental metal oxide, such as titanium oxide, or hafnium oxide, or a high energy density dielectric 300 depending upon the design requirements.

Figure 4E:
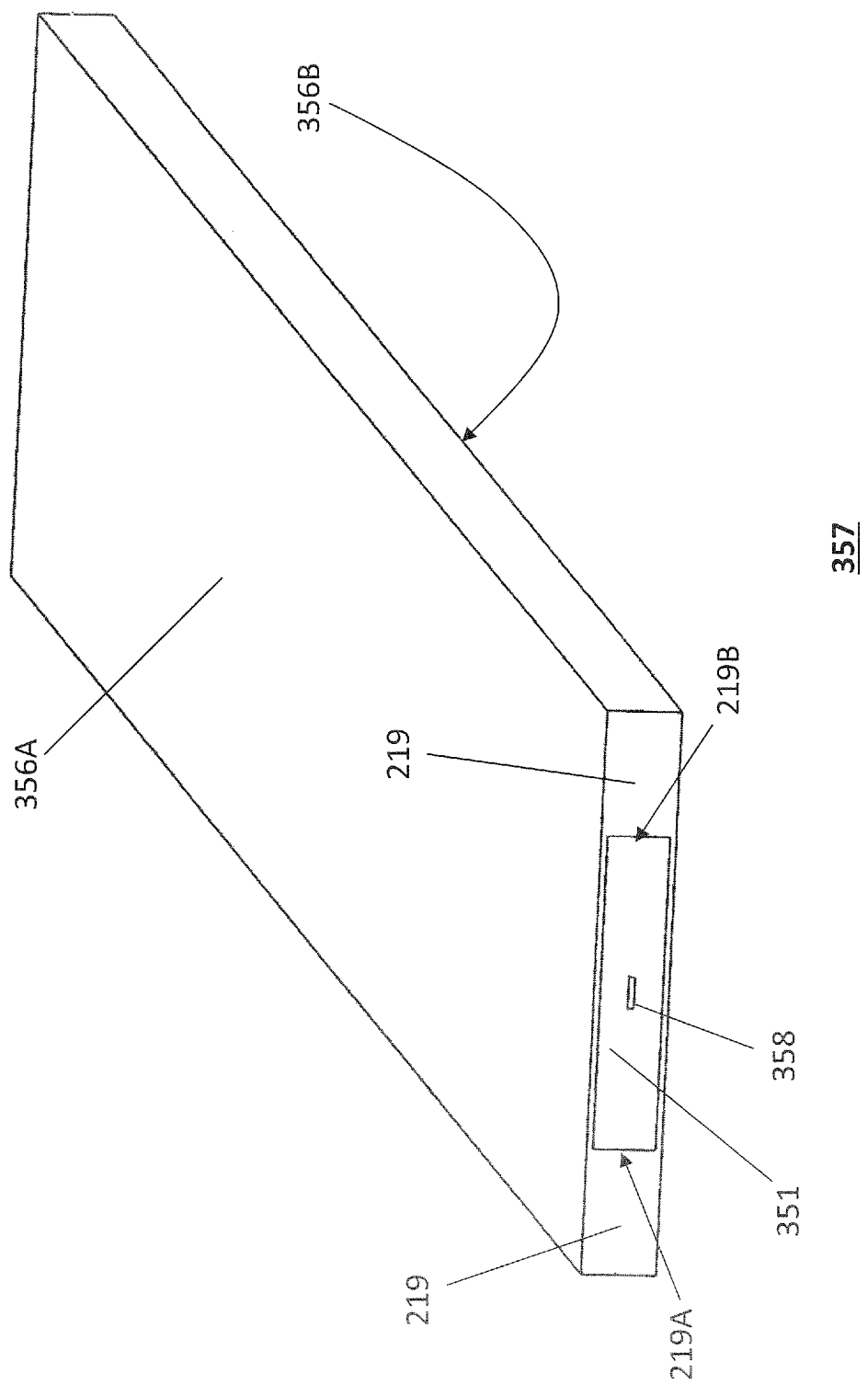

As represented in FIG. 4E, the ground-cladded stripline waveguide 357 is another alternative transmission line. It comprises a signal conducting element 358 embedded within a dielectric core 351 disposed between grounding pads 219 that function as grounded sidewalls 219A,219B and upper and lower ground planes 356A,356B.

Figure 4F:
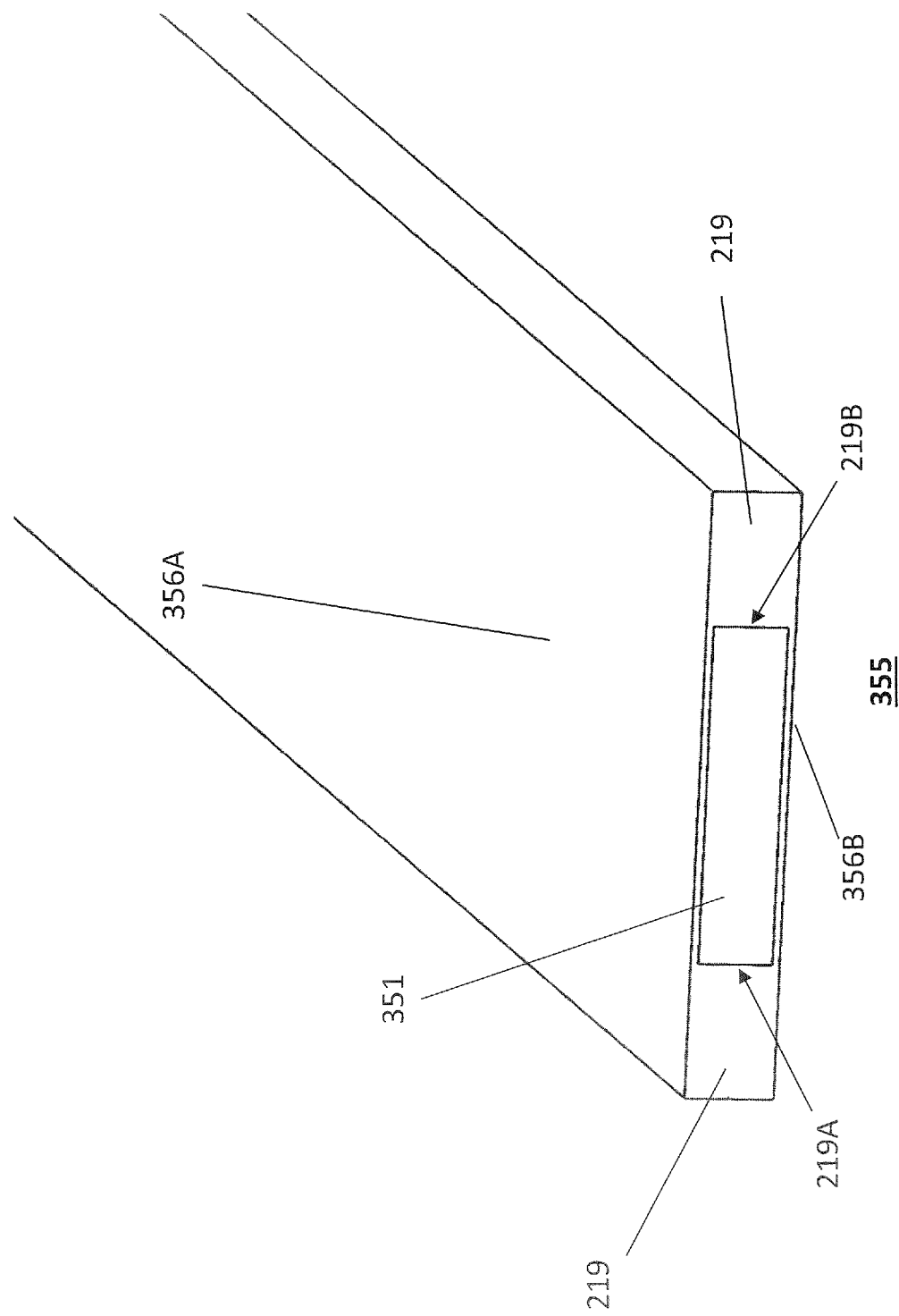

FIG. 4F depicts a ground-cladded dielectric waveguide 355, which comprises a dielectric core 351 formed between upper and lower ground planes 356A,356D and disposed between grounded sidewalls 219A,219B.

Figure 4G:
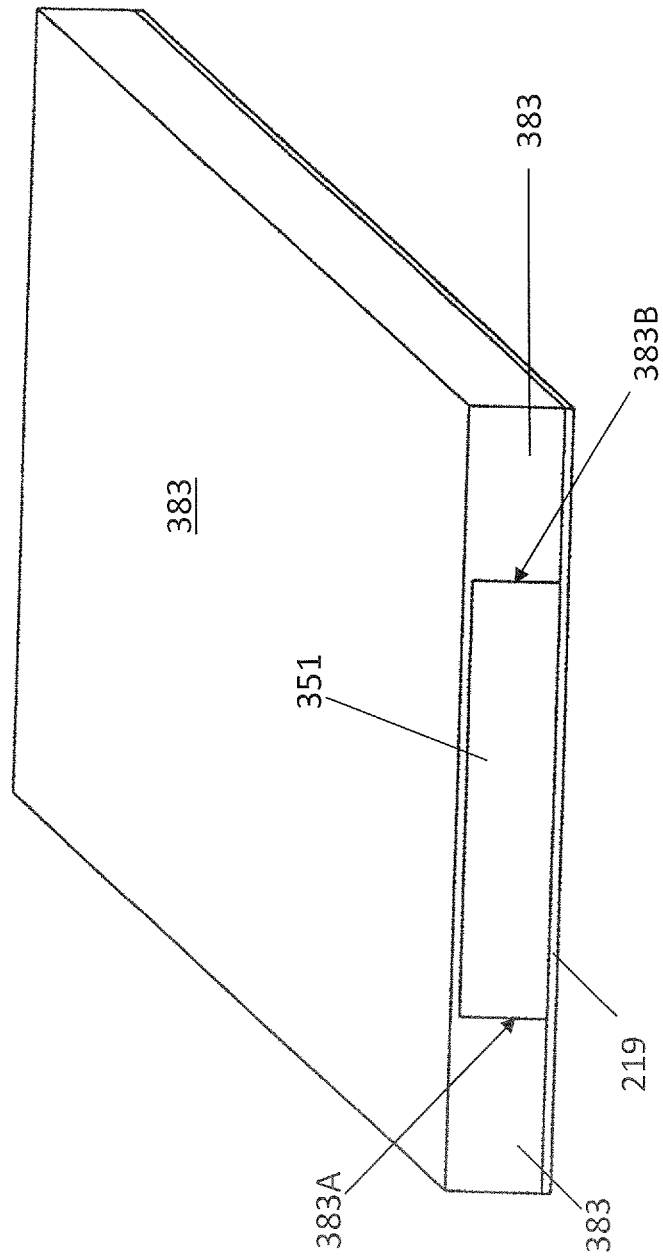

As presented in FIG. 4G, a dielectric slab waveguide 359 comprises a dielectric core 351 formed upon a ground plane 219 and is enveloped by a dielectric cladding 383 that is also formed upon the ground plane 219 to create dielectric cladding sidewalls 383A,383B to guide waves within the dielectric core 351. Dielectric cladding 383 may also be inserted between the ground plane 219 and the dielectric core 351. (Not shown for clarity). To achieve total internal reflection within a dielectric slab waveguide 359 the materials selected for dielectric core 351 and the dielectric cladding 383 must satisfy the condition that the refractive index of dielectric core ($n_{351}=\sqrt{\mu_0\mu_{R351}\varepsilon_0\varepsilon_{R351}}$) is greater than the refractive index ($n_{384}=\sqrt{\mu_0\mu R_{383}\varepsilon_0\varepsilon R_{383}}$) of the dielectric cladding 383. Various materials combinations are possible depending upon design objections for the dielectric slab waveguide 359. On one extreme the dielectric cladding material 383 may comprise pure amorphous silica ($\varepsilon_R=4$) while the dielectric core material 351 comprises phosphorous-doped amorphous silica that raises the refractive index slightly. Or, the dielectric cladding 383 may comprise titanium oxide ($\varepsilon_R=70$), while the dielectric core 351 comprises hafnium oxide ($\varepsilon_R=90$). At yet another extreme the dielectric cladding 383 may comprise a high energy density dielectric 300A ($\varepsilon_R=750$) while the dielectric core 351 comprises another high energy density dielectric 300B ($\varepsilon_R=800$).

Figure 4H:
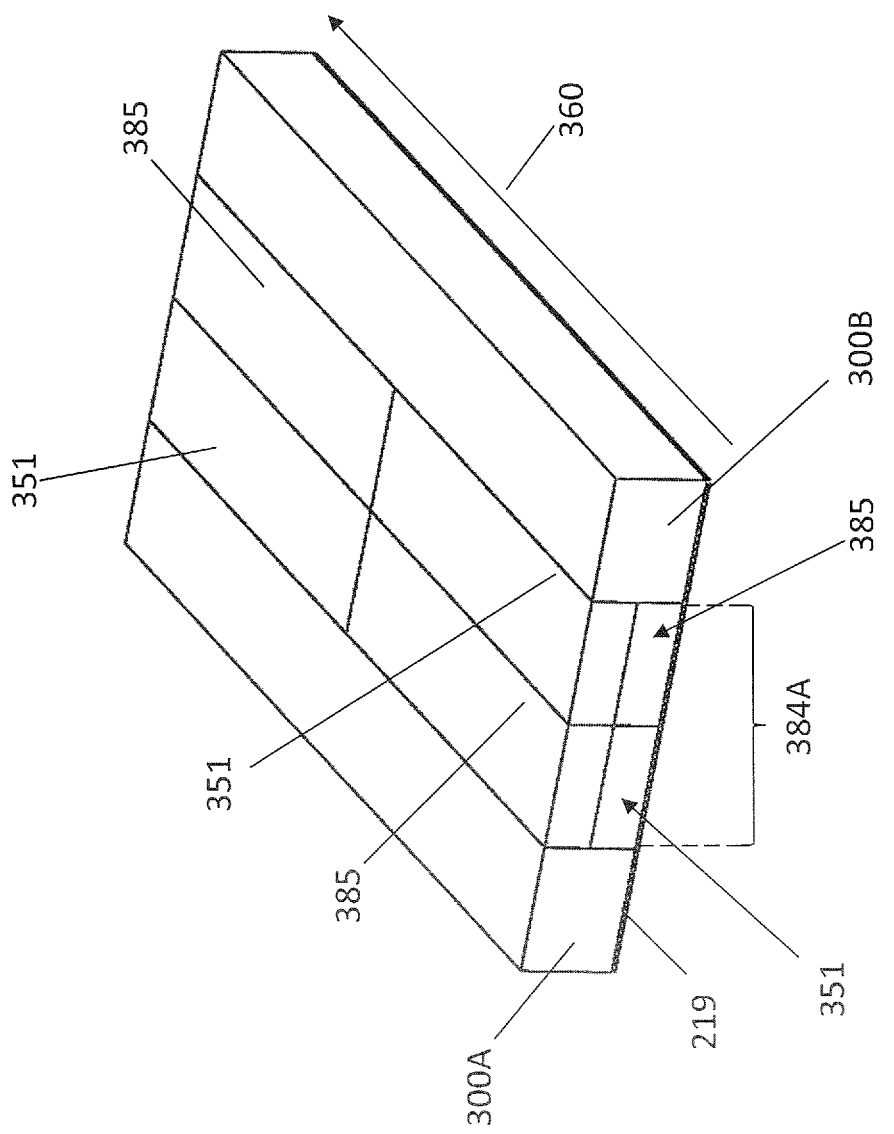
Figure 4I:
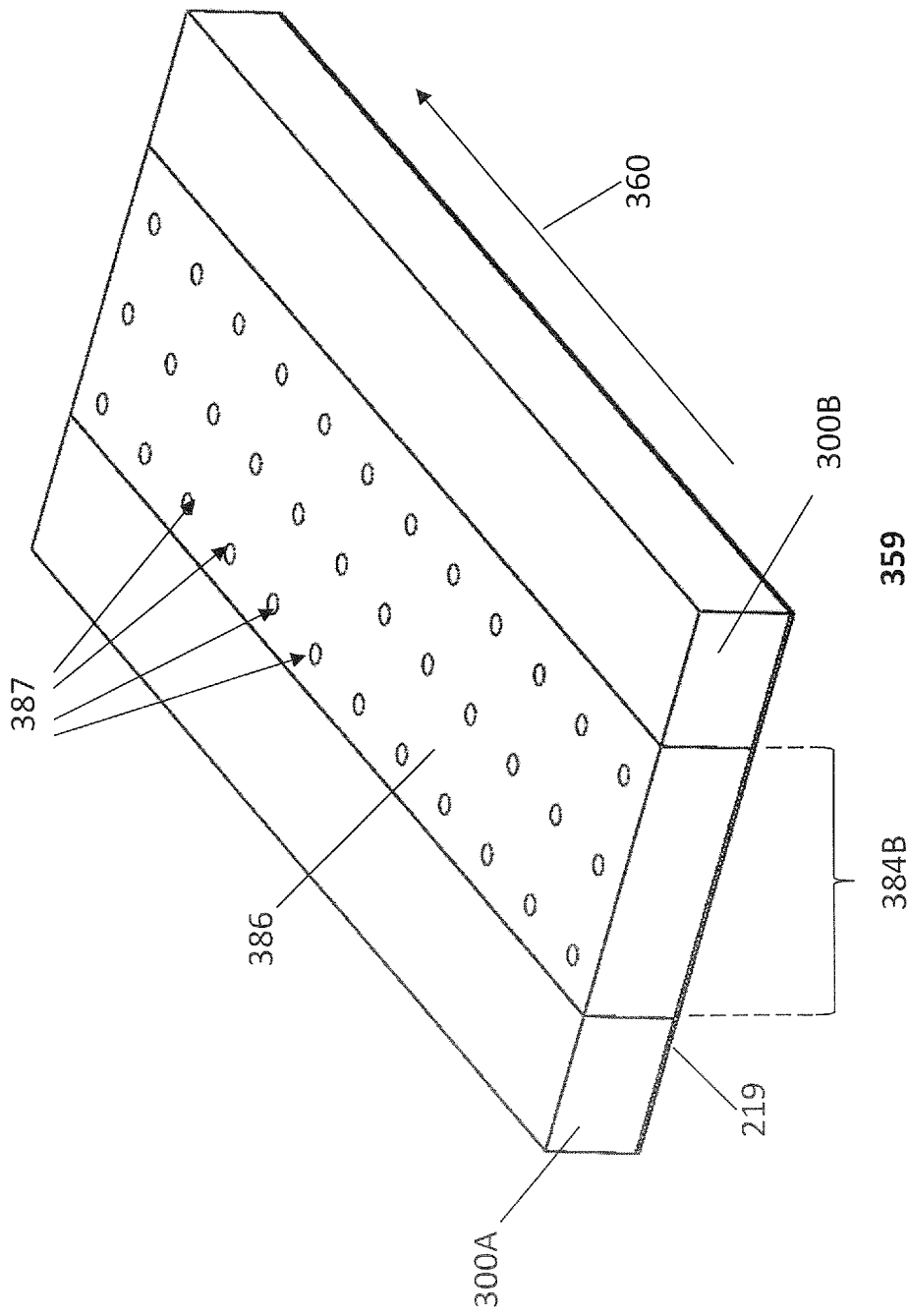

As illustrated in FIGS. 4H,4I, the dielectric slab waveguide 359 may also comprise a meta-material dielectric core 384,384A,384B, forming a meta-material dielectric waveguide 359. The upper dielectric cladding layer or ground plane has been removed from the illustrations for purpose of clarity. For the purposes of this application, a meta-material dielectric shall have the meaning of a composite dielectric body comprising a plurality of dielectric materials that are precisely placed with periodic patterns within the meta-material dielectric core 384 to favor a particular electromagnetic mode structure or to create resonant conditions that are precisely tuned to a desired clock speed and its harmonic frequencies. A characteristic of a meta-material dielectric core 384 is that the component bodies of the various dielectrics have physical size less than a wavelength of the fundamental electromagnetic frequencies propagating down the waveguide, such that the dielectric permittivity ($\varepsilon_0\varepsilon_R$) and permeability ($\mu_0\mu_R$) of the meta-material core 384 adopts an effective dielectric permittivity ($\varepsilon_0\varepsilon_R)_{Eff}$ and permeability $(\mu_0\mu_R)_{Eff}$ that is the fractional volume average of the component elements. A first embodiment 384A of the meta-material dielectric core 384 comprises a composite dielectric core having alternating regions 385,351 further comprising magnetic dielectric ($\mu_R \neq 1$) 385, preferably a garnet magnetic core 142 material, but does not comprise a dielectric host 386. Dielectric core 351, having ($\mu_R=1$) comprises the remainder of meta-material dielectric core 384A. The magnetic dielectric 385 material and the dielectric core 351 may occupy any fractional volume, any shape, and be located anywhere within a cross-sectional area of the meta-material dielectric core 384 as long that fractional volume, shape, extent, and cross-sectional location are consistently spaced in periodic fashion along the length 360 of the meta-material dielectric waveguide 359.

A second embodiment 384B of the meta-material dielectric core 384 within a dielectric waveguide 359 comprises a host dielectric 386 further comprising a periodic array of dielectric inclusions 387 that may comprise high energy density dielectric 300 or garnet magnetic core 142 material. The principal objective for these structures is to create conditions for a resonant standing wave along the length of the meta-material dielectric waveguide that is critically dampened at a terminating via 404E.

The application of meta-material dielectric cores 384 that periodically alternate garnet magnetic cores 142 and high energy density dielectric 300 or comprise dielectric inclusions 387 along the length of the dielectric waveguide 359 is also a preferred embodiment for the dielectric cores in stripline 354, microstrip 352, stripline 354, ground-cladded stripline 357, ground-cladded dielectric waveguide 355, and a dielectric slab waveguide 359.

The inclusion of high energy density dielectric 300 as layers or inclusions layers within high speed semiconductor chip stacks 200 provides multiple functionalities that serve the purpose of the present invention. First, they enable the construction of transmission lines that have low characteristic impedance Z, which is given by:

$$Z_0 = \sqrt{\frac{L}{C}} \propto \sqrt{\frac{\mu_R}{\varepsilon_R}} \tag{4a}$$

Therefore it is advantageous to construct transmission lines or a surface feature comprising high energy density capacitive dielectric layers 350 that have maximal relative permittivity, $\varepsilon_R$, to improve impedance matching with low impedance input and output ports on semiconductor die within the high-speed semiconductor chip stack 200. in the system. Similarly, it is advantageous to construct transmission lines or a surface feature comprising high relative permeability, $\mu_R$, ultra-low loss garnets 142 when matching the lines to high impedance ports in the system.

As noted above, high energy density dielectrics 300 reduce characteristic feature size of transmission line and resonating bodies used to match impedance and terminate electrical connections. Characteristic feature size scales with electromagnetic wavelength, $\lambda_o$, and the guided wavelength, $\lambda_g$, when the electromagnetic wave is propagating through a dielectric medium. Guided wavelength, $\lambda_g$, is reduced in proportion to relative permittivity, $\varepsilon_R$, as $$\lambda_g = \lambda_o / \sqrt{\varepsilon_R} \tag{4b}$$

In a free-space vacuum, where $\varepsilon_R = 1$, a 10 GHz signal has an electromagnetic wavelength of 30 mm, and a 20 GHz signal has an electromagnetic wavelength of 15 mm, which represent feature sizes that would be difficult to accommodate within the physical dimensions of a chip stack 1,200. However, within the body of a high energy density dielectric 300 having a high ER or a garnet magnetic core with magnetic permeability $\mu_R \gg 1$, the guided wavelength $\lambda_g$ is reduced as:

$$\lambda_g = \lambda_o / \sqrt{\mu_R \varepsilon_R} \tag{4c}$$

Therefore, within a high energy density dielectric 300 having $\mu_R = 1$ and $\varepsilon_R = 400$ the guided wavelength $\lambda g$ and characteristic feature of elements and resonating bodies that serve as termination components is reduced by 20×. Thus, a 10 GHz signal would have a guided electromagnetic wavelength of 1.5 mm, and a 20 GHz signal has an electromagnetic wavelength of 0.75 mm. Similarly, within a high energy density dielectric 300 having $\mu_R = 1$ and $\varepsilon_R = 800$ the guided wavelength $\lambda g$ and characteristic feature of elements and resonating bodies that serve as termination components is reduced by 28×. Thus, a 10 GHz signal would have a guided electromagnetic wavelength of ≈1.1 mm, and a 20 GHz signal has a guided electromagnetic wavelength of ≈0.5 mm. These physical dimensions are more compatibly integrated within the confines of stacked chip assemblies and are well within the photo-patterning tolerances of modern microelectronic manufacturing.

Reduced feature sizes proportionally reduce the size requirements of strip line 354, waveguide 355, and ground-cladded striplines 357. Waveguide 355 and ground-cladded striplines 357 are preferred embodiments as surface features for making electrical connections because their $TM_0$ mode has no cut-off frequency and will transmit power with attenuation limited to loss in the high energy density dielectric 300 as long as the characteristic dimensions h,w are at least half of the guided wavelength, $h,w \geq 0.5\lambda_g$.

Phase velocities, $v_p$ are proportionally reduced as:

$$v_p = c/\mu_R \varepsilon_R \tag{4d}$$

where c is the speed of light in a vacuum. The slower $v_p$ will increase latency, but that will be offset by the shorter physical distances that separate microprocessor and memory components within a high speed semiconductor chip stack 200. As discussed below, lower phase velocity will increase the need for impedance matching terminations in the circuit. However, information, whether composed as a digital pulse or a modulated analog signal, is composed of a fundamental frequency (or clock speed) and a Fourier series of higher order harmonics that shape the pulse or encode the information as a modulated signal. The dispersion characteristics of the transmission medium define the variance in the propagation of higher and lower order frequencies in the Fourier series as a function of distance. Dispersion is a function of the frequency (co) dependence of the dielectric constant $\mu_0\mu_R(\omega))\varepsilon_0\varepsilon_R(\omega)$. Dielectric dispersion causes a well-defined pulse to become distorted over longer propagation paths as some frequencies in the Fourier series have higher propagation velocities than others. Dispersion is most pronounced around a resonance within the dielectric medium that is determined by the polarization response time, $\tau_{polarization}$. The femtosecond polarization response times of the high energy density dielectrics 300 pushes the resonance to terahertz (THz) frequencies, minimizing distortion in the transmission of modulated signals in the 10-20 GHz frequency range. The use of low dispersion dielectrics will also facilitate impedance matching in the system as the entire group of encoded frequencies can be considered to have similar propagation characteristics.

In high speed digital design, electrical length, l, is a characteristic of electromagnetic wave propagation along a transmission line that becomes an important design consideration as it determines the dimensions over which a circuit can be designed as a lumped circuit or needs to be designed as a distributed network. Electrical length l is determined by the rise time $T_f$ (in picoseconds) of the leading edge of a digital pulse and the delay (D) in the transmission line, measured in picoseconds per inch as determined by the phase velocity $v_p$, incurred as the digital pulse transitions binary states at the receiving port.

$$l = T_f/D \tag{4d}$$

As a general rule, any transmission line longer than 16 will have to be designed as a distributed network having consistent impedance per unit length with proper termination to avoid ringing. As shown in Table II, the introduction of high energy density capacitive dielectric materials substantially shortens the distances over which a high speed semiconductor chip stack 200 can be designed as a lumped circuit

TABLE II

| Material | Dielectric Constant | Delay (ps/in) | rising edges length (in) | lumped circuit length (in) | lumped circuit length (mm) |
|---|---|---|---|---|---|
| Rise Time (ps) 1,000 | | | | | |
| air | 1 | 85 | 11.76 | 1.96 | 49.80 |
| FR4 | 4.5 | 180.31 | 5.55 | 0.92 | 23.48 |
| alumina | 10 | 268.79 | 3.72 | 0.62 | 15.75 |
| titania | 70 | 711.16 | 1.41 | 0.23 | 5.95 |
| HEDCD-1 | 200 | 1202.08 | 0.83 | 0.14 | 3.52 |
| HEDCD-1 | 800 | 2404.16 | 0.42 | 0.07 | 0.76 |
| Rise Time (ps) 100 | | | | | |
| air | 1 | 85 | 1.18 | 0.20 | 4.98 |
| FR4 | 4.5 | 180.31 | 0.55 | 0.09 | 2.35 |
| alumina | 10 | 268.79 | 0.37 | 0.06 | 1.57 |
| titania | 70 | 711.16 | 0.14 | 0.02 | 0.60 |
| HEDCD-1 | 200 | 1202.08 | 0.08 | 0.01 | 0.35 |
| HEDCD-1 | 800 | 2404.16 | 0.04 | 0.01 | 0.18 |

Figure 4J:
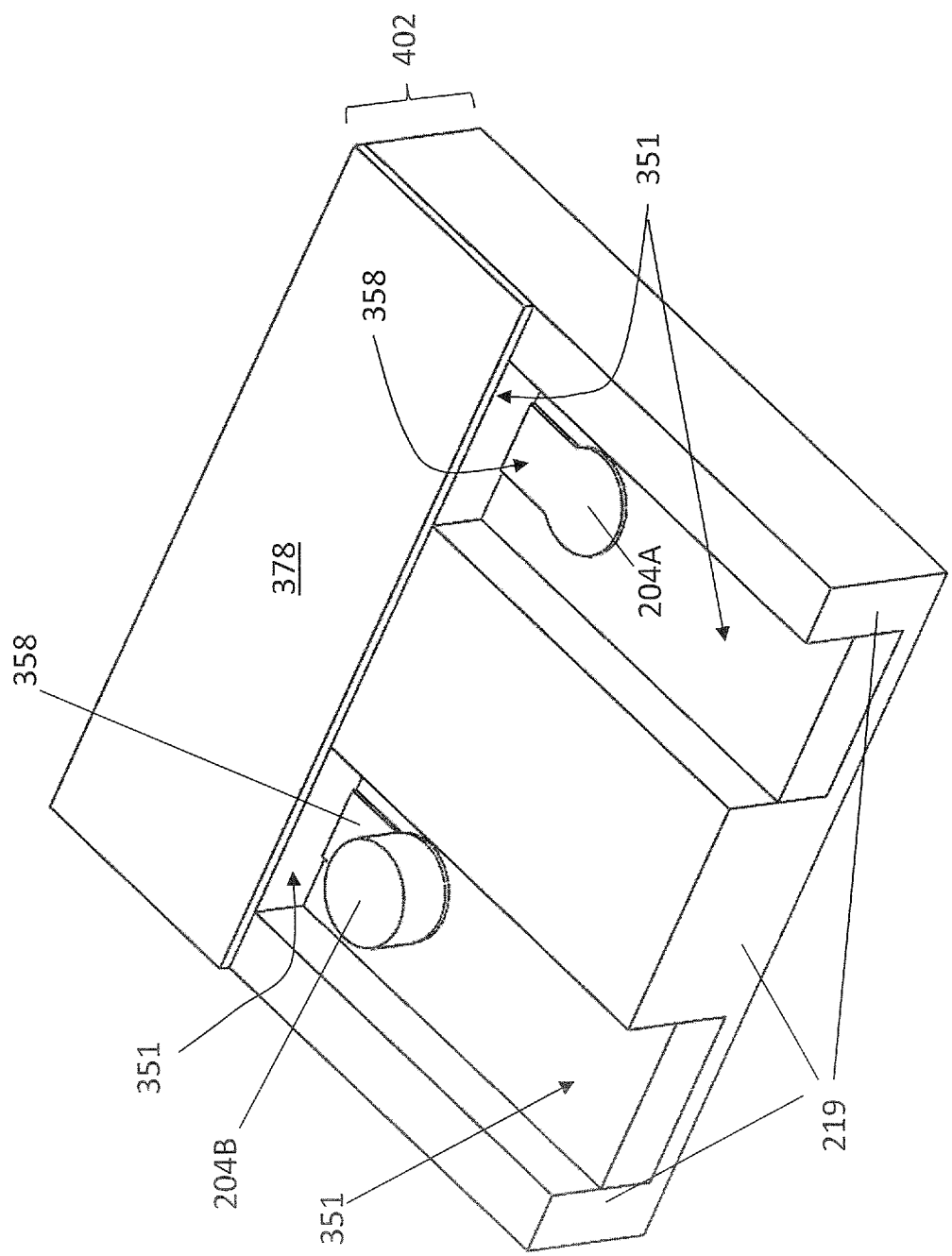
Figure 4K:
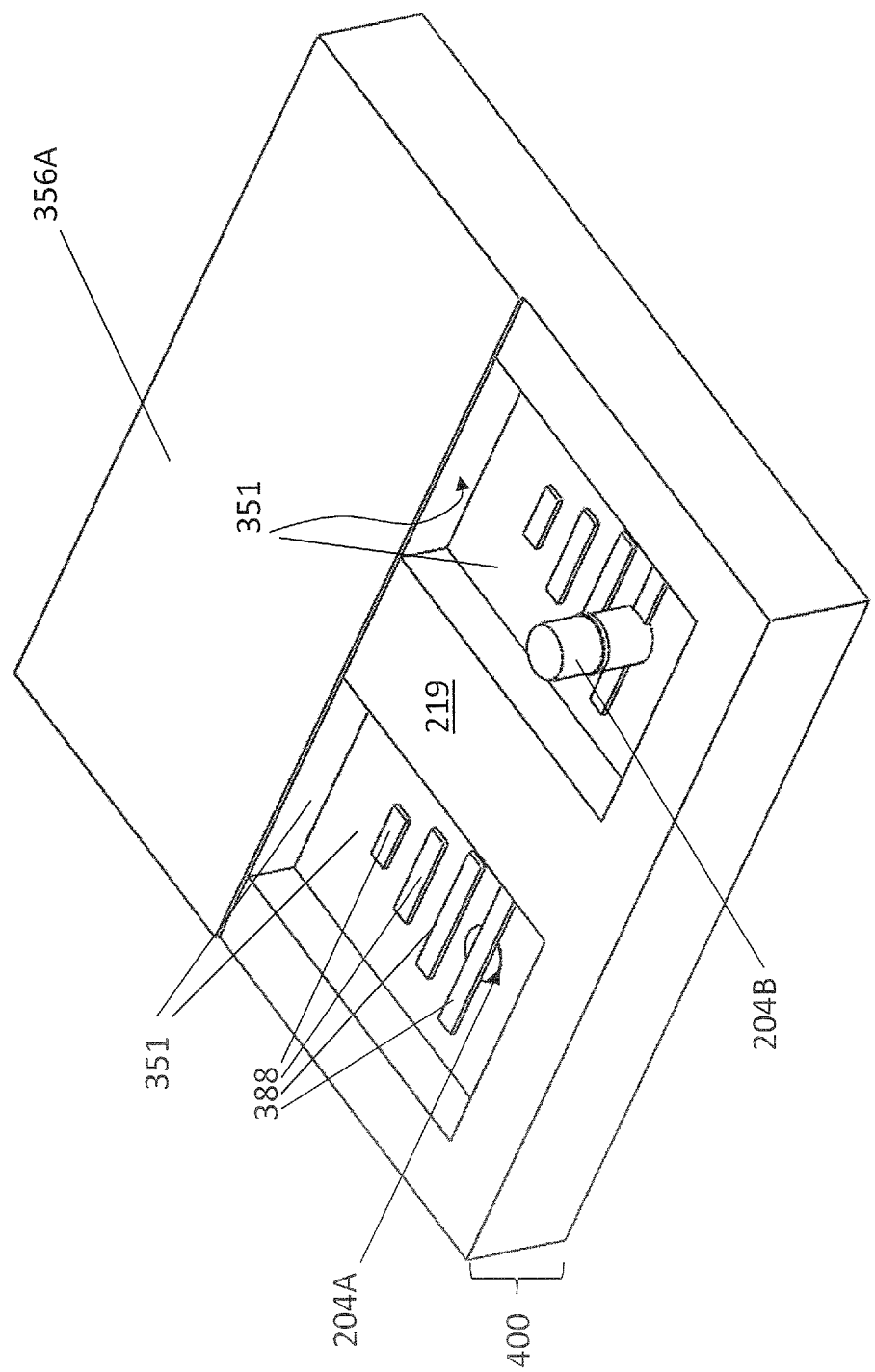
Figure 4L:
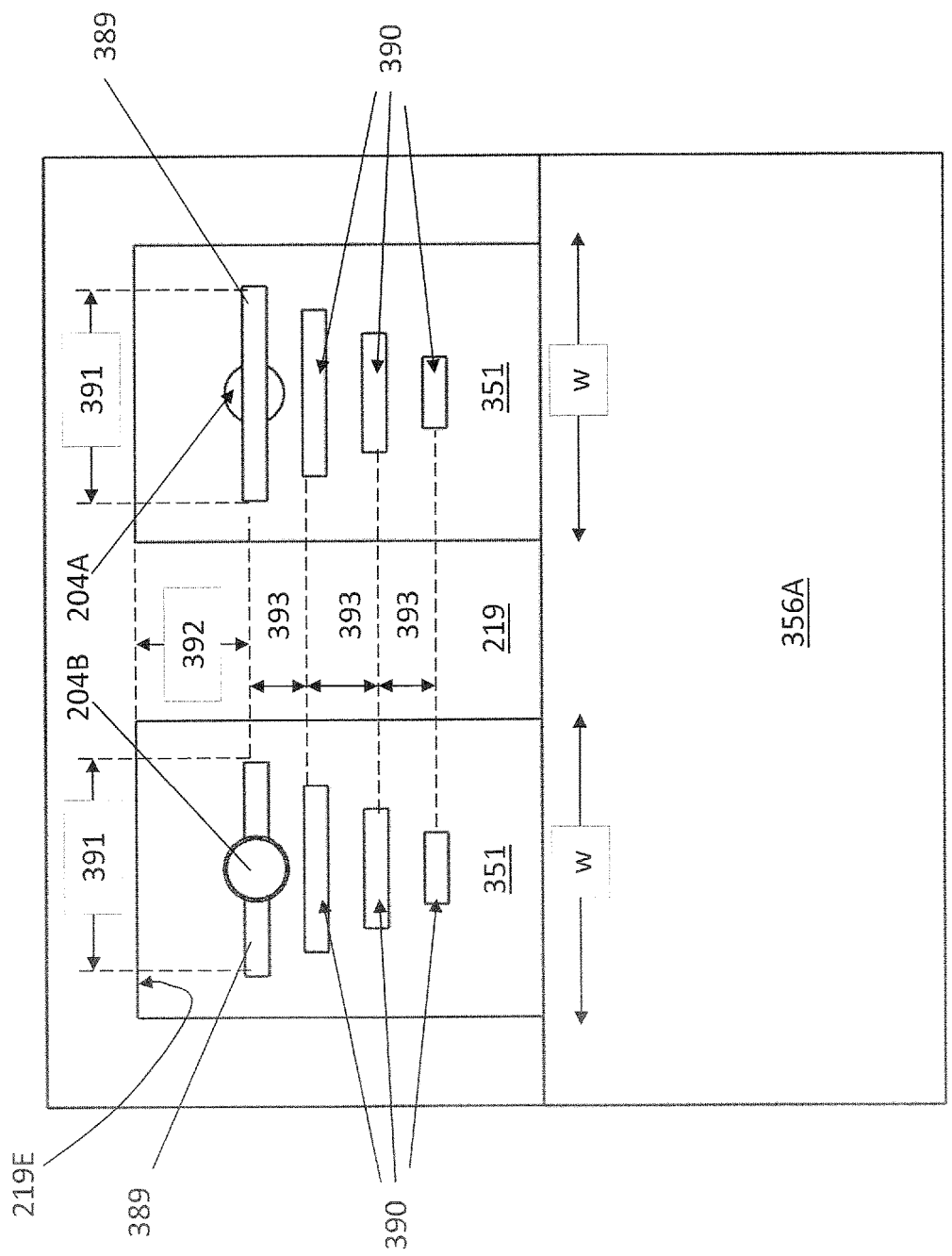

Reference in now made to FIGS. 4J,4K,4L to illustrate how electrical connections within a surface layers 400A/400B are made through vias to the various transmission line structures described above. Conventional means are used to electrically connect microstrip 352, stripline 354, and ground-cladded stripline 357 transmission lines to other components in the chip stack. For the case of the ground-cladded stripline 357 embedded within a surface layer (depicted as a cutaway illustration in FIG. 4J), dielectric cores 351 are enveloped by grounding surfaces (grounding sidewalls 219 and ground planes 378) and envelope signal conducting elements 358. A single layer via 204A embedded within the dielectric core 351 establishes electrical communication between the surface layer 400 in which the ground-cladded stripline 357 is embedded and, in this instance, and surface layer of the chip component located immediately below it in the high-speed semiconductor chip stack 200. A thru via 204B establishes electrical communication between the ground-cladded stripline 357 and a plurality of surface layers through the surface layers 402A,402B of the semiconductor die 208, sensor chip 207, or interposer 206 components immediately above or below it.

Unconventional means are required to electrically interconnect ground-cladded dielectric waveguide 355, and a dielectric slab waveguide 359 to other components in the chip stack. FIG. 4K,4L depict a cutaway illustration of ground-cladded dielectric waveguide 355 embedded within a portion of a single layer 400, where an upper ground plane layer 356A and an upper layer of the dielectric core 351 are partially removed to expose the vias 204A,204B and directed radiating elements 388 formed on a base layer of the dielectric core 351. In this embodiment a radiating element 388 are either electrically connected or electromagnetically coupled to the vias 204A,204B. In a preferred embodiment, the radiating element 388 comprises a monopole antenna 389 that is in electrical contact with the vias 204A,204B, and may optionally include closely coupled director elements 390 that electromagnetically couple to the monopole antenna 389 to maximally radiate signal power into the dielectric core 351. The closely coupled director elements 390 can be an electrically conducting element or a dielectric element. While the monopole antenna 389 could simply be the stub of the vias 204A,204B, it is an additional preferred embodiment that it have maximal length 391 oriented parallel to the width, w, of the dielectric core 351. In this additional preferred embodiment, the maximal length 391 of the monopole antenna 389 should be at least one 10th of the guided wavelength ($0.10\lambda_g$), preferably at least one half of the guided wavelength ($0.50\lambda_g$). It is also preferred that the monopole antenna 389 be positioned a distance 392 that is one quarter of the guided wavelength ($0.25\lambda_g$) from the grounded sidewall 219C aligned parallel to the maximal length of the monopole antenna 389 and with the width of the dielectric core 351. The closely coupled director elements 390 should have spacing 393 that is less than or equal to one quarter of the guided wavelength ($0.25\lambda_g$) from the monopole antenna element and each other. When a plurality of closely coupled director elements 390 are used, the spacing 393 may be constant or variable between monopole antenna 389 and the closely coupled director elements 390.

Figure 4M:
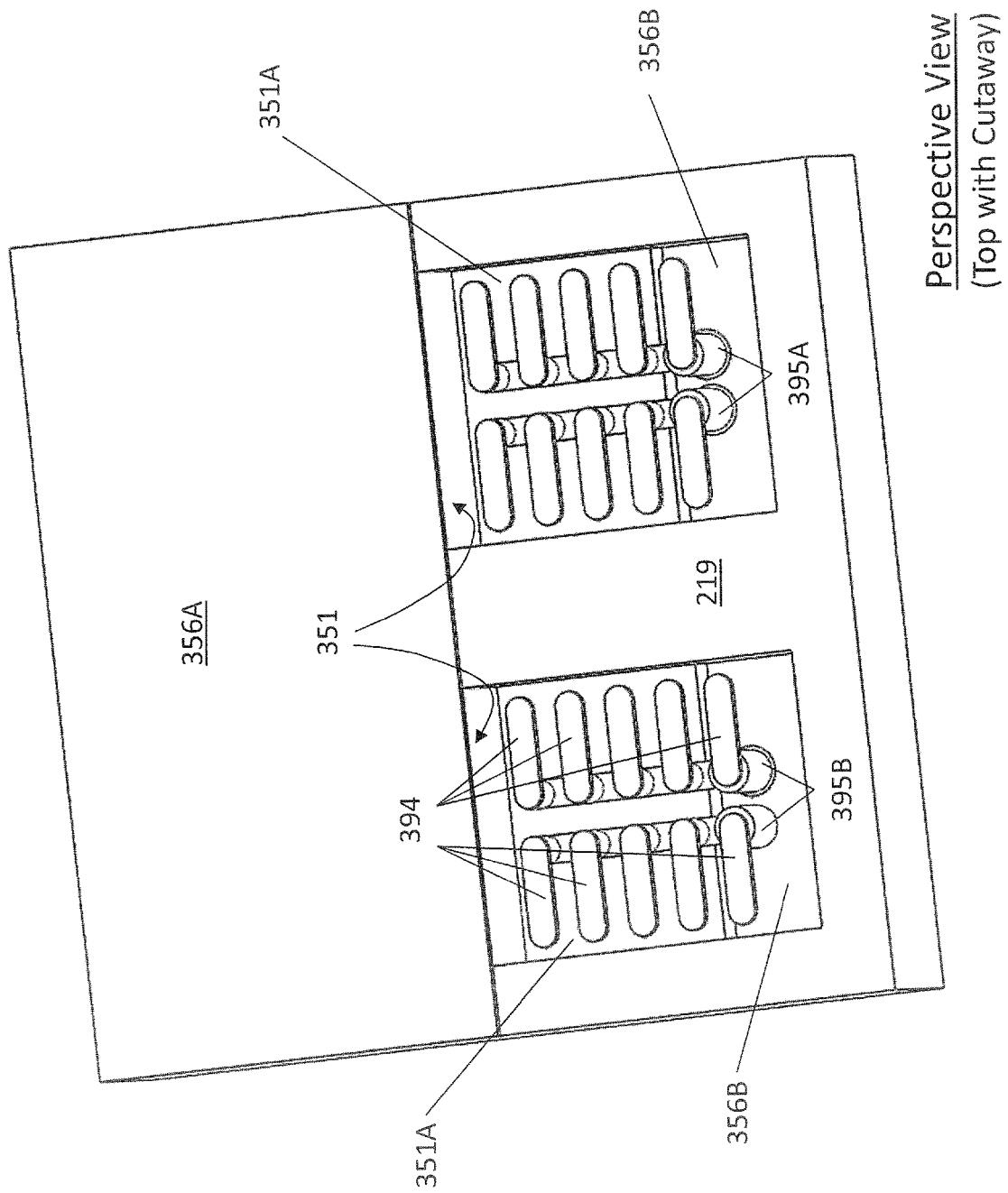
Figure 40:
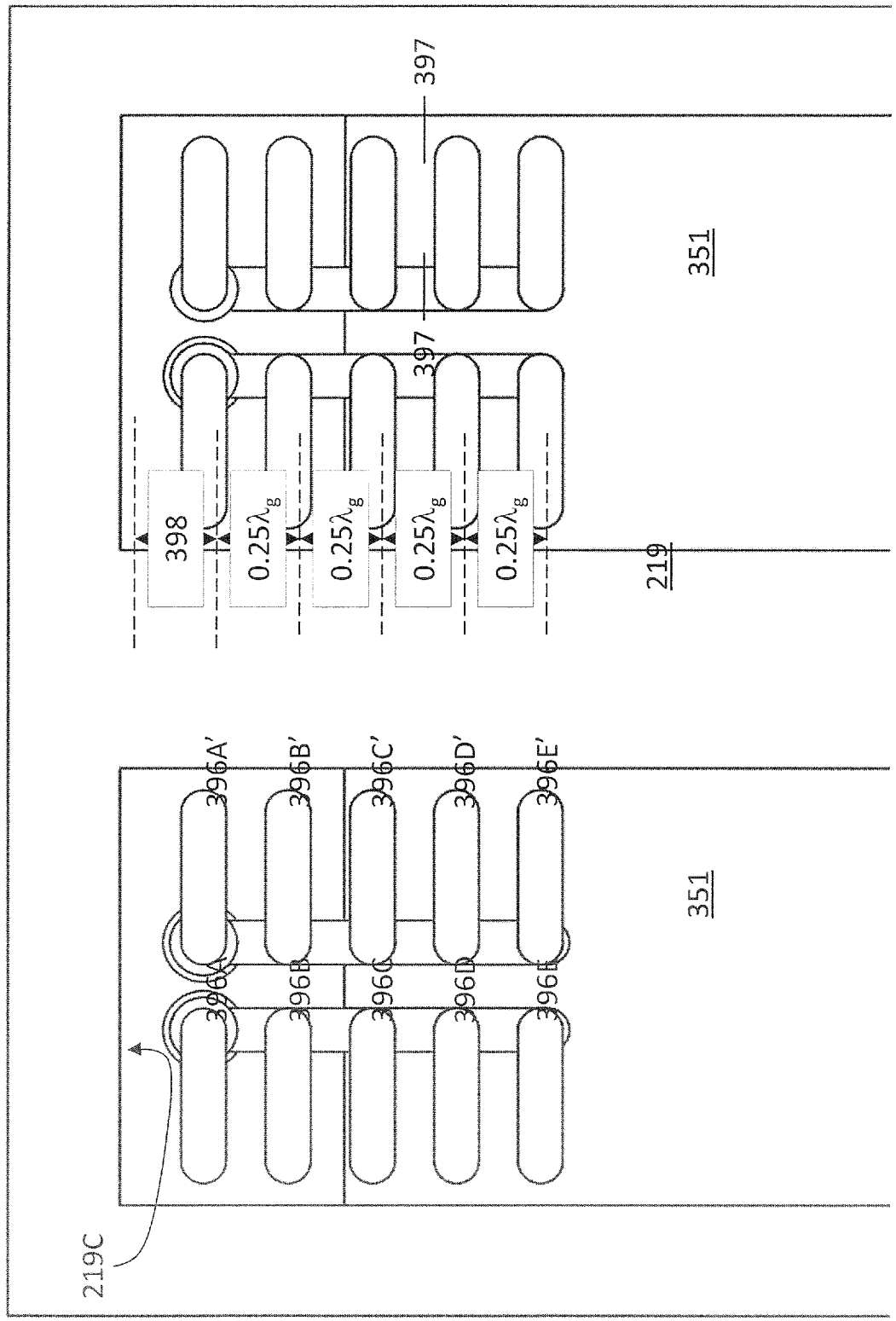
Figure 4P:
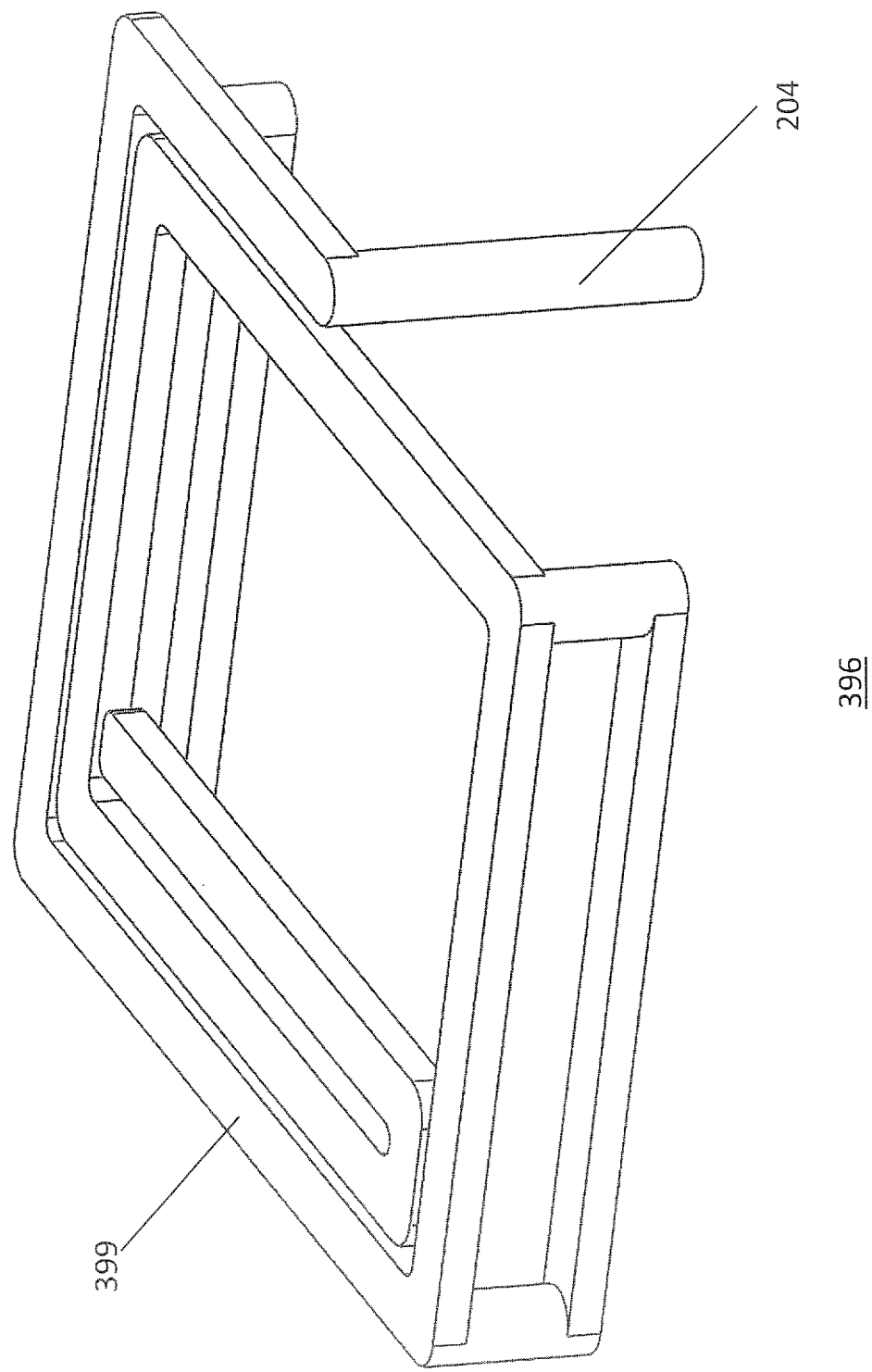

FIGS. 4M,4N,4O,4P depict cutaway illustrations in which an antenna array 394 is used to couple electromagnetic signals from a via 204 into a dielectric core 351 of a ground-cladded dielectric waveguide 355 or a dielectric slab waveguide 359. FIG. 4M depicts an antenna array 394 in a region where upper ground plane 356A and a portion of the dielectric core 351 have been cutaway to reveal the array on a dielectric core base layer 351A, with another region where the dielectric core base layer 351A has been cutaway to reveal the via feed network 395,395A,395B and the lower ground plane 356B for the antenna array 394. The antenna array may comprise any array configuration. End Fire or Broad Side array configurations are preferred embodiments as an antenna array 394 in this application for their high directionality.

A principal objective of the present application aims to mitigate conductive power loss in metal traces at higher frequencies. Eliminating conductive power losses is desirable to reduce thermal loads and the additional costs of thermal management systems. The reduced dielectric loss and faster polarization response times coupled to the feature size reduction enabled by high energy density dielectric 300 favors the use of waveguides over conductive traces in high-speed semiconductor chip stacks.

All antenna arrays 394 can be highly directional. An antenna array 394, using an End Fire antenna array as an example, is depicted in FIGS. 4M thru 4O. An antenna array 394 comprises a plurality of radiating bodies 396 and a phasing system 397. The phasing system may comprise a feed network with single via 204 system and a variation in the conductor lengths to the individual radiating bodies 396A,396B,396C,396D,396E,396A',396B',396C', 396D', 396E' as depicted in FIGS. 4M thru 4O. Alternatively, the phasing system 397 may also comprise a networks wherein vias 204 electrically connect phase-locked loop circuitry located on an adjacent circuit layer(s) that monitors and optimizes the waveguide output independently feed each of the radiating bodies 396A,396B,396C,396D,396E,396A', 396B',396C',396D',396E' to optimize the phased output of each radiating elements in the antenna array 394. Additionally, the terminated via in the phase-locked loop circuitry, or any terminated via anywhere in the high speed semiconductor chip stack, may comprise or be electrically connected to a tunable inductor element as instructed in de Rochemont U.S. Ser. No. 14/560,935, (the '935 application)", incorporated herein by reference.

In the case of an End Fire antenna array, the radiating bodies 396A,396B,396C, 396D,396E,396A',396B',396C', 396D',396E' comprise half-wavelength dipole elements that are separated by a distance of a quarter of the guided wavelength ($0.25\lambda_g$) and the phasing system 397 is designed to phase delay the signal by 90° between the individual radiating bodies 396A,396B,396C,396D,396E,396A',396B', 396C',396D',396E'. This causes the phase delayed feed/return signals to constructively interfere with the radiated signals from each of the emitting dipole elements. This constructive interference is primarily directed off of the last radiating bodies 396E,396E' in the array and down the waveguide in a focused beam. It is a preferred embodiment of the invention to situate the first radiating bodies 396A, 396A' in the array an optimal distance 398 from the back ground pad sidewall 219C. This distance is determined by the guided wavelength, $\lambda_g$, and varies for a given antenna array configuration. In the case of the End Fire antenna array, a quarter of the guided wavelength ($0.25\lambda_g$) from the back ground pad sidewall 219C maximizes the power radiated down the waveguide. The radiating bodies 396A,396B, 396C,396D,396E,396A',396B',396C',396D',396E' need not be linear bodies as depicted FIG. M thru FIG. O. They may be electrically small and comprise folded geometry elements 399 that impart frequency-selectivity and added directional gain, as instructed by de Rochemont '858 incorporated herein by reference. The folded geometry elements 399 may extend the radiating bodies to have features that exist on more than one plane.

The feed network 395 of antenna arrays 394 may comprise a single input via 204 but will optimally comprise two vias 204, which may be thru vias 204A or single layer vias 204B. One via in the feed network 395 feeds a source signal to half of the individual radiating bodies 396A,396B,396C, 396D,396E. The other draws a return signal from the individual radiating bodies 396A',396B',396C',396D',396E'. In higher fidelity applications, the feed network 395A will route the source and return signals through vias 204 to circuitry on other layers. In applications with less stringent performance specifications, the feed network 395B will route the source signals through vias 204 to circuitry on other layers, while the return signal will make contact with the lower ground plane layer 395B. Antenna arrays 394, radiating bodies 396, and folded geometry elements 399 may further comprise closely coupled director elements 390 that may comprise a conducting body, a dielectric, or a high energy density dielectric 300.

While these unconventional means are developed for dielectric waveguides they are universally applicable to all transmission lines in this application.

Reference is now made to FIGS. 5A-thru 5G to illustrate the use of planar surface features 404A,404B,404C,404D to route signals within surface layers 400A,400B and properly terminate a transmission line within the high speed semiconductor chip stack. For the purpose of clarity, the term "transmission line" or "transmission lines" shall herein be understood to convey the meaning as provided in the Definition of Terms section above.

Planar surface features 404A,404B,404C,404D are integrated into surface layers 400A,400B that conjoin at the interfacial boundaries 402 between stacked components (semiconductor die 202, sensor chips, and interposers) and surface bonded die 218 within a high speed semiconductor chip stack 200. The surface layers 400A,400B comprise dielectric cores 351, which is not shown in FIGS. 3A, 5B thru 5F for visual clarity. The surface layers 402A,402B may range in thickness from 10 nm to 5 mm, but preferably have thickness in the range from 0.1 µm to 500 µm.

Surface features 404A,404B,404C,404D are specifically integrated into surface layers 400A,400B to function as distributed capacitance or inductance along transmission lines or impedance matching elements that electrically terminate electrical interconnections within the surface layers 400A,400B, or between vias 204. Vias 204 may be a single layer via 204A that terminates in a surface layer 400A,400B or a thru via 204B that electrically connects wafer bonded chips 202 within the high-speed semiconductor chip stack 200 when surface layers 400A,400B are conjoined at the interfacial boundaries 402. Thru vias 204B are also found at the interface between a stack of wafer-bonded chips 202 and surface-mounted semiconductor die 218. These surface features are embedded within the dielectric core 351, which is not shown in FIGS. 5B thru 5F and FIGS. 6A thru 6E for visual clarity. Via pads 405 are used to electrically interconnect surface features 404A,404B,404C,404D with other surface layers 400A,400B or surface-mounted semiconductor die 218 in the high speed semiconductor chip stack 200.

Figure 5B:
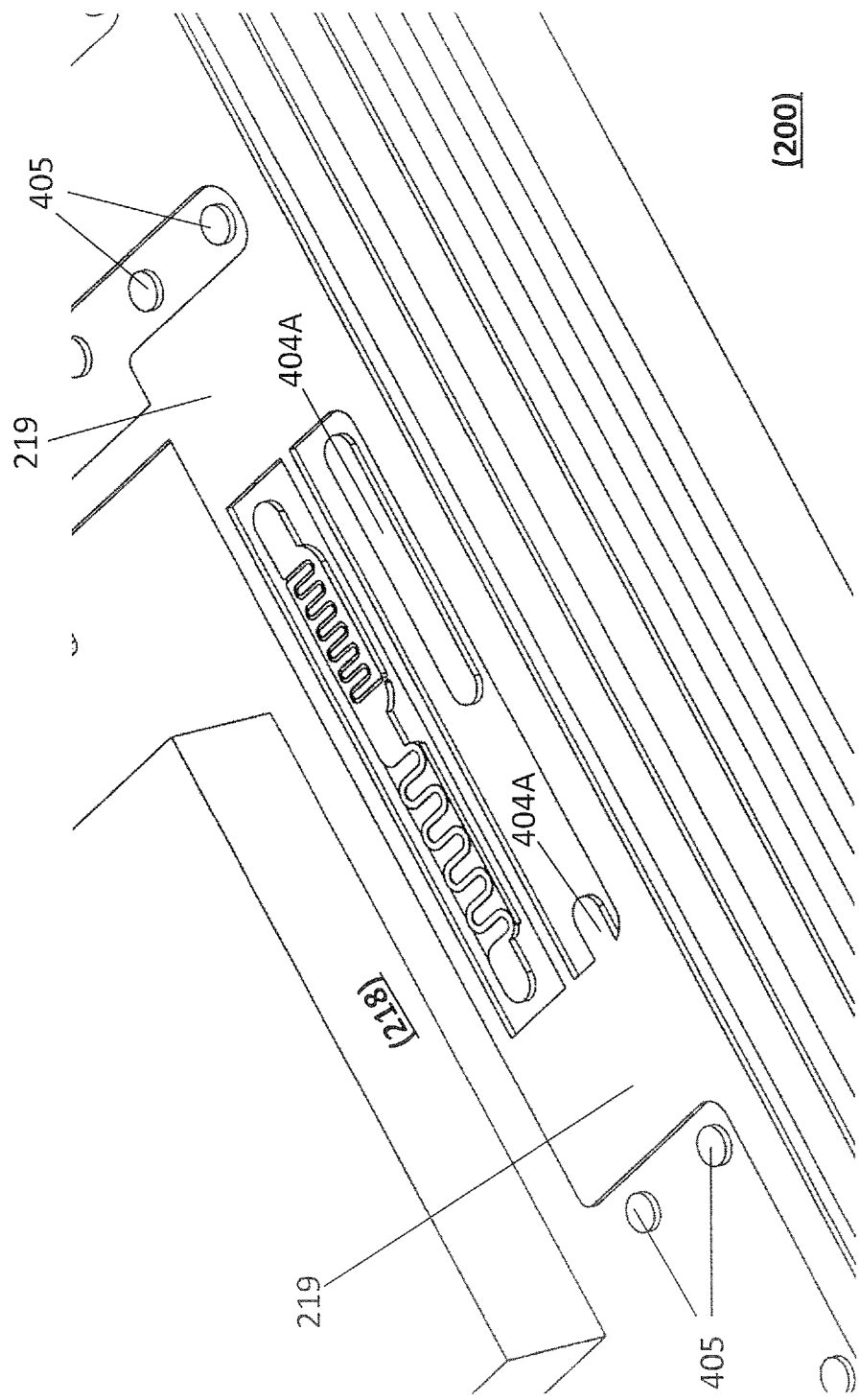

A surface feature may comprise an electrical short 404A that may comprise any of the transmission line structures depicted in FIGS. 4C thru 4I. As shown in FIG. 5B, electrical shorts 404A may be used to electrically connect via pads 405 used to make electrical connection with any other circuit element in the stack, or to a ground pad 219.

Figure 5C:
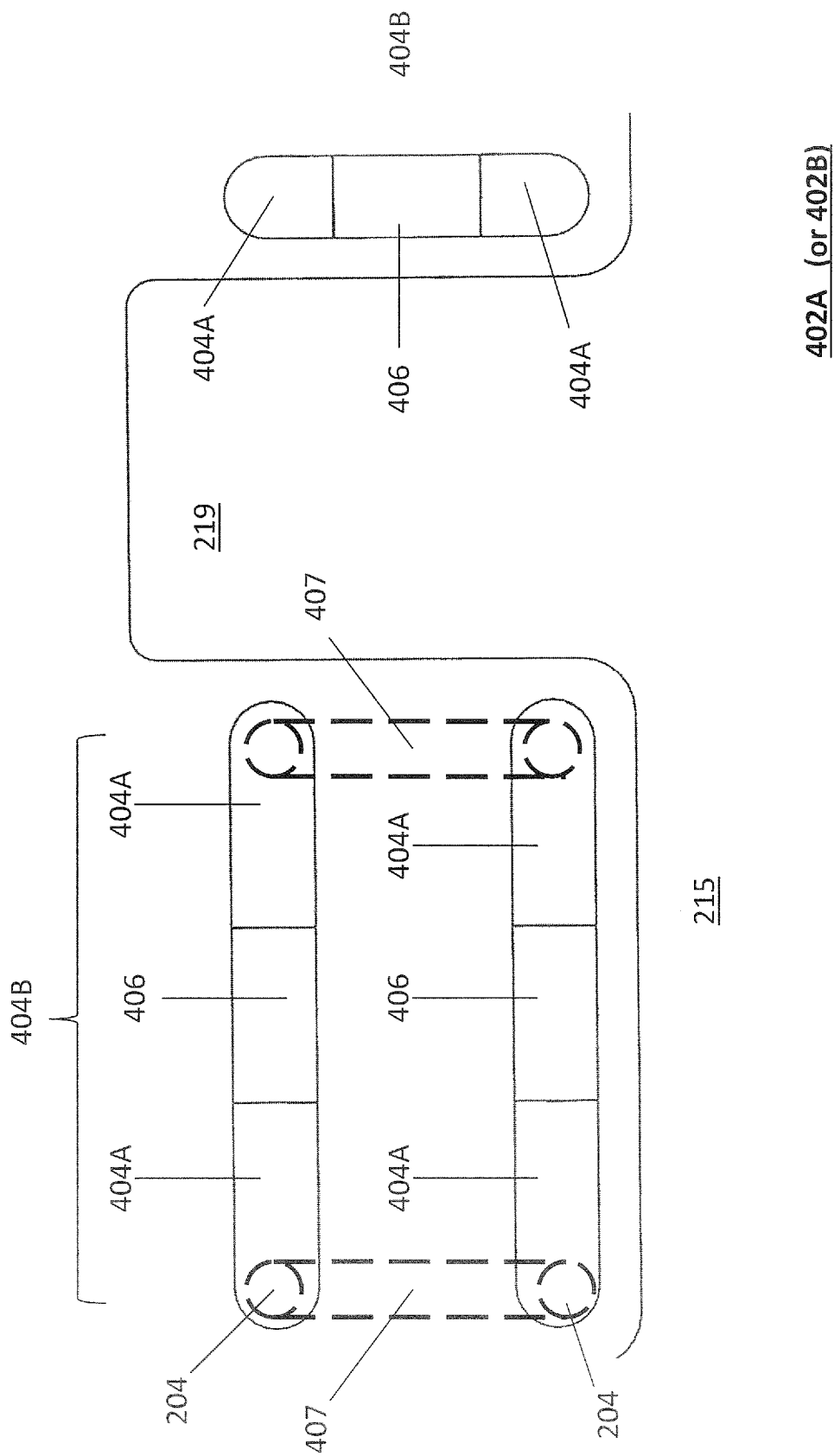

As depicted in FIG. 5C, a surface feature may alternatively comprise a planar resistor 404B that comprises a resistive element 406 inserted between two electrical shorts 404A. The resistive element 406 may comprise an electroceramic, a metal, an alloy, a superalloy, or a carbide ceramic, preferably a MAX-Phase ceramic. The planar resistor 404B may form electrical connections in series or in parallel with other resistors or other surface features 404A,404B,404C, 404D with other electrical shorts in its same surface layer 402A,402B or thru vias 204 that route the signal to buried shorts 407 located on other layers in the high speed semiconductor chip stack 200.

Figure 5D:
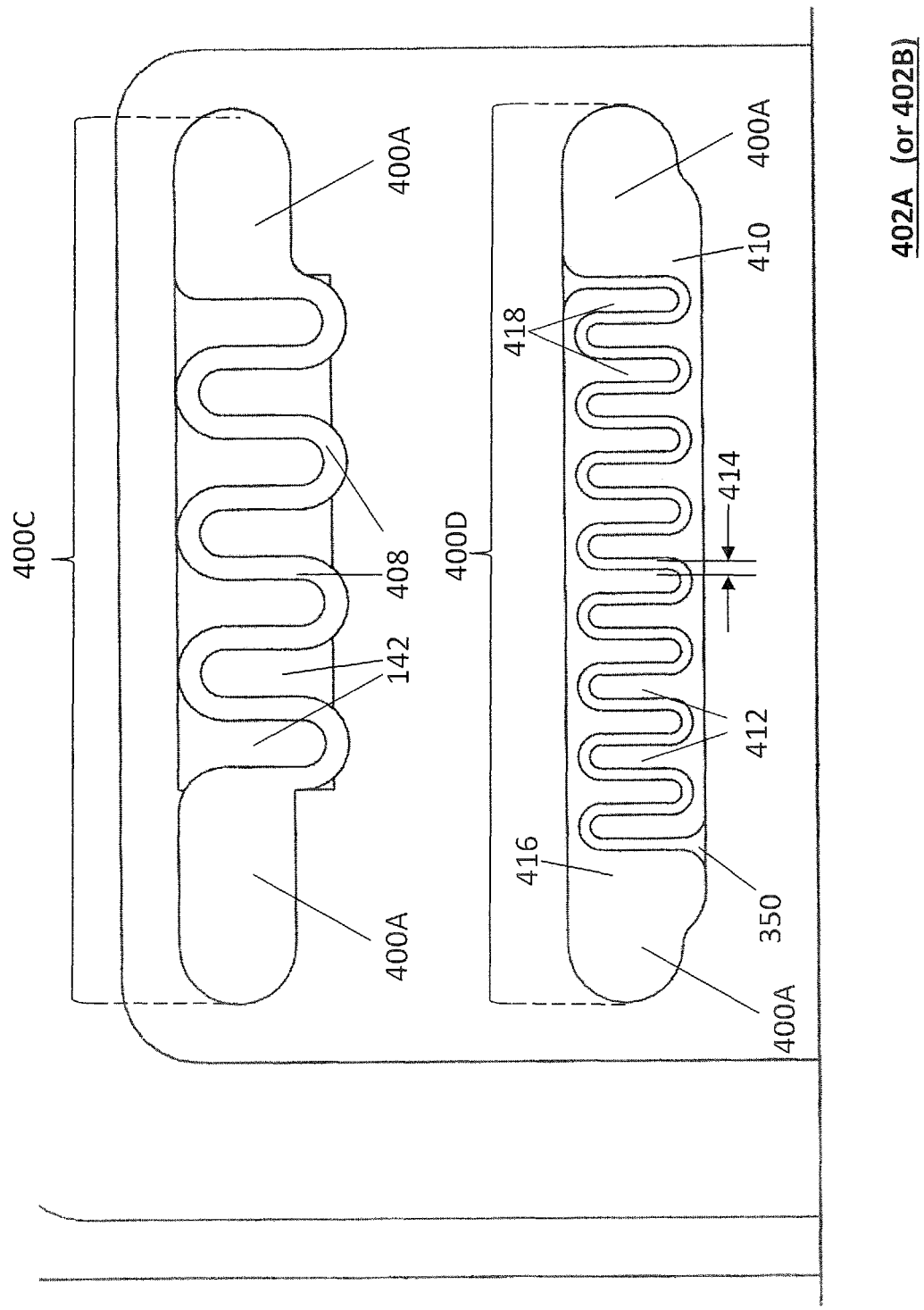

As depicted in FIG. 5D, a surface feature may also include a planar inductor 404C or a planar capacitor 404D. The planar inductor 404C comprises a serpentine conducting element 408 that is wound through a garnet electroceramic magnetic core 142 inserted between two electrical shorts 400A. The planar capacitor 404D comprises a first conducting element 410 comprising a plurality of digits 412 separated by a gap 414 that contains high energy density capacitive dielectric 350 from a second conducting element 416 comprising a plurality of digits 418 that interleave between the digits 412 of the of the first conducting element 410. All elements of the planar capacitor are inserted between two electrical shorts 400A.

Figure 5E:
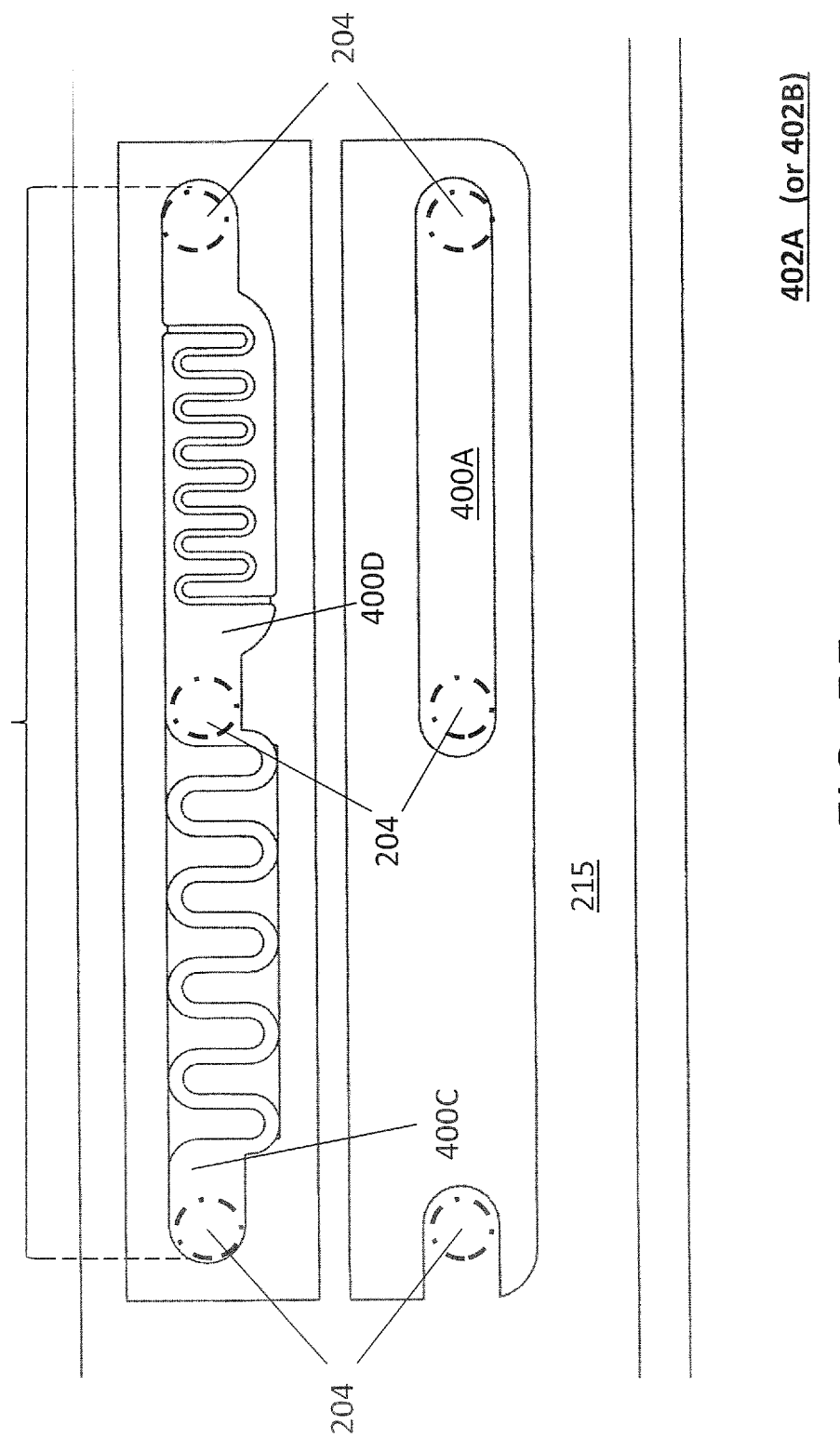
Figure 5F:
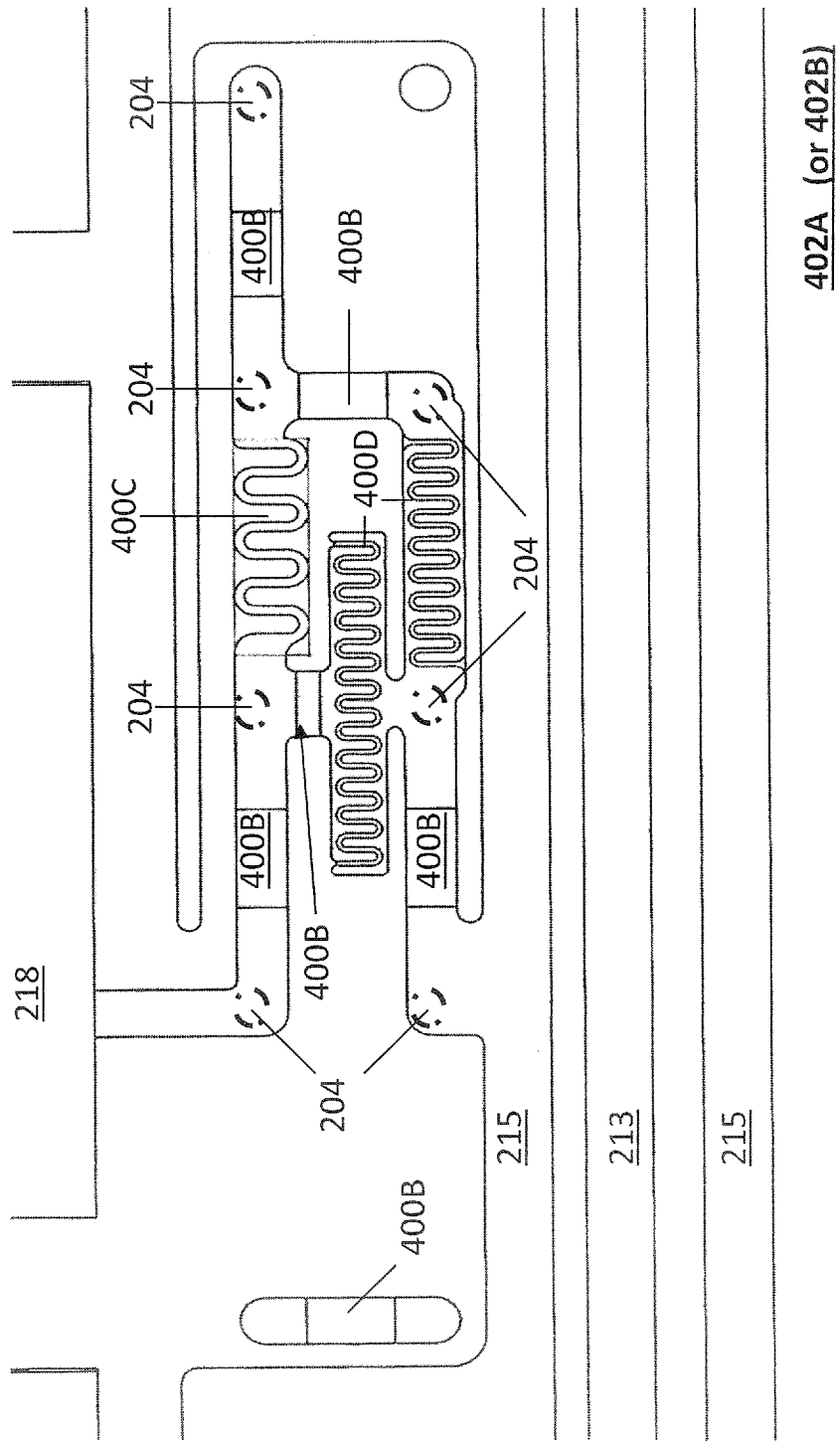
Figure 5G:
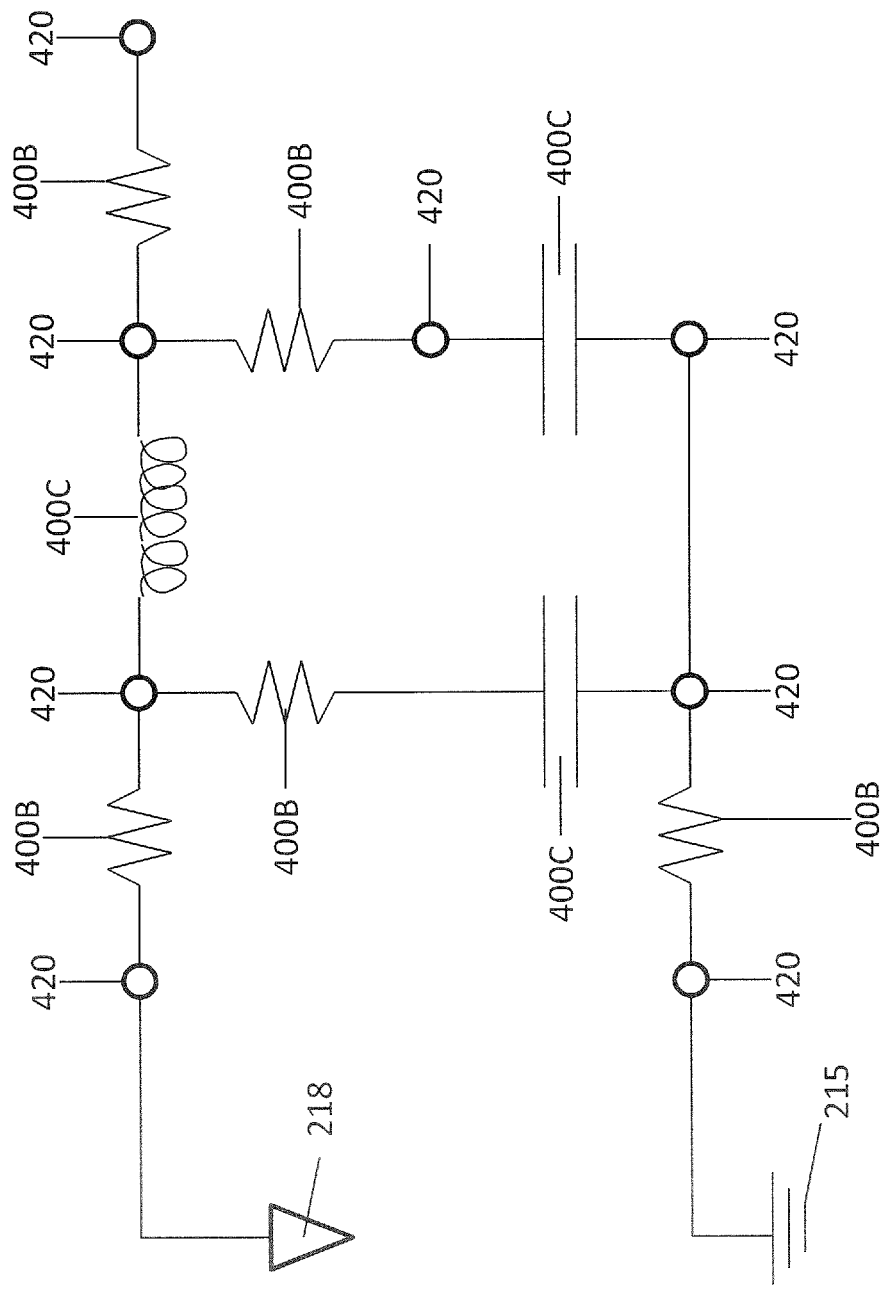

As illustrated in FIGS. 5E,5F,&5G, the electrical short 400A, planar resistor 400B, planar inductor 404C, and planar capacitor 404I) may be used to form a simple series connection 420, wherein vias 204 are positioned to tap into the circuit between the surface features to enable any possible configuration of passive network elements as is needed to impedance balance an electrical connection or terminate a transmission line. These surface features 404A,404B, 404D,404D can be configured in any combination of parallel and series interconnections to perform any frequency filtering or impedance matching function as warranted by a particular frequency filtering or impedance-matching design objective. For example, the surface feature layout illustrated in FIG. 5F configures resistors 400B, inductors 404C, and capacitors 404D as depicted by the circuit diagram illustrated in FIG. 5G, wherein the vias 204 are represented as circuit nodes 420 at which an additional branch can be added to the passive circuit network using buried shorts 407.

Impedances are most frequently mismatched at physical discontinuities within a transmission line, such as a bend, gap, or change in the physical dimensions of the transmission line's conducting element. Impedance mismatching is most prevalent at vias, whether they are thru vias or simply a vertical connection to an adjacent layer in the 3D circuit construction. Impedance matching is also required to electrically connect signals traveling in low permittivity ($\varepsilon_R$) dielectric media that is used in the electrical interconnect structures of semiconductor die 208 to the high energy density capacitive dielectrics 350 that are incorporated in the surface layers 402A,402B formed on the interposers 206, sensor chips 207, and semiconductor die 208,218 that are bonded into the high speed semiconductor chip stack 200. In view of these technical considerations, means that provide impedance matching at a via 204 or via pad 405 is an essential element of the present application.

Reference is now made to FIGS. 6A,6B,6C,6D,6D,6E to illustrate the terminated via 500,501 as a preferred embodiment of the invention. The terminated via 500,550 is a surface feature that comprises a via contact pad 502 in electrical communication with an impedance matching network that may also further comprise an inductive element 504, a capacitive element 506, and a resistive element 508 that electrically terminates signals at the via 204 in the surface layer 402A,402B of the high speed semiconductor chip stack 200. The terminated via 500,501 may also comprise an inductive element 504, a capacitive element 506, and a resistive element 508 configured as arcuate elements in series, in parallel, or in series and in parallel around the via contact pad 502. The terminated via may comprise multiple inductive 504, capacitive 506, and resistive 508 elements as may be required to impedance match or terminate signals traveling through via 204. An electrical connection to a grounding pad 219 or ground plane 215 as may be required to establish proper termination, as well as an electrical connection to an electrical short 400A making connection to other circuit elements in the surface layers 402A,402B. The terminated via 500,501 forms electrical connection with a conducting element 358 that may comprise a microstrip 352, stripline 354, or ground-cladded stripline 357 transmission line.

Figure 6B:
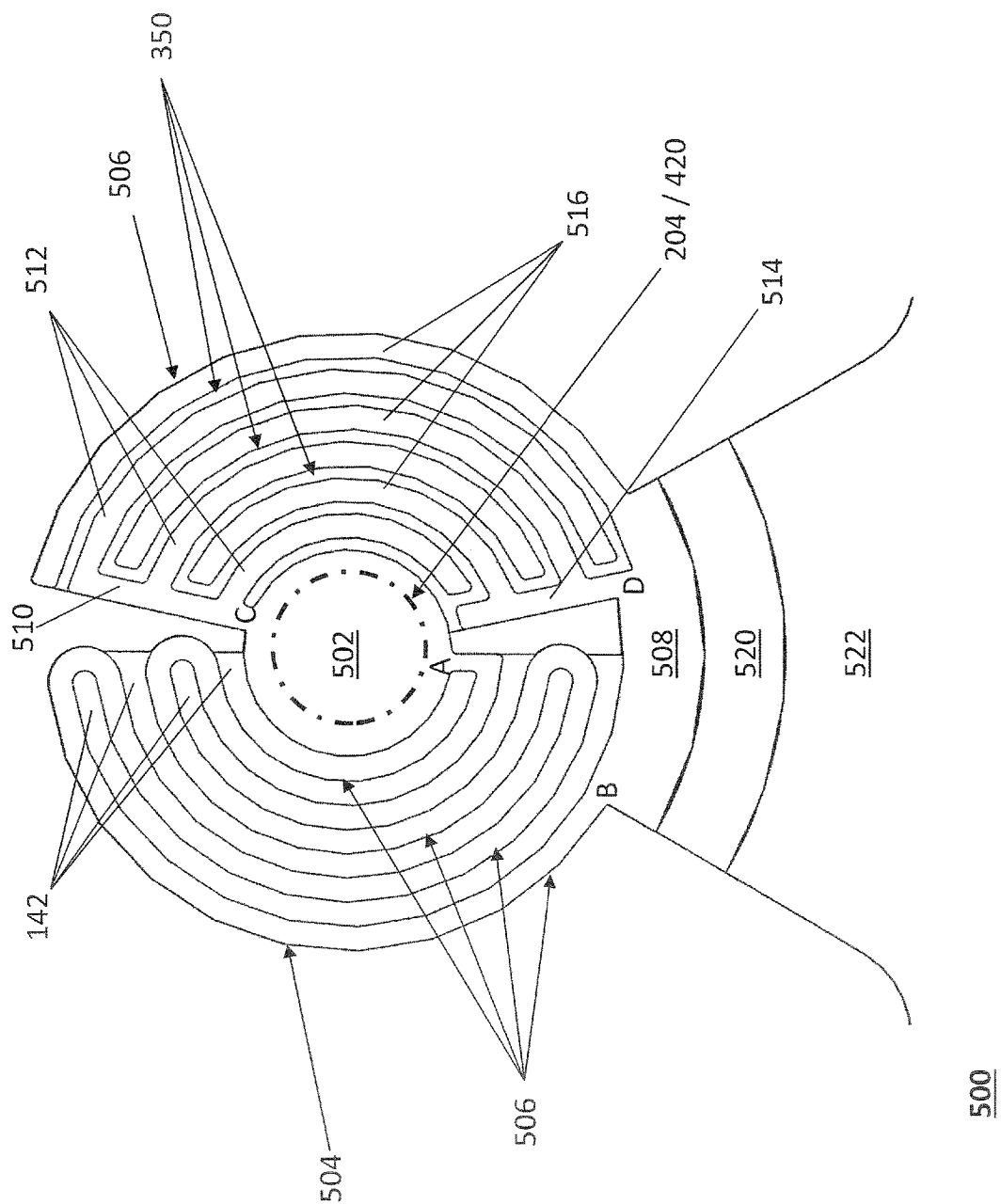
Figure 6C:
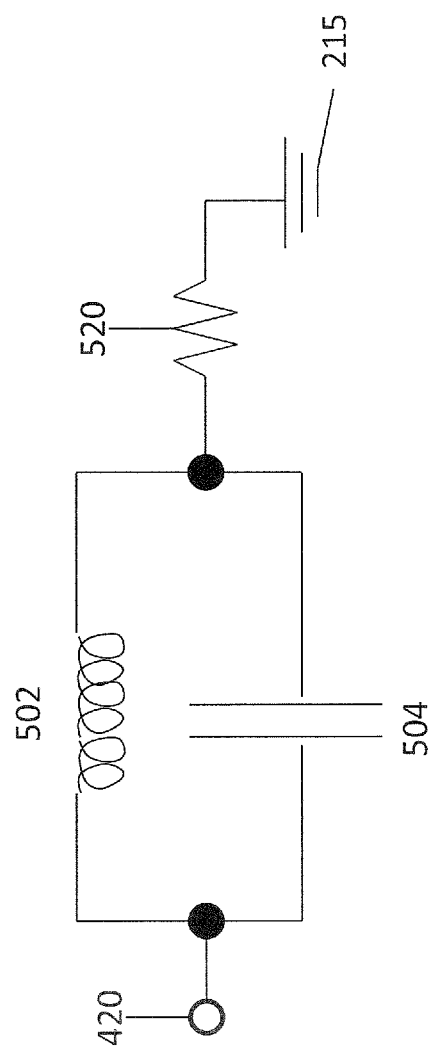

FIGS. 6B&6C illustrate a terminated via 500 configured to comprise a planar inductor 504 and a planar capacitor 506 connected in parallel to a via pad 502 that constitutes a circuit node 420 through a vertical connection by a via 204 to other circuit elements in the high speed semiconductor chip stack 200. One end of the planar inductor 504 is in electrical communication with the via pad 502 at point "A". The planar inductor 504 comprises a serpentine conducting element consisting of windings 506 that meander following an arcuate path beyond the exterior circumference (shown to the left) of the via pad 502. A garnet magnetic core 142 is inserted between the arcuate windings 506 of the planar inductor coil, which terminate making an electrical connection to a base conductive element 508 at point "B". The planar capacitor 506 comprises a primary conducting element 510 that is in electrical communication with the via pad 502 at point "C". The primary conducting element 510 forms a parallel electrical connection with primary arms 512 that follow arcuate paths beyond the exterior circumference (shown to the right) of the via pad 502. The planar capacitor 504 further comprises a secondary conducting element 514 that is in electrical communication with the base conductive element 508 at point "D". The second conducting element 514 forms a parallel connection with secondary arms 516 that follow arcuate paths beyond the exterior circumference of the via pad and are inserted between the primary arms 512. High energy density capacitive dielectric 350 is inserted in the region that separates the primary arms 512 from the secondary arms 516. The base conducting element 508 is in electrical communication with a resistive element 520. that, in turn, forms an electrical contact with a terminating conductive element 522 that is in electrical communication with a ground plane 215.

Figure 6D:
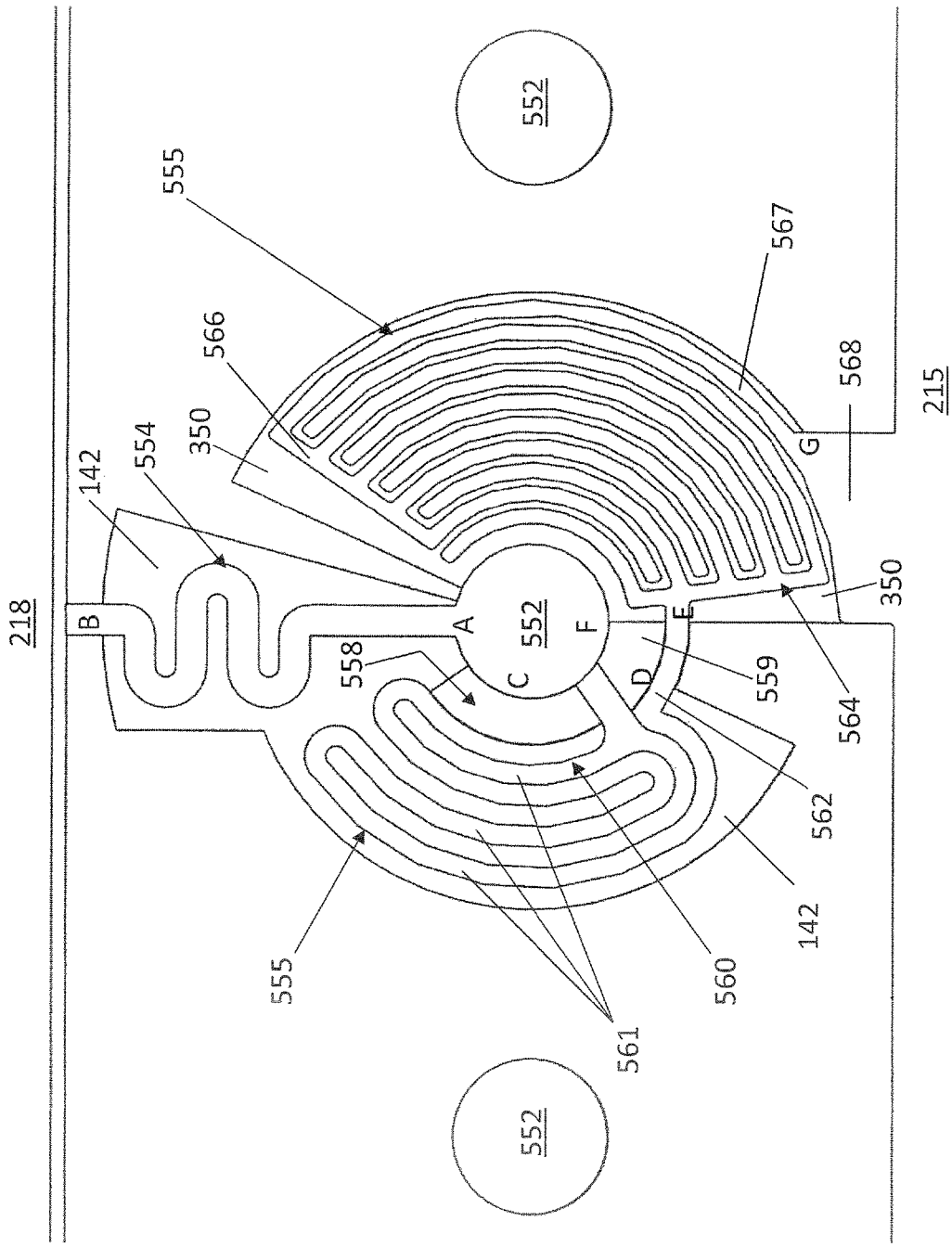
Figure 6E:
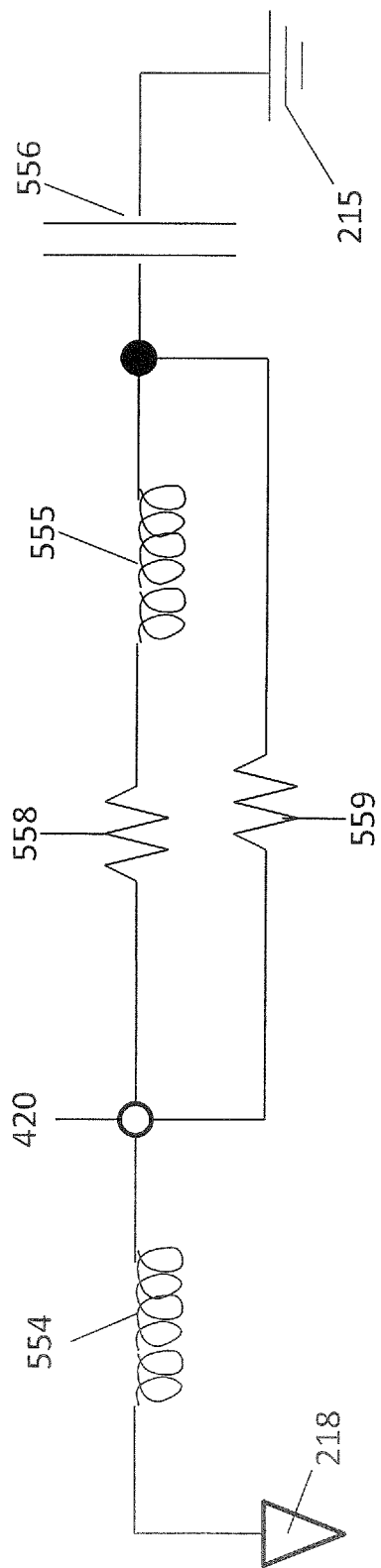

FIGS. 6D&6E illustrate a terminated via 550 configured to comprise planar inductors 554,555 and a planar capacitor 556 that are connected in series and in parallel with planar resistors 558,559 to a via pad 552 that constitutes a circuit node 420 through vertical connection by means of a via 204 to other circuit elements in the high speed semiconductor chip stack 200. A first planar inductor 554 is in electrical communication with the via pad 552 at point "A" and is terminated with a surface mounted semiconductor die 218 at point "B". The via pad 552 is in electrical communication with a first planar resistor 558 at point "C", which, in turn establishes input electrical contact with a first arcuate conductor 560 that is one of serpentine windings 561 of a second planar inductor 555. The first and second planar inductors 554,555 comprise garnet magnetic cores 142. A second arcuate conductor 562 electrically connects the output of the second planar inductor 555 to a second planar resistor 559 at point "D", and to the capacitor input electrode 564 of the planar capacitor 556 at point "E". The second planar resistor 559 maintains electrical contact with the via pad 552 at point "F". High energy density capacitive dielectric 350 is inserted between the arcuate arms of the capacitor input electrode 564 and the arcuate arms of the capacitor output electrode 566. The outermost arcuate arm 567 of the capacitor output electrode 566 establishes electrical contact with a grounding electrode 568 that is in electrical contact with a ground plane 215 on a surface layer.

FIGS. 6B thru 6E are representative illustrations intended to depict how any network filtering or impedance matching network comprising a combination of passive components configured in series or in parallel can be integrated within a terminated via 500,550 as intended under the present invention. The scope of the inventions claims any configuration of any combination of passive components interconnected with any network configuration either as a terminated via 500, 550, a combination of terminated vias 500,550, a combination of surface features 404A,404B,404C,404D, or a combination of surface features and one or more terminated vias 500,550.

Figure 7A:
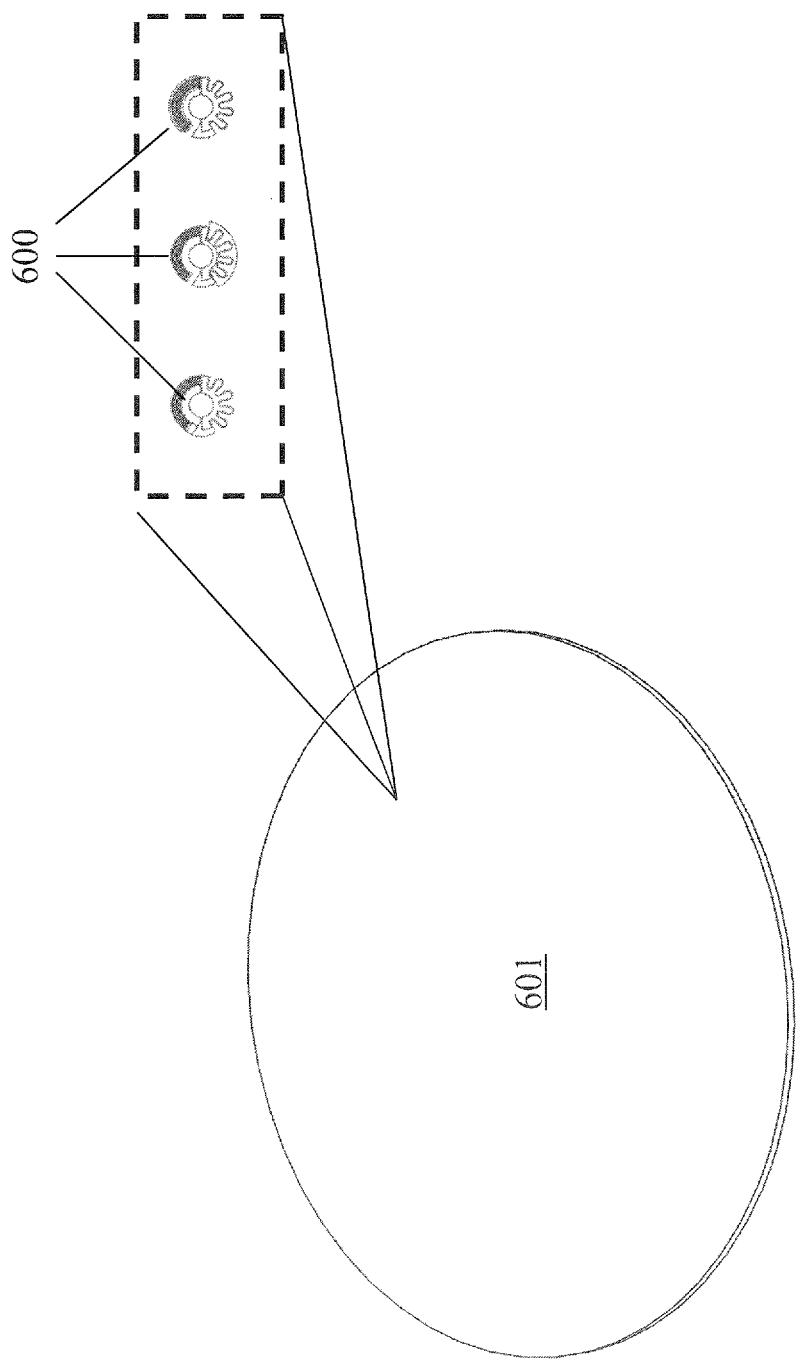
Figure 7B:
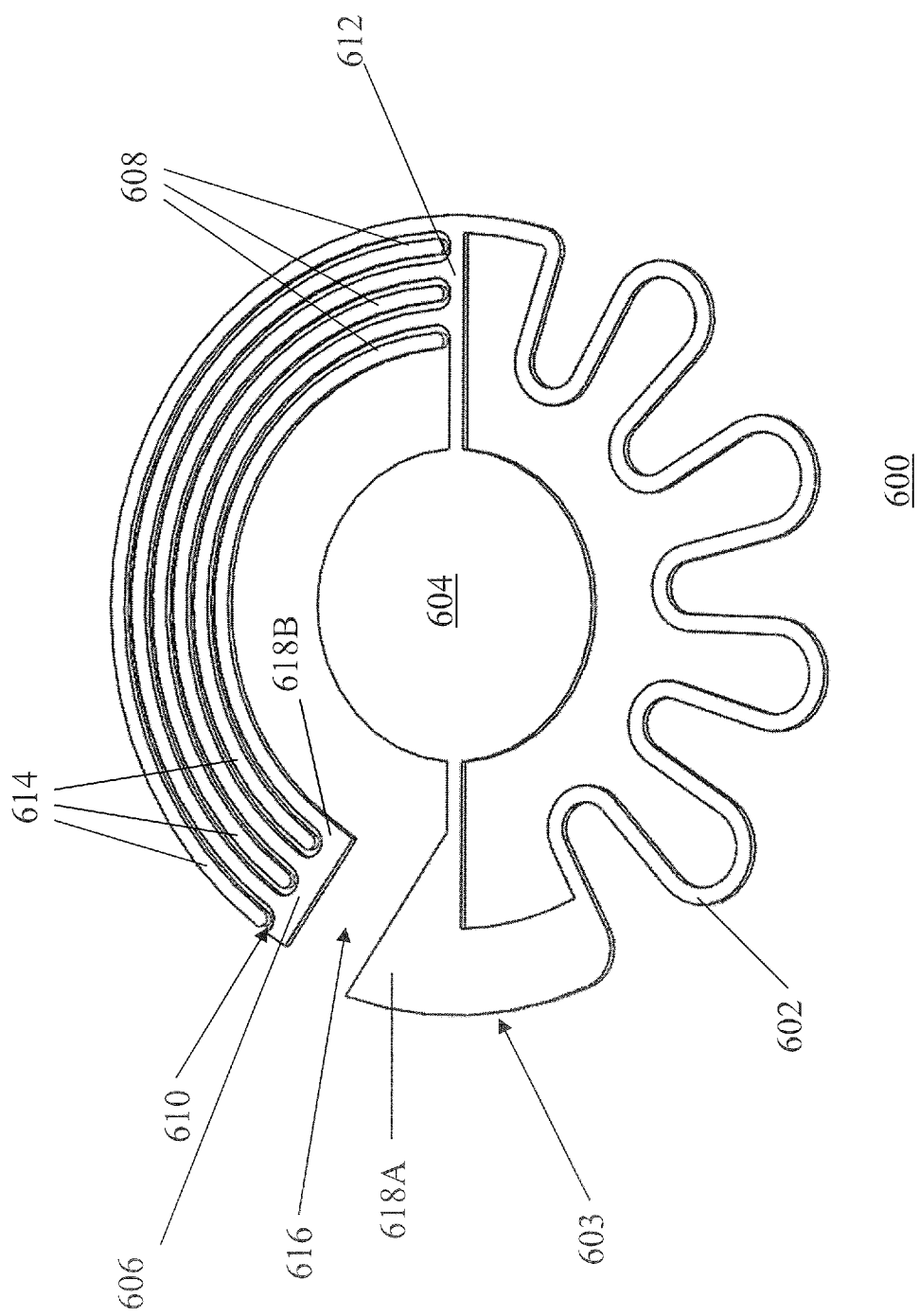
Figure 7D:
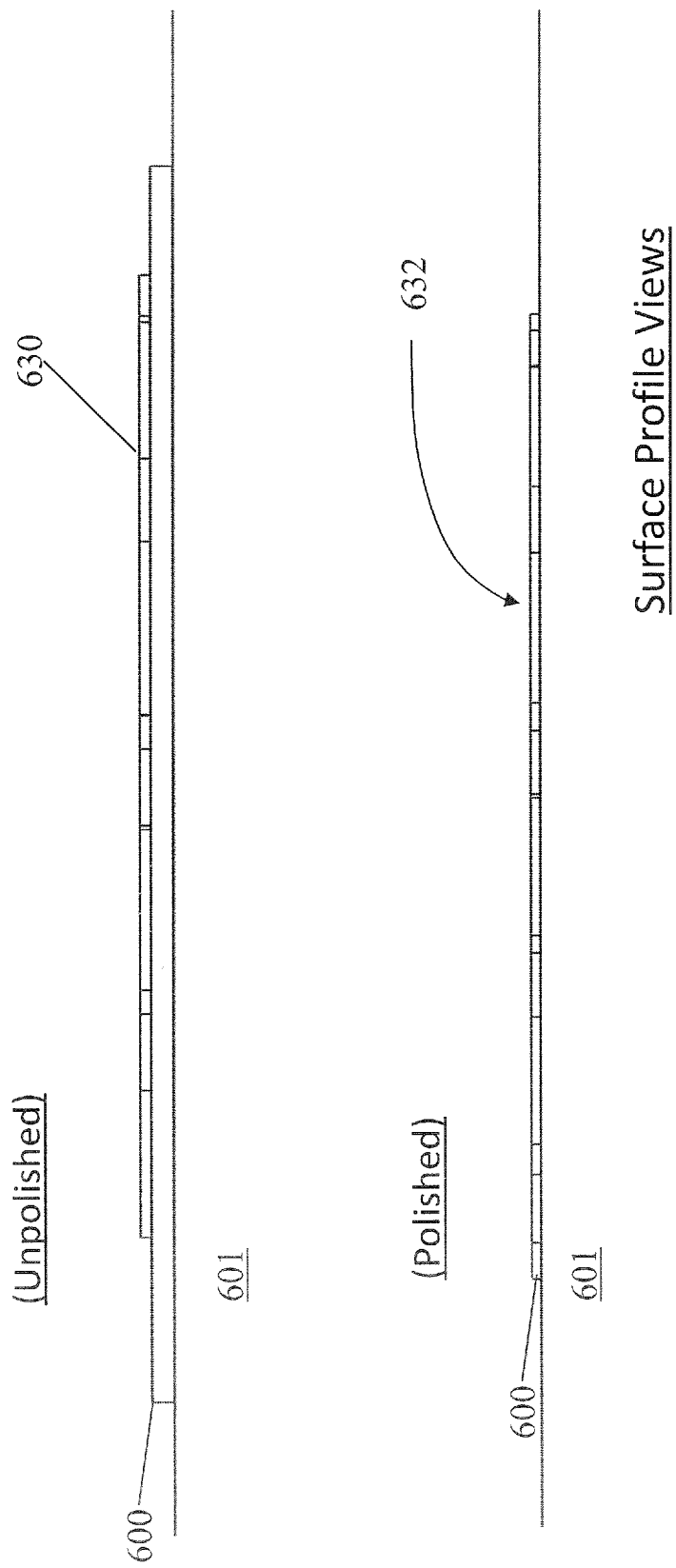

Reference is now made to FIGS. 7A-7F to illustrate methods that depict means to assemble wafer-bonded chips 202 or surface bonded semiconductor die into a high speed semiconductor chip stack 200. Although FIGS. 7A-7F depict close-up views of the assembly of terminated vias 600 formed on a substrate 601, the same procedures apply to all surface features 400A,400B,400C,400D incorporated into a surface layer. The substrate may be a processed semiconductor wafer comprising semiconductor die or sensor chips, or it may be a dielectric for an interposer. The first step comprises the application of a base conducting element layer 603 that forms the terminated via. The base conducting element layer 603 may comprise a metal, like copper, a metallic alloy, a metallic superalloy, a carbide ceramic, preferably a MAX-phase ceramic, or carbon fabric. FIG. 7B illustrates a representative pattern of a base conducting element layer 603 in a terminated via 600 wherein a serpentine conducting element 602 needed for a planar inductor 626 traces an arcuate path around a via pad 604. Similarly, a first conducting element 606 comprising a plurality of digits 608 separated by gap 610 between a second conducting element 612 comprising a plurality of interleaving digits 614 that interleave between the digits 608 of the first conducting element 606 for a planar capacitor 628. A gap 616 in the base conducting element layer 603 is inserted between two shorts 618A,618B for the planar resistor 622. While LCD methods could be applied to patterning the base conducting element layer 603, however, conventional photolithographic techniques are preferred due to the tight tolerances around vias.

As depicted in FIG. 7C, LCD methods are applied to selectively deposit a resistive element 620 between the gap 616 and the two electrical shorts 618A,618B to form a planar resistor 622. Similarly, a garnet magnetic core 624 is selectively deposited over the serpentine conducting element 602, to form a planar inductor 626, and high energy density dielectric 300 is selectively deposited over the interleaving digits 608,614 to form a planar capacitor 628.

In order to constitute high quality sidewall contact within the gaps 610,616 and around the serpentine conducting element 602, it is recommended that the LCD deposits overspray the targeted region. This forms protruding material 630 that is selectively deposited on top of the base conductive element that is removed by chemical mechanical polishing techniques to restore a smooth surface 632 to the surface features 622,626,628. (See FIG. 7D).

Figure 7E:
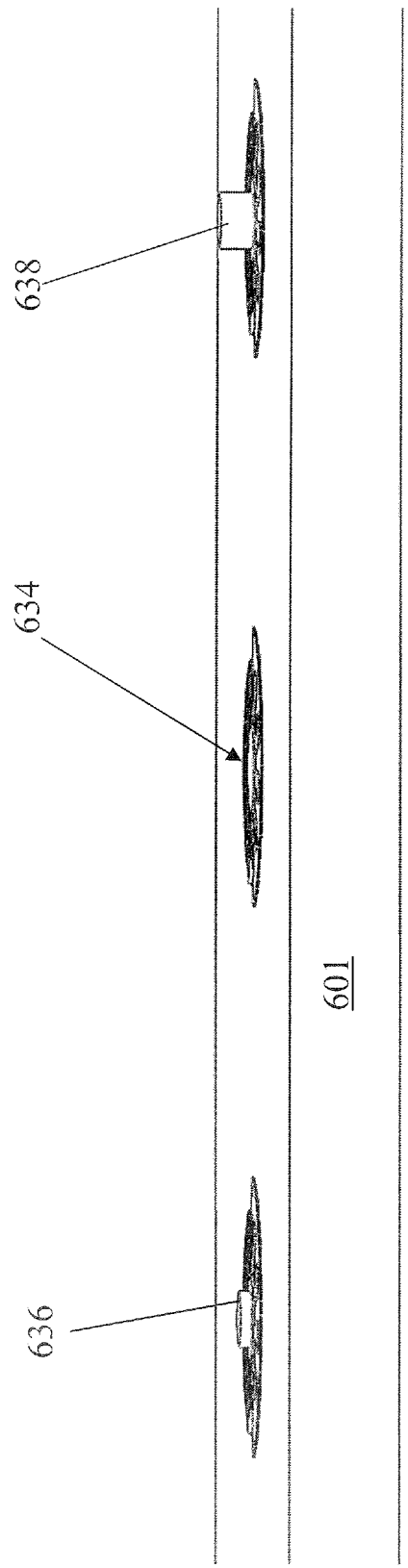
Figure 7F:
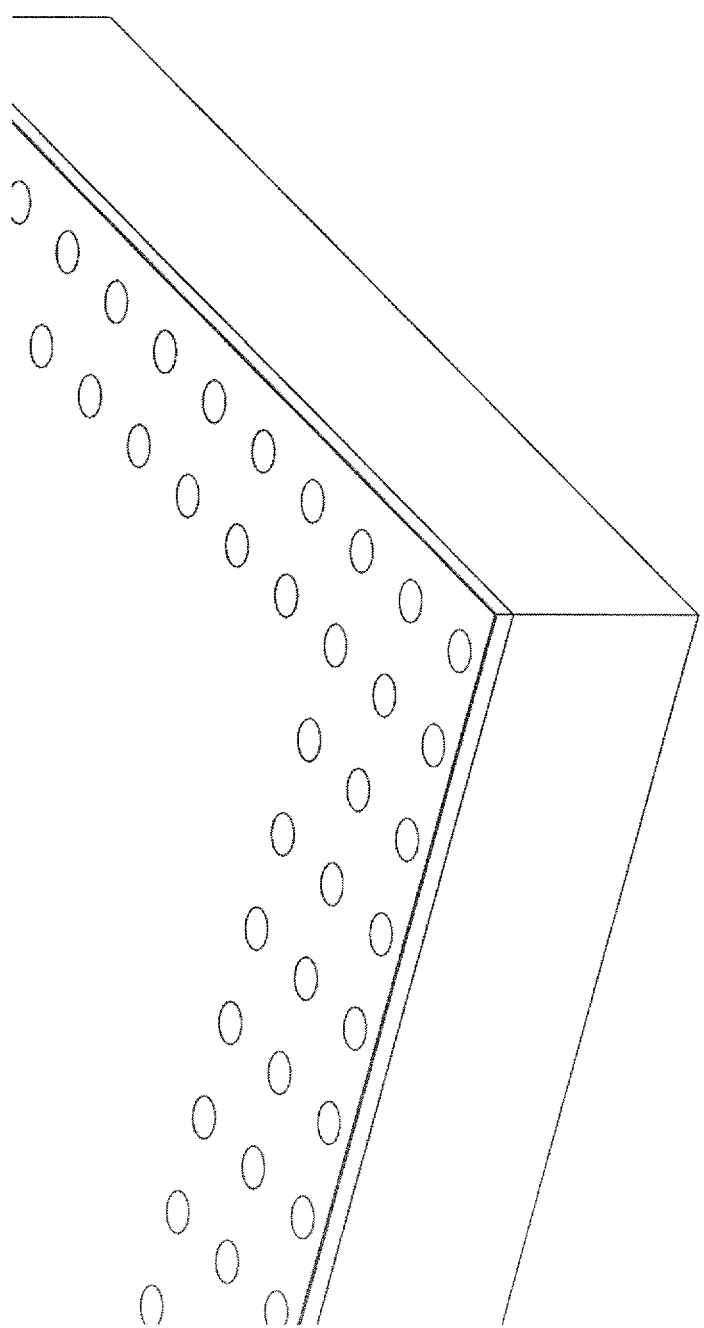

LCD methods are used to selectively deposit non-planar features in the surface layer that give it unique function, such as thru vias, antenna stubs, and antenna arrays. FIG. 7E shows three different via structures. A first via structure 634 terminates in the plane of the substrate 601. A second via structure 636 terminates within the surface layer and would be used as an antenna stub, or connection to a microstrip or stripline conductor. A third via structure is a thru via 638 that passes through the surface layer 400A,400B in which the surface features are embedded when it is fully assembled.

LCD methods and chemical mechanical polishing are used to apply transmissions lines 205, dielectrics, and embed the surface features 404A,404B,404C,404D. A bonding layer 640 is applied to the dielectric core 351 forming the surface layer 400A as a final encapsulation step. (See FIG. 7F). The bonding layer 640 comprises a material that facilitates direct bonding of a surface layer 400A to another surface layer 400B at an interface 402 within a high speed semiconductor chip stack 200. The bonding layer 640 may be a dielectric material like titanium oxide. Alternatively, the bonding layer 638 may be a conductive metal, alloy, or superalloy if it is to be used as a ground plane. A final chemical polishing step is applied to expose the thru vias 638 within the dielectric core 351 at the bonding surface 642. The substrate 601 may be thinned and back side polished prior to configuring the chip into a high speed semiconductor chip stack 200.

Chip stack bonding may be achieved in a variety of ways. A preferred method utilizes oxide-oxide low-temperature direct bonding techniques that are commonly used in 3D wafer and chip integration, wherein oxide material deposited on the surface of the chips is used as the bonding agent. Metal-metal low temperature direct bonding techniques are also applicable at surface areas where exposed metal configured to provide a mating surface and electrical interface between chips are available.

Figure 8:
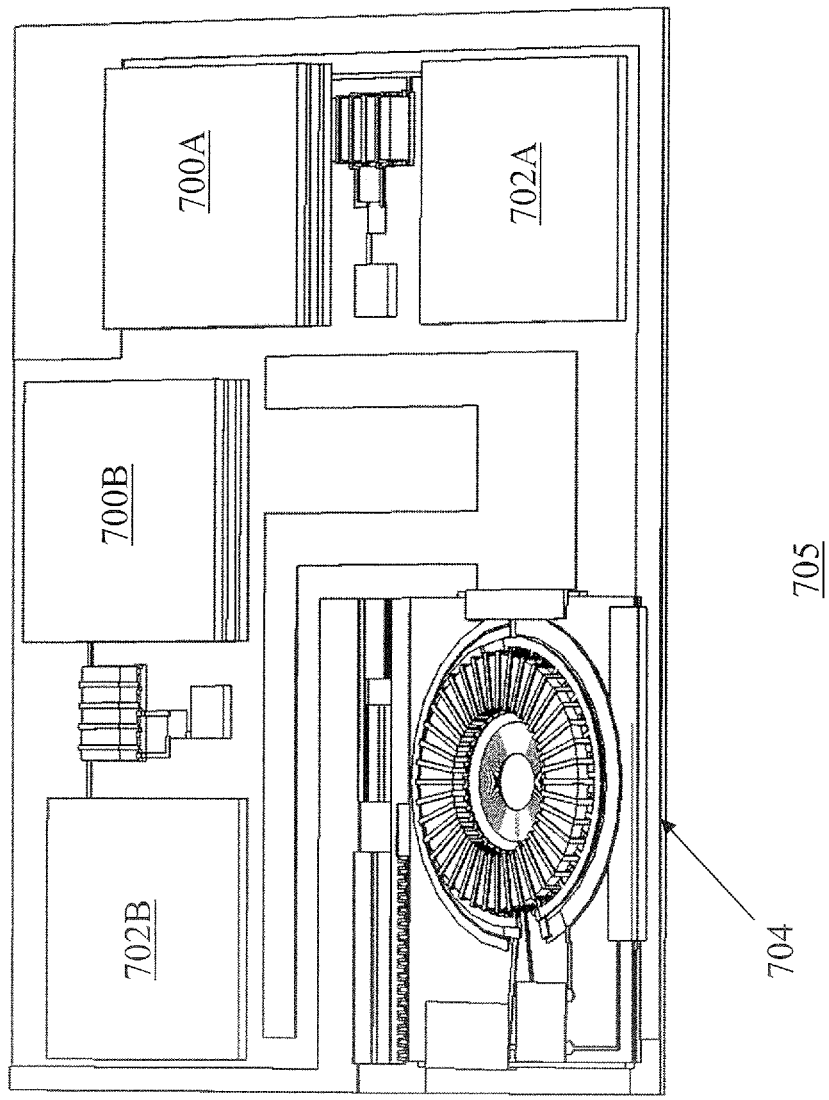
FIG. 8 depicts a high speed semiconductor chip stack mounted on a fully integrated semiconductor carrier.

Reference is now made to FIG. 8 to illustrate a final embodiment of the application that claims a multi-chip module 705 comprising one or more high speed semiconductor chip stacks 700A,700B bonded to the surface of a fully integrated semiconductor chip carrier 704. The multi-chip module 705 may also include other chips 702A,702B, which may comprise semiconductor die or sensors, bonded to its surface. The high speed semiconductor chip stacks 700A,700B may further comprise one or more CPU, GPU, ASIC, FPGA, stack processor, sensor, electro-optic and memory chips. A specific embodiment of the invention claims high speed semiconductor chip stacks 700A,700B that comprise other chips 702A,702B that functions as a nonvolatile memory comprising a resistive change element array, preferably a resistive change element array comprising carbon nanotube fabric as the resistive change element storage medium.

Cryptocurrencies, such as Bitcoin are mined using a complex computer algorithm and maintained on a Blockchain. At the time of this filing, approximately 16 million of the 21 million total minable bitcoin have been mined. Bitcoin mining requires intense computational power. It is anticipated that the 5 million Bitcoin remaining will require 100 years to be mined using computer systems operating at contemporary clock speeds. Clock speed sets the rate at which an algorithm can run. A chip stack computing module that increases the operational clock speed of all the chips in a stack from the current standard of 7-7.5 GHz to an operational clock speed closer to the intrinsic ≥20 GHz clock speeds of the semiconductor die embedded within the chip stack will process an algorithm approximately 3× faster. These faster clock speeds will allow the remaining 5 million available Bitcoin to be mined in 33 years rather than 100 years. This higher efficiency represents substantial economic value. Therefore, a further embodiment of the invention claims high speed semiconductor chip stacks 700A,700B that comprise other chips 702A,702B that function as an ASIC chip specifically designed to process algorithms that mine Bitcoin. While these high speed semiconductor chip stacks 700A,700B could be mounted on a printed circuit board, an additional further embodiment claims a multi-chip module 705 that comprises high speed semiconductor chip stacks 700A,700B further comprising other (ASIC) chips 702A,702B designed to process algorithms that mine Bitcoin that are mounted on a fully integrated semiconductor chip carrier 704.

An additional embodiment includes one or more thermoelectric devices comprising a 3D quantum gas layer mounted on the multi-chip module or embedded in high speed semiconductor chip stacks 700A,700B that are used to pump heat from a CPU to a thermal reservoir, wherein the thermal reservoir may comprise a second thermoelectric device comprising a 3D quantum gas layer that is used to convert the transferred heat back into power that is, in turn, supplied back to the circuit.

What is claimed is:

1. A high-speed semiconductor chip stack forming an electrical circuit comprising one or more physical layers of perovskite electroceramic that functions as a capacitive dielectric material and said one or more physical layers are integrated as part of at least one surface feature on a semiconductor die or an interposer embedded within the high speed semiconductor chip stack wherein the perovskite electroceramic forming said capacitive dielectric material further comprises a uniform distribution of ceramic grains with a grain size diameter less than 50 nm such that orbital deformations constitute the sole mechanism contributing to the dielectric polarization within said capacitive dielectric material,
  wherein the perovskite electroceramic has a composition doped with ≤0.05 mol % of silicon dioxide that forms electrically insulating metal oxide phases at nanoscale grain boundaries within the perovskite electroceramic to neutralize the formation of internal conductive pathways and dissipation currents within the capacitive dielectric material.

2. The high-speed semiconductor chip stack of claim 1, wherein the capacitive dielectric material has dielectric polarization rates measured on femto-second time scales.

3. The high-speed semiconductor chip stack of claim 1, wherein the perovskite electroceramic has a relative permittivity $\varepsilon_R \leq 70$.

4. The high-speed semiconductor chip stack of claim 3, wherein the capacitive dielectric material has a relative permittivity, $\varepsilon_R$, in the range of $200 \leq \varepsilon_R \leq 800$.

5. The high-speed semiconductor chip stack of claim 1, wherein the capacitive dielectric material comprises a thermodynamically stable perovskite electroceramic.

6. The high-speed semiconductor chip stack of claim 5, wherein the thermodynamically stable perovskite electroceramic may comprise titanate, zirconate, hafnate, niobate, or tantalate electroceramic, or admixture thereof.

7. The high-speed semiconductor chip stack of claim 6, wherein thermodynamically stable perovskite electroceramic comprises an admixture of three (3) or more elements from the group comprising: scandium (Sc), titanium (Ti), vanadium (V), chromium (Cr), manganese (Mn), zinc (Zn), zirconium (Zr), niobium (Nb), molybdenum (Mo), hafnium (Hf), tantalum (Ta), tungsten (W), lanthanum (La), cerium (Ce), praseodymium (Pr), neodymium (Nd), samarium (Sm), europium (Eu), gadolinium (Gd), terbium (Tb), dionysium (Dy), holomium (Ho), ytterbium (Yb), indium (In), tin (Sn), lead (Pb), or bismuth (Bi).

8. The high-speed semiconductor chip stack of claim 3, wherein the perovskite electroceramic has a crystal lattice with an average atomic mass unit (amu) that is greater than 25.

9. The high-speed semiconductor chip stack of claim 8, wherein the crystal lattice has an average atomic mass unit (amu) that is greater than 50.

10. The high-speed semiconductor chip stack of claim 1, wherein the surface feature is deployed to terminate an electrical discontinuity in the electrical circuit.

11. The high-speed semiconductor chip stack of claim 10, wherein the surface feature is deployed along a transmission line.

12. The high-speed semiconductor chip stack of claim 11, wherein the surface feature and transmission line are deployed on a semiconductor die.

13. The high-speed semiconductor chip stack of claim 11, wherein the surface feature and transmission line are deployed on an interposer.

14. The high-speed semiconductor chip stack of claim 10, wherein the surface feature is deployed at a via.

15. The high-speed semiconductor chip stack of claim 14, wherein the surface feature and the via are deployed on a semiconductor die.

16. The high-speed semiconductor chip stack of claim 14, wherein the surface feature and the via are deployed on an interposer.

17. A high-speed semiconductor chip stack forming an electrical circuit comprising one or more physical layers of perovskite electroceramic that functions as a capacitive dielectric material and said one or more physical layers are integrated as part of at least one surface feature on a semiconductor die or an interposer embedded within the high speed semiconductor chip stack wherein the perovskite electroceramic forming said capacitive dielectric material further comprise a uniform distribution of ceramic grains with a grain size diameter less than 50 nm such that orbital deformations constitute the sole mechanism contributing to the dielectric polarization within said capacitive dielectric material, wherein the at least one surface feature minimizes reflections of higher frequency harmonics of digital signal pulses such that an operational system clock speed of the high-speed semiconductor chip stack optimally matches a slowest clock speed of a semiconductor die embedded within the high speed semiconductor chip stack.

18. The high-speed semiconductor chip stack of claim 17, wherein the semiconductor die embedded within the high speed semiconductor chip stack perform an optical or electro-optical circuit function.

19. The high-speed semiconductor chip stack of claim 17, wherein the semiconductor die embedded within the high speed semiconductor chip stack is a component of a wireless transmitter, wireless receiver, or wireless transceiver circuit module.

* * * * *